(12) United States Patent
Sasaki et al.

(10) Patent No.: US 8,203,215 B2
(45) Date of Patent: Jun. 19, 2012

(54) LAYERED CHIP PACKAGE AND METHOD OF MANUFACTURING SAME

(75) Inventors: Yoshitaka Sasaki, Milpitas, CA (US); Hiroyuki Ito, Milpitas, CA (US); Hiroshi Ikejima, Hong Kong (CN); Atsushi Iijima, Hong Kong (CN)

(73) Assignees: Headway Technologies, Inc., Milpitas, CA (US); SAE Magnetics (H.K.) Ltd., Hong Kong (CN)

( * ) Notice: Subject to any disclaimer, the term of this patent is extended or adjusted under 35 U.S.C. 154(b) by 204 days.

(21) Appl. No.: 12/835,291

(22) Filed: Jul. 13, 2010

(65) Prior Publication Data

US 2012/0013024 A1    Jan. 19, 2012

(51) Int. Cl.
*H01L 23/48* (2006.01)
(52) U.S. Cl. ......... 257/777; 257/E23.142; 257/E21.499; 438/107
(58) Field of Classification Search ................. 257/777, 257/E23.142, E21.499; 438/107
See application file for complete search history.

(56) References Cited

U.S. PATENT DOCUMENTS

| | | | |
|---|---|---|---|
| 5,571,754 A | 11/1996 | Bertin et al. | |
| 5,953,588 A | 9/1999 | Camien et al. | |
| 7,127,807 B2 | 10/2006 | Yamaguchi et al. | |
| 7,557,439 B1* | 7/2009 | Sasaki et al. | 257/686 |
| 7,652,362 B2 | 1/2010 | Jung et al. | |
| 7,902,677 B1* | 3/2011 | Sasaki et al. | 257/777 |
| 7,968,374 B2* | 6/2011 | Sasaki et al. | 438/109 |
| 2002/0096760 A1 | 7/2002 | Simelgor et al. | |
| 2006/0001142 A1 | 1/2006 | Jeung et al. | |
| 2007/0165461 A1 | 7/2007 | Cornwell et al. | |
| 2009/0020889 A1 | 1/2009 | Murayama et al. | |
| 2009/0045525 A1 | 2/2009 | Matsushima et al. | |
| 2009/0085224 A1 | 4/2009 | Choi et al. | |
| 2009/0321957 A1 | 12/2009 | Sasaki et al. | |
| 2010/0140801 A1 | 6/2010 | Anbai et al. | |
| 2010/0200959 A1 | 8/2010 | Sasaki et al. | |
| 2010/0200998 A1 | 8/2010 | Furuta et al. | |
| 2010/0207278 A1 | 8/2010 | Kwon et al. | |
| 2012/0013025 A1* | 1/2012 | Sasaki et al. | 257/777 |

OTHER PUBLICATIONS

Gann, Keith D. Neo-Stacking Technology, HDI Magazine, 1999, (4 pages).
Copending U.S. Appl. No. 12/588,808 in the name of Yoshitaka Sasaki et al., filed Oct. 28, 2009.
Copending U.S. Appl. No. 12/822,601 in the name of Yoshitaka Sasaki et al., filed Jun. 24, 2010.
Copending New United States Patent Application in the name of Yoshitaka Sasaki et al., filed Jul. 13, 2010.
Jan. 5, 2011 Notice of Allowance issued in copending U.S. Appl. No. 12/588,808.

* cited by examiner

*Primary Examiner* — Trung Q Dang
(74) *Attorney, Agent, or Firm* — Oliff & Berridge, PLC

(57) ABSTRACT

A layered chip package includes a main body and wiring, the wiring including a plurality of wires disposed on a side surface of the main body. The main body includes a main part and a plurality of terminals. The main part includes a plurality of layer portions stacked. The terminals are disposed on at least either one of the top and bottom surfaces of the main part and electrically connected to the wires. Each of the layer portions includes a semiconductor chip, and a plurality of electrodes that are electrically connected to the wires. The electrodes include a plurality of first electrodes that are intended to establish electrical connection to the semiconductor chip, and a plurality of second electrodes that are not in contact with the semiconductor chip. In at least one of the layer portions, the first electrodes are in contact with and electrically connected to the semiconductor chip.

24 Claims, 34 Drawing Sheets

LAYERED CHIP PACKAGE AND METHOD OF MANUFACTURING SAME

BACKGROUND OF THE INVENTION

1. Field of the Invention

The present invention relates to a layered chip package that includes a plurality of semiconductor chips stacked, and to a method of manufacturing the same.

2. Description of the Related Art

In recent years, lighter weight and higher performance have been demanded of portable devices typified by cellular phones and notebook personal computers. Accordingly, there has been a need for higher integration of electronic components for use in the portable devices. With the development of image- and video-related equipment such as digital cameras and video recorders, semiconductor memories of larger capacity and higher integration have also been demanded.

As an example of highly integrated electronic components, a system-in-package (hereinafter referred to as SiP), especially an SiP utilizing a three-dimensional packaging technology for stacking a plurality of semiconductor chips, has attracting attention in recent years. In the present application, a package that includes a plurality of semiconductor chips (hereinafter, also simply referred to as chips) stacked is called a layered chip package. Since the layered chip package allows a reduction in wiring length, it provides the advantage of allowing quick circuit operation and a reduced stray capacitance of the wiring, as well as the advantage of allowing higher integration.

Major examples of the three-dimensional packaging technology for fabricating a layered chip package include a wire bonding method and a through electrode method. The wire bonding method stacks a plurality of chips on a substrate and connects a plurality of electrodes formed on each chip to external connecting terminals formed on the substrate by wire bonding. The through electrode method forms a plurality of through electrodes in each of chips to be stacked and wires the chips together by using the through electrodes.

The wire bonding method has the problem that it is difficult to reduce the distance between the electrodes so as to avoid contact between the wires, and the problem that the high resistances of the wires hamper quick circuit operation.

The through electrode method is free from the above-mentioned problems of the wire bonding method. Unfortunately, however, the through electrode method requires a large number of steps for forming the through electrodes in chips, and consequently increases the cost for the layered chip package. According to the through electrode method, forming the through electrodes in chips requires a series of steps as follows: forming a plurality of holes for the plurality of through electrodes in a wafer that is to be cut later into a plurality of chips; forming an insulating layer and a seed layer in the plurality of holes and on the top surface of the wafer; filling the plurality of holes with metal such as Cu by plating to form the through electrodes; and removing unwanted portions of the seed layer.

According to the through electrode method, the through electrodes are formed by filling metal into holes having relatively high aspect ratios. Consequently, voids or keyholes are prone to occur in the through electrodes due to poor filling of the holes with metal. This tends to reduce the reliability of wiring formed by the through electrodes.

According to the through electrode method, vertically adjacent chips are physically joined to each other by connecting the through electrodes of the upper chip and those of the lower chip by soldering, for example. The through electrode method therefore requires that the upper and lower chips be accurately aligned and then joined to each other at high temperatures. When the upper and lower chips are joined to each other at high temperatures, however, misalignment between the upper and lower chips can occur due to expansion and contraction of the chips, which often results in electrical connection failure between the upper and lower chips.

U.S. Pat. No. 5,953,588 discloses a method of manufacturing a layered chip package as described below. In the method, a plurality of chips cut out from a processed wafer are embedded into an embedding resin and then a plurality of leads are formed to be connected to each chip, whereby a structure called a neo-wafer is fabricated. Next, the neo-wafer is diced into a plurality of structures each called a neo-chip. Each neo-chip includes one or more chips, resin surrounding the chip(s), and a plurality of leads. The plurality of leads connected to each chip have their respective end faces exposed in a side surface of the neo-chip. Next, a plurality of types of neo-chips are laminated into a stack. In the stack, the respective end faces of the plurality of leads connected to the chips of each layer are exposed in the same side surface of the stack.

Keith D. Gann, "Neo-Stacking Technology", HDI Magazine, December 1999, discloses fabricating a stack by the same method as that disclosed in U.S. Pat. No. 5,953,588, and forming wiring on two side surfaces of the stack.

The manufacturing method disclosed in U.S. Pat. No. 5,953,588 requires a large number of steps and this raises the cost for the layered chip package. According to the method, after a plurality of chips cut out from a processed wafer are embedded into the embedding resin, a plurality of leads are formed to be connected to each chip to thereby fabricate the neo-wafer, as described above. Accurate alignment between the plurality of chips is therefore required when fabricating the neo-wafer. This is also a factor that raises the cost for the layered chip package.

U.S. Pat. No. 7,127,807 B2 discloses a multilayer module formed by stacking a plurality of active layers each including a flexible polymer substrate with at least one electronic element and a plurality of electrically-conductive traces formed within the substrate. U.S. Pat. No. 7,127,807 B2 further discloses a manufacturing method for a multilayer module as described below. In the manufacturing method, a module array stack is fabricated by stacking a plurality of module arrays each of which includes a plurality of multilayer modules arranged in two orthogonal directions. The module array stack is then cut into a module stack which is a stack of a plurality of multilayer modules. Next, a plurality of electrically-conductive lines are formed on the respective side surfaces of the plurality of multilayer modules included in the module stack. The module stack is then separated from each other into individual multilayer modules.

With the multilayer module disclosed in U.S. Pat. No. 7,127,807 B2, it is impossible to increase the proportion of the area occupied by the electronic element in each active layer, and consequently it is difficult to achieve higher integration.

For a wafer to be cut into a plurality of chips, the yield of the chips, that is, the rate of conforming chips with respect to all chips obtained from the wafer, is 90% to 99% in many cases. Since a layered chip package includes a plurality of chips, the rate of layered chip packages in which all of the plurality of chips are conforming ones is lower than the yield of the chips. The larger the number of chips included in each layered chip package, the lower the rate of layered chip packages in which all of the chips are conforming ones.

A case will now be considered where a memory device such as a flash memory is formed using a layered chip package. For a memory device such as a flash memory, a redundancy technique of replacing a defective column of memory cells with a redundant column of memory cells is typically employed so that the memory device can normally function even when some memory cells are defective. The redundancy technique can also be employed in the case of forming a memory device using a layered chip package. This makes it possible that, even if some of memory cells included in any chip are defective, the memory device can normally function while using the chip including the defective memory cells. Suppose, however, that a chip including a control circuit and a plurality of memory cells has become defective due to, for example, a wiring failure of the control circuit, and the chip cannot function normally even by employing the redundancy technique.

In such a case, the defective chip is no longer usable. While the defective chip can be replaced with a conforming one, it increases the cost for the layered chip package.

U.S. Patent Application Publication No. 2007/0165461 A1 discloses a technique of identifying one or more defective flash memory dies in a flash memory device having a plurality of flash memory dies, and disabling memory access operations to each identified die.

In the case of forming a memory device using a layered chip package, one or more defective chips included in the layered chip package may be identified and access to such defective chips may be disabled in the same way as the technique disclosed in U.S. Patent Application Publication No. 2007/0165461 A1.

Disabling access to a defective chip in a layered chip package, however, gives rise to the following two problems. A first problem is that the defective chip is electrically connected to a plurality of terminals of the layered chip package by wiring, and such a connection can possibly cause malfunction of the layered chip package.

A second problem is that, for a layered chip package that includes a predetermined number of chips and is able to implement a memory device having a desired memory capacity when all the chips included in the layered chip package are conforming, simply disabling access to any defective chip included in the layered chip package is not sufficient for implementing the memory device having the desired memory capacity.

OBJECT AND SUMMARY OF THE INVENTION

It is an object of the present invention to provide a layered chip package including a plurality of semiconductor chips stacked, and a composite layered chip package and methods of manufacturing the same that make it possible to easily implement a package that provides, even if it includes a malfunctioning semiconductor chip, the same functions as those for the case where no malfunctioning semiconductor chip is included.

A layered chip package of the present invention includes: a main body having a top surface, a bottom surface, and four side surfaces; and wiring that includes a plurality of wires disposed on at least one of the side surfaces of the main body. The main body includes: a main part that includes a plurality of layer portions stacked and has a top surface and a bottom surface; and a plurality of terminals that are disposed on at least either one of the top and bottom surfaces of the main part and electrically connected to the plurality of wires.

Each of the plurality of layer portions includes a semiconductor chip and a plurality of electrodes, the plurality of electrodes being electrically connected to the plurality of wires. The plurality of electrodes include a plurality of first electrodes that are intended to establish electrical connection to the semiconductor chip, and a plurality of second electrodes that are not in contact with the semiconductor chip. In at least one of the plurality of layer portions, the plurality of first electrodes are in contact with and electrically connected to the semiconductor chip.

In the layered chip package of the present invention, the plurality of terminals include a plurality of first terminals that are disposed on the top surface of the main part and electrically connected to the plurality of wires. The plurality of first terminals may be formed by using the plurality of electrodes of the uppermost one of the layer portions. In such a case, the plurality of terminals may further include a plurality of second terminals that are disposed on the bottom surface of the main part and electrically connected to the plurality of wires.

In the layered chip package of the present invention, the plurality of wires may include a plurality of common wires that have a use common to all of the layer portions in the main part, and a plurality of layer-dependent wires that are used by respective different ones of the layer portions. In such a case, the plurality of first electrodes may be electrically connected to the plurality of common wires, while the plurality of second electrodes may be electrically connected to the plurality of layer-dependent wires. Each of the plurality of layer portions may further include a selective connection electrode that is selectively electrically connected to only the layer-dependent wire that the layer portion uses, among the plurality of layer-dependent wires. In at least one of the plurality of layer portions, the selective connection electrode may be electrically connected to the semiconductor chip, whereby the semiconductor chip may be electrically connected to the layer-dependent wire.

In the layered chip package of the present invention, the semiconductor chip may include a plurality of memory cells.

In the layered chip package of the present invention, the semiconductor chip may have four side surfaces. Each of the layer portions may further include an insulating portion that covers at least one of the four side surfaces of the semiconductor chip. In such a case, the insulating portion may have at least one end face that is located in the at least one of the side surfaces of the main body on which the plurality of wires are disposed.

In the layered chip package of the present invention, the plurality of layer portions may include at least one first-type layer portion and at least one second-type layer portion. In the first-type layer portion, the plurality of first electrodes are in contact with and electrically connected to the semiconductor chip. In the second-type layer portion, the plurality of first electrodes are not in contact with the semiconductor chip. The semiconductor chip of the first-type layer portion may be a normally functioning one. The semiconductor chip of the second-type layer portion may be a malfunctioning one.

When the plurality of layer portions include at least one first-type layer portion and at least one second-type layer portion, the plurality of wires may include a plurality of common wires that have a use common to all of the layer portions in the main part, and a plurality of layer-dependent wires that are used by respective different ones of the layer portions. In such a case, the plurality of first electrodes may be electrically connected to the plurality of common wires, while the plurality of second electrodes may be electrically connected to the plurality of layer-dependent wires. Each of the plurality of layer portions may further include a selective connection electrode that is selectively electrically connected to only the layer-dependent wire that the layer portion uses, among the plurality of layer-dependent wires. In the first-type layer portion, the selective connection electrode may be electrically connected to the semiconductor chip, whereby the semiconductor chip may be electrically connected to the layer-dependent wire. In the second-type layer portion, the selective connection electrode may be configured not to be electrically connected to the semiconductor chip, whereby the semiconductor chip may be configured not to be electrically connected to the layer-dependent wire.

A method of manufacturing layered chip packages of the present invention is a method by which a plurality of layered chip packages of the invention are manufactured. The manufacturing method includes the steps of: fabricating a layered substructure by stacking a plurality of substructures each of which includes an array of a plurality of preliminary layer portions, each of the preliminary layer portions being intended to become any one of the layer portions included in the main part, the substructures being intended to be cut later at positions of boundaries between every adjacent ones of the preliminary layer portions; and forming the plurality of layered chip packages from the layered substructure.

In the method of manufacturing the layered chip packages of the present invention, the plurality of layer portions may include at least one first-type layer portion and at least one second-type layer portion. In the first-type layer portion, the plurality of first electrodes are in contact with and electrically connected to the semiconductor chip. In the second-type layer portion, the plurality of first electrodes are not in contact with the semiconductor chip. The semiconductor chip of the first-type layer portion may be a normally functioning one. The semiconductor chip of the second-type layer portion may be a malfunctioning one.

In the method of manufacturing the layered chip packages of the present invention, the step of fabricating the layered substructure includes, as a series of steps for forming each of the substructures, the steps of fabricating a pre-substructure wafer that includes an array of a plurality of pre-semiconductor-chip portions, the pre-semiconductor-chip portions being intended to become the semiconductor chips, respectively; distinguishing the plurality of pre-semiconductor-chip portions included in the pre-substructure wafer into normally functioning pre-semiconductor-chip portions and malfunctioning pre-semiconductor-chip portions; and forming the plurality of first electrodes so that the plurality of first electrodes are in contact with and electrically connected to the normally functioning pre-semiconductor-chip portions while the plurality of first electrodes are not in contact with the malfunctioning pre-semiconductor-chip portions, whereby the pre-substructure wafer is made into the substructure.

The plurality of wires may include a plurality of common wires that have a use common to all of the layer portions in the main part, and a plurality of layer-dependent wires that are used by respective different ones of the layer portions. In such a case, the plurality of first electrodes may be electrically connected to the plurality of common wires, while the plurality of second electrodes may be electrically connected to the plurality of layer-dependent wires. Each of the plurality of layer portions may further include a selective connection electrode that is selectively electrically connected to only the layer-dependent wire that the layer portion uses, among the plurality of layer-dependent wires. In the first-type layer portion, the selective connection electrode may be electrically connected to the semiconductor chip, whereby the semiconductor chip may be electrically connected to the layer-dependent wire. In the second-type layer portion, the selective connection electrode may be configured not to be electrically connected to the semiconductor chip, whereby the semiconductor chip may be configured not to be electrically connected to the layer-dependent wire.

The step of fabricating the layered substructure may further include, as the series of steps for forming each of the substructures, the step of forming the selective connection electrode so that the selective connection electrode is electrically connected to the normally functioning pre-semiconductor-chip portions while the selective connection electrode is not electrically connected to the malfunctioning pre-semiconductor-chip portions.

A composite layered chip package of the present invention includes a main package and an additional portion that are stacked on each other and electrically connected to each other. The main package includes: a main body having a top surface, a bottom surface, and four side surfaces; and wiring that includes a plurality of wires disposed on at least one of the side surfaces of the main body. The main body includes: a main part that includes a plurality of layer portions stacked and has a top surface and a bottom surface; and a plurality of terminals that are disposed on at least either one of the top and bottom surfaces of the main part and electrically connected to the plurality of wires. Each of the plurality of layer portions includes a semiconductor chip and a plurality of electrodes, the plurality of electrodes being electrically connected to the plurality of wires. The plurality of electrodes include a plurality of first electrodes that are intended to establish electrical connection to the semiconductor chip, and a plurality of second electrodes that are not in contact with the semiconductor chip.

The plurality of layer portions may include at least one first-type layer portion and at least one second-type layer portion. The semiconductor chip of the first-type layer portion is a normally functioning one. In the first-type layer portion, the plurality of first electrodes are in contact with and electrically connected to the semiconductor chip. The semiconductor chip of the second-type layer portion is a malfunctioning one. In the second-type layer portion, the plurality of first electrodes are not in contact with the semiconductor chip.

The additional portion includes at least one additional semiconductor chip, and additional portion wiring that defines electrical connections between the at least one additional semiconductor chip and the plurality of terminals of the main package so that the at least one additional semiconductor chip substitutes for the semiconductor chip of the at least one second-type layer portion.

In the composite layered chip package of the present invention, the plurality of terminals may include a plurality of first terminals that are disposed on the top surface of the main part and electrically connected to the plurality of wires. The plurality of first terminals may be formed by using the plurality of electrodes of the uppermost one of the layer portions. In such a case, the plurality of terminals may further include a plurality of second terminals that are disposed on the bottom surface of the main part and electrically connected to the plurality of wires.

In the composite layered chip package of the present invention, the additional portion may include an additional portion main body having a top surface, a bottom surface, and four side surfaces. The additional portion main body may include at least one additional semiconductor chip. In such a case, the additional portion wiring may include: a plurality of additional portion wires that are disposed on at least one of the side surfaces of the additional portion main body; a plurality of first additional portion terminals that are disposed on the top surface of the additional portion main body and electrically connected to the plurality of additional portion wires; and a plurality of second additional portion terminals that are disposed on the bottom surface of the additional portion main body and electrically connected to the plurality of additional portion wires.

In the composite layered chip package of the present invention, the plurality of wires may include a plurality of common wires that have a use common to all of the layer portions in the main part, and a plurality of layer-dependent wires that are used by respective different ones of the layer portions. In such a case, the plurality of first electrodes may be electrically connected to the plurality of common wires, while the plurality of second electrodes may be electrically connected to the plurality of layer-dependent wires. Each of the plurality of layer portions may further include a selective connection electrode that is selectively electrically connected to only the layer-dependent wire that the layer portion uses, among the plurality of layer-dependent wires. In the first-type layer portion, the selective connection electrode may be electrically connected to the semiconductor chip, whereby the semiconductor chip may be electrically connected to the layer-dependent wire. In the second-type layer portion, the selective connection electrode may be configured not to be electrically connected to the semiconductor chip, whereby the semiconductor chip may be configured not to be electrically connected to the layer-dependent wire.

In the composite layered chip package of the present invention, the semiconductor chip in each of the layer portions and the additional semiconductor chip may each include a plurality of memory cells.

In the composite layered chip package of the present invention, the semiconductor chip in each of the layer portions may have four side surfaces. Each of the layer portions may further include an insulating portion that covers at least one of the four side surfaces of the semiconductor chip. In such a case, the insulating portion may have at least one end face that is located in the at least one of the side surfaces of the main body on which the plurality of wires are disposed.

A method of manufacturing the composite layered chip package of the present invention includes the steps of fabricating the main package; fabricating the additional portion; and stacking the main package and the additional portion on each other and electrically connecting the main package and the additional portion to each other.

According to the layered chip package and the method of manufacturing the same of the invention, it is possible to prevent malfunctioning semiconductor chips from being electrically connected to the wiring. The additional portion including a normally functioning semiconductor chip can be electrically connected to the layered chip package of the invention by using the plurality of terminals of the layered chip package. This makes it possible to easily implement a package that includes a plurality of semiconductor chips stacked and that is capable of providing, even if it includes a malfunctioning semiconductor chip, the same functions as those for the case where no malfunctioning semiconductor chip is included.

According to the composite layered chip package and the method of manufacturing the same of the present invention, the main package and the additional portion can be stacked on each other and electrically connected to each other. This makes it possible to easily implement a package that includes a plurality of semiconductor chips stacked and that is capable of providing, even if it includes a malfunctioning semiconductor chip, the same functions as those for the case where no malfunctioning semiconductor chip is included.

Other and further objects, features and advantages of the present invention will appear more fully from the following description.

DETAILED DESCRIPTION OF THE PREFERRED EMBODIMENTS

[First Embodiment]

Figure 1:
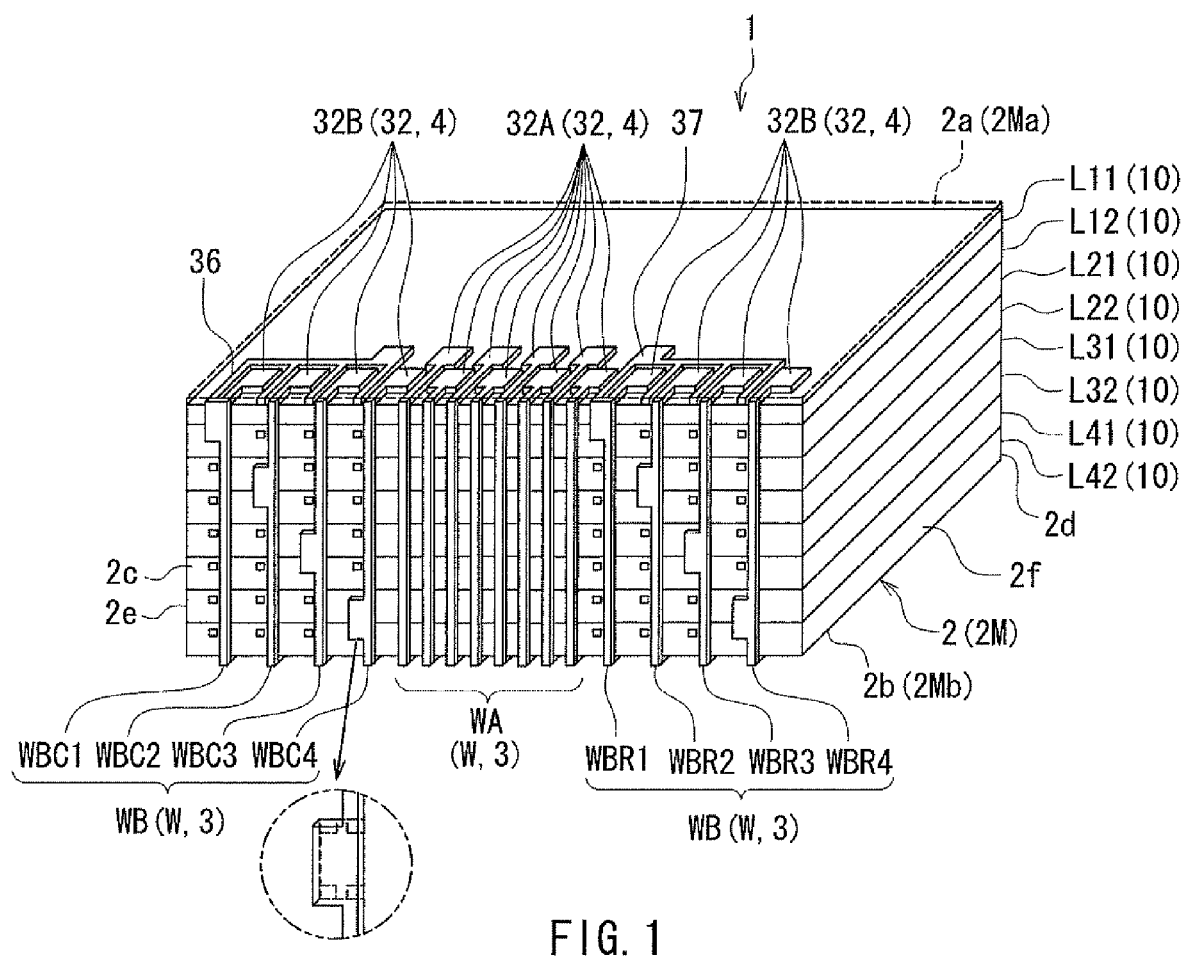
FIG. 1 is a perspective view of a layered chip package according to a first embodiment of the invention.
Figure 2:
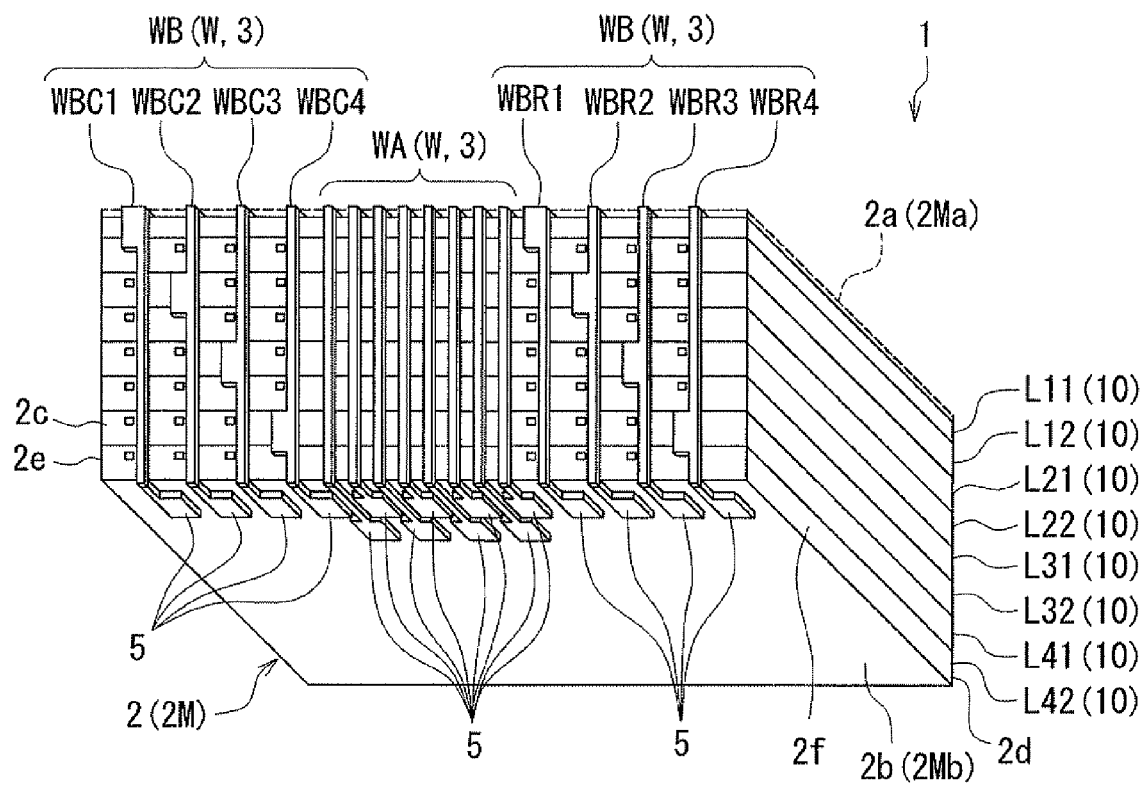
FIG. 2 is a perspective view showing the layered chip package of FIG. 1 as viewed from below.
Figure 3:
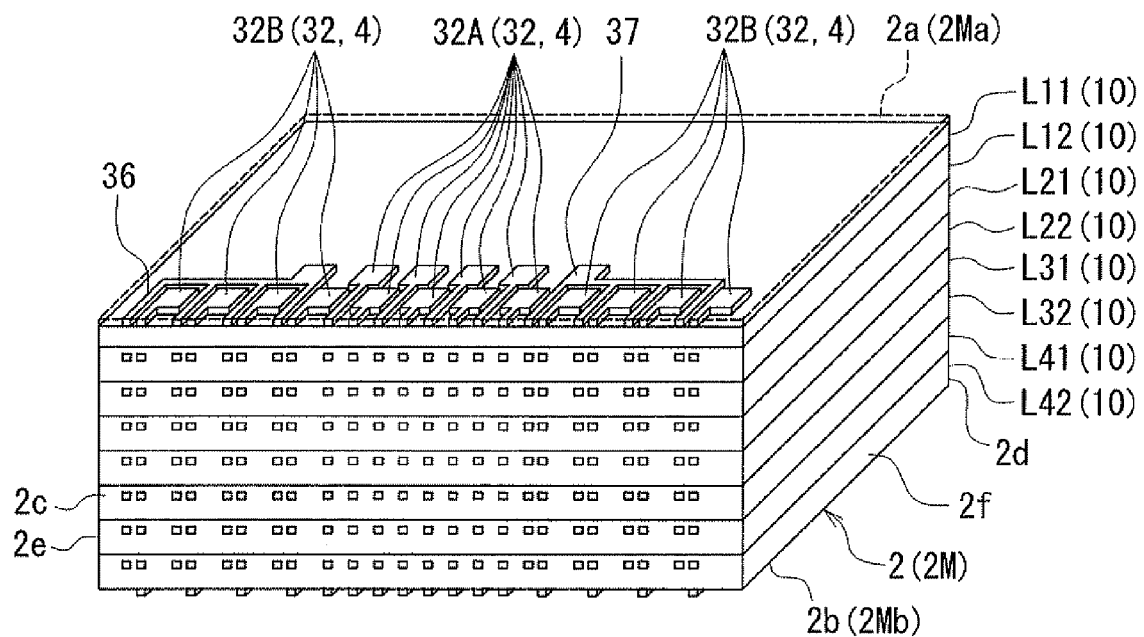
FIG. 3 is a perspective view of the layered chip package of FIG. 1 excluding the wiring.
Figure 4:
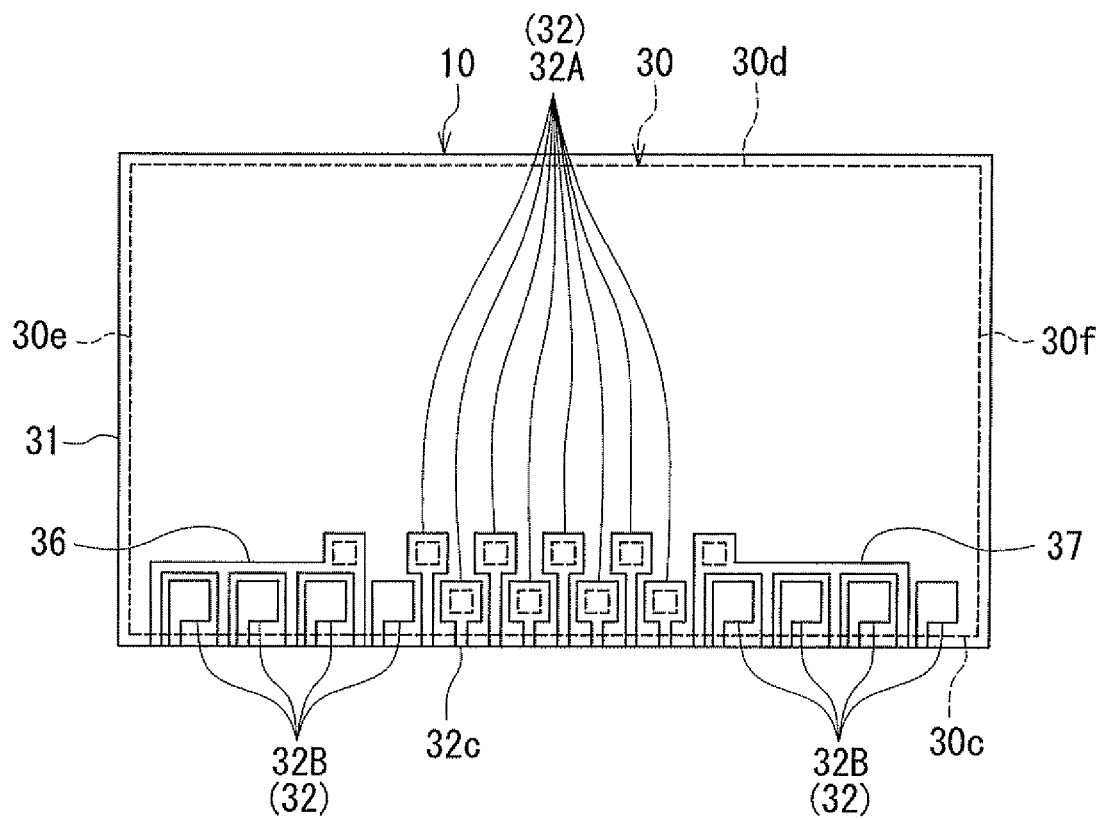
FIG. 4 is a plan view showing a layer portion included in the layered chip package of FIG. 1.
Figure 5:
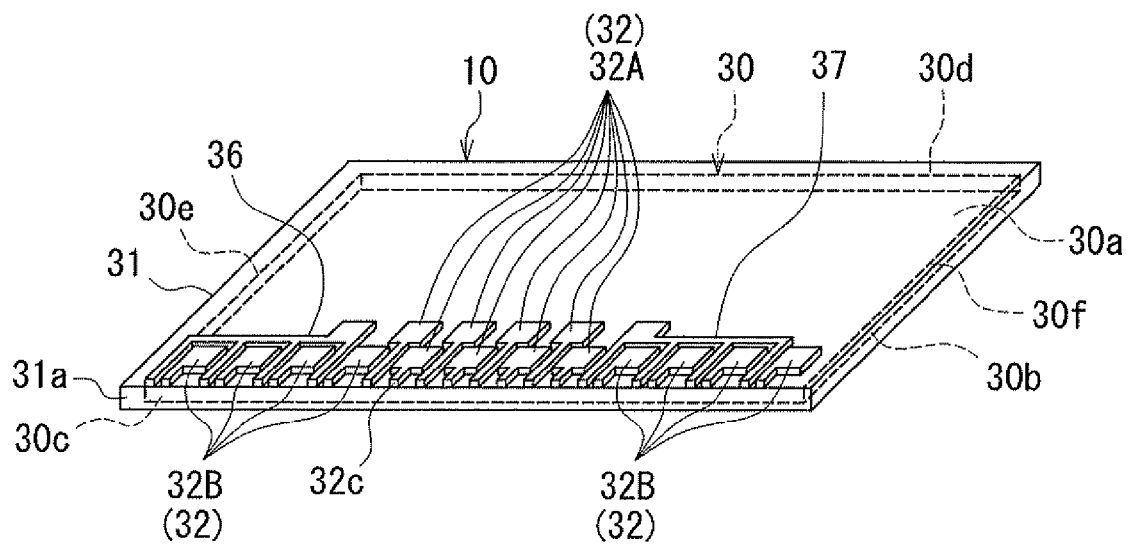
FIG. 5 is a perspective view of the layer portion shown in FIG. 4.

Preferred embodiments of the present invention will now be described in detail with reference to the drawings. First, reference is made to FIG. 1 to FIG. 5 to describe the configuration of a layered chip package according to a first embodiment of the invention. FIG. 1 is a perspective view of the layered chip package according to the first embodiment of the invention. FIG. 2 is a perspective view showing the layered chip package of FIG. 1 as viewed from below. FIG. 3 is a perspective view of the layered chip package of FIG. 1 excluding the wiring. FIG. 4 is a plan view showing a layer portion included in the layered chip package of FIG. 1. FIG. 5 is a perspective view of the layer portion shown in FIG. 4.

As shown in FIG. 1 to FIG. 3, the layered chip package 1 according to the present embodiment includes a main body 2 having a top surface 2a, a bottom surface 2b, and four side surfaces 2c, 2d, 2e and 2f. The side surfaces 2c and 2d are mutually opposite to each other. The side surfaces 2e and 2f are mutually opposite to each other. The layered chip package 1 further includes wiring 3 that includes a plurality of wires W disposed on at least one of the side surfaces of the main body 2. In the example shown in FIG. 1 and FIG. 2, the plurality of wires W are disposed on the side surface 2c only. The main body 2 includes a main part 2M. The main part 2M includes a plurality of layer portions 10 stacked, and has a top surface 2Ma and a bottom surface 2Mb.

The main body 2 further includes a plurality of terminals that are disposed on at least either one of the top surface 2Ma and the bottom surface 2Mb of the main part 2M and electrically connected to the plurality of wires W. In the example shown in FIG. 1 and FIG. 2, the plurality of terminals include a plurality of first terminals 4 that are disposed on the top surface 2Ma of the main part 2M and electrically connected to the plurality of wires W, and a plurality of second terminals 5 that are disposed on the bottom surface 2Mb of the main part 2M and electrically connected to the plurality of wires W.

When the main body 2 includes the plurality of first terminals 4 and the plurality of second terminals 5, a plurality of layered chip packages 1 can be stacked on each other and electrically connected to each other. When stacking a plurality of layered chip packages 1, the plurality of second terminals 5 of the upper one of any two vertically adjacent layered chip packages 1 are electrically connected to the plurality of first terminals 4 of the lower one.

At least either the terminals 4 or the terminals 5 may each include a solder layer made of a solder material, the solder layer being exposed in the surface of each of the terminals 4 or each of the terminals 5. In such a case, the solder layer is heated to melt and then solidified, whereby the plurality of second terminals 5 of the upper one of two layered chip packages 1 are electrically connected to the plurality of first terminals 4 of the lower one.

The plurality of layer portions 10 are stacked between the top surface 2Ma and the bottom surface 2Mb of the main part 2M. Every two vertically adjacent layer portions 10 are bonded to each other with an adhesive, for example. As one example, FIG. 1 to FIG. 3 show a case where the main part 2M includes eight layer portions 10. However, the number of the layer portions 10 to be included in the main part 2M is not limited to eight, and may be any plural number. Hereinafter, the eight layer portions 10 shown in FIG. 1 to FIG. 3 will be designated by reference symbols L11, L12, L21, L22, L31, L32, L41, and L42 in order from the top when the eight layer portions 10 are to be shown distinctively.

A description will now be given of the layer portions 10 with reference to FIG. 4 and FIG. 5. Each of the layer portions 10 includes a semiconductor chip 30. The semiconductor chip 30 has: a first surface 30a with a device formed thereon; a second surface 30b opposite to the first surface 30a; a first side surface 30c and a second side surface 30d that are mutually opposite to each other; and a third side surface 30e and a fourth side surface 30f that are mutually opposite to each other. The side surfaces 30c, 30d, 30e, and 30f face toward the side surfaces 2c, 2d, 2e, and 2f of the main body 2, respectively.

Each of the layer portions 10 further includes an insulating portion 31 and a plurality of electrodes 32. The insulating portion 31 covers at least one of the four side surfaces of the semiconductor chip 30. The plurality of electrodes 32 are electrically connected to the plurality of wires W. The insulating portion 31 has at least one end face 31a that is located in the at least one of the side surfaces of the main body 2 on which the plurality of wires W are disposed. In the example shown in FIG. 4 and FIG. 5, the insulating portion 31 covers all of the four side surfaces of the semiconductor chip 30, and has four end faces 31a located in the four side surfaces of the main body 2. The electrodes 32 have their respective end faces 32c that are located in the at least one of the side surfaces of the main body 2 on which the plurality of wires W are disposed. The wires W are electrically connected to the end faces 32c.

In each of the layer portions 10 other than the uppermost layer portion 10 in the main part 2M, the insulating portion 31 also covers the first surface 30a of the semiconductor chip 30 and the plurality of electrodes 32. In the uppermost layer portion 10 in the main part 2M, the insulating portion 31 covers the first surface 30a of the semiconductor chip 30 and surrounds the plurality of electrodes 32, not covering the plurality of electrodes 32. The plurality of electrodes 32 of the uppermost layer portion 10 are thus exposed. The plurality of first terminals 4 are formed by using the plurality of electrodes 32 of the uppermost layer portion 10. In FIG. 1 to FIG. 3, part of the insulating portion 31 of the uppermost layer portion 10 is shown by broken lines.

The plurality of electrodes 32 include a plurality of first electrodes 32A that are intended to establish electrical connection to the semiconductor chip 30, and a plurality of second electrodes 32B that are not in contact with the semiconductor chip 30. In at least one of the plurality of layer portions 10, the plurality of first electrodes 32A are in contact with and electrically connected to the semiconductor chip 30. In FIG. 4, the dashed squares in the first electrodes 32A represent the areas where the first electrodes 32A make contact with the semiconductor chip 30.

The plurality of wires W include a plurality of common wires WA that have a use common to all of the layer portions 10 in the main part 2M, and a plurality of layer-dependent wires WB that are used by respective different layer portions 10. The plurality of first electrodes 32A are electrically connected to the plurality of common wires WA. The plurality of second electrodes 32B are electrically connected to the plurality of layer-dependent wires WB.

Each of the layer portions 10 further includes at least one selective connection electrode that is selectively electrically connected to only the layer-dependent wire WB that the layer portion 10 uses, among the plurality of layer-dependent wires WB. In the example shown in FIG. 1 to FIG. 5, each of the layer portions 10 includes two selective connection electrodes 36 and 37 that are electrically connected to respective different layer-dependent wires WB. In at least one of the plurality of layer portions 10, the selective connection electrodes 36 and 37 are in contact with and electrically connected to the semiconductor chip 30, whereby the semiconductor chip 30 is electrically connected to the two layer-dependent wires WB that the layer portion 10 uses. In FIG. 4, the dashed squares in the selective connection electrodes 36 and 37 represent the areas where the selective connection electrodes 36 and 37 make contact with the semiconductor chip 30.

A detailed description will now be given of the plurality of layer-dependent wires WB and the selective connection electrodes 36 and 37 in the example shown in FIG. 1 to FIG. 3. In the example, the plurality of layer-dependent wires WB include wires WBC1, WBC2, WBC3, WBC4, WBR1, WBR2, WBR3, and WBR4. The wires WBC1 and WBR1 are used by the layer portions L11 and L12. The wires WBC2 and WBR2 are used by the layer portions L21 and L22. The wires WBC3 and WBR3 are used by the layer portions L31 and L32. The wires WBC4 and WBR4 are used by the layer portions L41 and L42.

Each of the layer portions 10 includes eight second electrodes 32B. The eight second electrodes 32B have their respective end faces that are located in the side surface 2c of the main body 2 and electrically connected to the wires WBC1, WBC2, WBC3, WBC4, WBR1, WBR2, WBR3, and WBR4, respectively.

The selective connection electrode 36 has four branched parts. The four branched parts have four end faces that are located in the side surface 2c of the main body 2. The four end faces are located near the four end faces of four second electrodes 32B that are electrically connected to the wires WBC1, WBC2, WBC3, and WBC4, respectively.

The selective connection electrode 37 has four branched parts. The four branched parts have four end faces that are located in the side surface 2c of the main body 2. The four end faces are located near the four end faces of four second electrodes 32B that are electrically connected to the wires WBR1, WBR2, WBR3, and WBR4, respectively.

In the layer portions L11 and L12, the wire WBC1 is broadened in part, so that the wire WBC1 makes contact with the end faces of the second electrodes 32B to which the wire WBC1 is electrically connected, and also with the end faces of the branched parts of the selective connection electrodes 36 located near the foregoing end faces of the electrodes 32B. Consequently, the selective connection electrodes 36 of the layer portions L11 and L12 are electrically connected to the wire WBC1.

In the layer portions L11 and L12, the wire WBR1 is broadened in part, so that the wire WBR1 makes contact with the end faces of the second electrodes 32B to which the wire WBR1 is electrically connected, and also with the end faces of the branched parts of the selective connection electrodes 37 located near the foregoing end faces of the electrodes 32B. Consequently, the selective connection electrodes 37 of the layer portions L11 and L12 are electrically connected to the wire WBR1.

In the layer portions L21 and L22, the wire WBC2 is broadened in part, so that the wire WBC2 makes contact with the end faces of the second electrodes 32B to which the wire WBC2 is electrically connected, and also with the end faces of the branched parts of the selective connection electrodes 36 located near the foregoing end faces of the electrode 32B. Consequently, the selective connection electrodes 36 of the layer portions L21 and L22 are electrically connected to the wire WBC2.

In the layer portions L21 and L22, the wire WBR2 is broadened in part, so that the wire WBR2 makes contact with the end faces of the second electrodes 32B to which the wire WBR2 is electrically connected, and also with the end faces of the branched parts of the selective connection electrodes 37 located near the foregoing end faces of the electrodes 32B. Consequently, the selective connection electrodes 37 of the layer portions L21 and L22 are electrically connected to the wire WBR2.

In the layer portions L31 and L32, the wire WBC3 is broadened in part, so that the wire WBC3 makes contact with the end faces of the second electrodes 32B to which the wire WBC3 is electrically connected, and also with the end faces of the branched parts of the selective connection electrodes 36 located near the foregoing end faces of the electrodes 32B. Consequently, the selective connection electrodes 36 of the layer portions L31 and L32 are electrically connected to the wire WBC3.

In the layer portions L31 and L32, the wire WBR3 is broadened in part, so that the wire WBR3 makes contact with the end faces of the second electrodes 32B to which the wire WBR3 is electrically connected, and also with the end faces of the branched parts of the selective connection electrodes 37 located near the foregoing end faces of the electrodes 32B. Consequently, the selective connection electrodes 37 of the layer portions L31 and L32 are electrically connected to the wire WBR3.

In the layer portions L41 and L42, the wire WBC4 is broadened in part, so that the wire WBC4 makes contact with the end faces of the second electrodes 32B to which the wire WBC4 is electrically connected, and also with the end faces of the branched parts of the selective connection electrodes 36 located near the foregoing end faces of the electrodes 32B. Consequently, the selective connection electrodes 36 of the layer portions L41 and L42 are electrically connected to the wire WBC4.

In the layer portions L41 and L42, the wire WBR4 is broadened in part, so that the wire WBR4 makes contact with the end faces of the second electrodes 32B to which the wire WBR4 is electrically connected, and also with the end faces of the branched parts of the selective connection electrodes 37 located near the foregoing end faces of the electrodes 32B. Consequently, the selective connection electrodes 37 of the layer portions L41 and L42 are electrically connected to the wire WBR4.

The plurality of layer portions 10 include at least one first-type layer portion. The plurality of layer portions 10 may further include at least one second-type layer portion. The semiconductor chip 30 of the first-type layer portion is a normally functioning one, whereas the semiconductor chip 30 of the second-type layer portion is a malfunctioning one. Hereinafter, a normally functioning semiconductor chip 30 will be referred to as a conforming semiconductor chip 30, and a malfunctioning semiconductor chip 30 will be referred to as a defective semiconductor chip 30. Hereinafter, the first-type layer portion will be designated by reference symbol 10A and the second-type layer portion will be designated by reference symbol 10B when the first-type layer portion and the second-type layer portion are to be distinguished from each other.

In the first-type layer portion 10A, the plurality of first electrodes 32A are in contact with and electrically connected to the semiconductor chip 30. In the second-type layer portion 10B, the plurality of first electrodes 32A are not in contact with the semiconductor chip 30. In the second-type layer portion 10B, the plurality of first electrodes 32A are thus not electrically connected to the semiconductor chip 30.

In the first-type layer portion 10A, the selective connection electrodes 36 and 37 are electrically connected to the semiconductor chip 30, whereby the semiconductor chip 30 is electrically connected to the two layer-dependent wires WB to which the selective connection electrodes 36 and 37 are electrically connected. In the second-type layer portion 10B, the selective connection electrodes 36 and 37 are not electrically connected to the semiconductor chip 30, whereby the semiconductor chip 30 is not electrically connected to the two layer-dependent wires WB to which the selective connection electrodes 36 and 37 are electrically connected.

The semiconductor chip 30 may be a memory chip that constitutes a memory such as a flash memory, DRAM, SRAM, MRAM, PROM, or FeRAM. In such a case, the semiconductor chip 30 includes a plurality of memory cells. In such a case, it is possible to implement a memory device of large capacity by using the layered chip package 1 which includes a plurality of semiconductor chips 30. With the layered chip package 1 according to the present embodiment, it is also possible to easily implement a memory of various capacities such as 64 GB (gigabytes), 128 GB, and 256 GB, by changing the number of the semiconductor chips 30 to be included in the layered chip package 1.

Suppose that the semiconductor chip 30 includes a plurality of memory cells. In this case, even if one or more of the memory cells are defective, the semiconductor chip 30 is still conforming if it can function normally by employing the redundancy technique.

The semiconductor chips 30 are not limited to memory chips, and may be used for implementing other devices such as CPUs, sensors, and driving circuits for sensors.

A composite layered chip package according to the present embodiment will now be described. The composite layered chip package according to the present embodiment includes a main package and an additional portion that are stacked on each other and electrically connected to each other. The main package is the layered chip package 1 according to the embodiment. Hereinafter, the main package will also be designated by reference numeral 1.

The additional portion includes at least one additional semiconductor chip, and additional portion wiring. The additional portion wiring defines electrical connections between the at least one additional semiconductor chip and the plurality of terminals 4 and 5 of the main package 1 so that the at least one additional semiconductor chip substitutes for the semiconductor chip 30 of at least one second-type layer portion 10B.

FIG. 6 to FIG. 9 show first to fourth examples of the additional portion. FIG. 6 to FIG. 9 respectively show additional portions 51A, 51B, 51C, and 51D each of which includes an additional portion main body 60 and additional portion wiring 53. The additional portion main body 60 has a top surface, a bottom surface, and four side surfaces. The additional portion main body 60 includes an additional semiconductor chip 80. The additional semiconductor chip 80 has the same configuration as that of a conforming semiconductor chip 30. The additional portion main body 60 corresponds to a single first-type layer portion 10A. Hereinafter, any additional portion will be designated by reference numeral 51.

The additional portion wiring 53 includes: a plurality of additional portion wires AW that are disposed on at least one of the side surfaces of the additional portion main body 60; a plurality of first additional portion terminals 54 that are disposed on the top surface of the additional portion main body 60 and electrically connected to the plurality of additional portion wires AW; and a plurality of second additional portion terminals 55 that are disposed on the bottom surface of the additional portion main body 60 and electrically connected to the plurality of additional portion wires AW. The shape and layout of the plurality of first additional portion terminals 54 are the same as those of the plurality of first terminals 4 shown in FIG. 1. The shape and layout of the plurality of second additional portion terminals 55 are the same as those of the plurality of second terminals 5 shown in FIG. 2.

The additional portion main body 60 further includes an insulating portion 81 that covers at least one of the four side surfaces of the additional semiconductor chip 80, and a plurality of electrodes 82 that are electrically connected to the plurality of additional portion wires AW. The insulating portion 81 has at least one end face located in the at least one of the side surfaces of the additional portion main body 60 on which the plurality of additional portion wires AW are disposed. In the example shown in FIG. 6 to FIG. 9, the insulating portion 81 covers all of the four side surfaces of the additional semiconductor chip 80, and has four end faces located in the four side surfaces of the additional portion main body 60. The electrodes 82 have their respective end faces that are located in the at least one of the side surfaces of the additional portion main body 60 on which the plurality of additional portion wires AW are disposed. The additional portion wires AW are electrically connected to such end faces.

Figure 6:
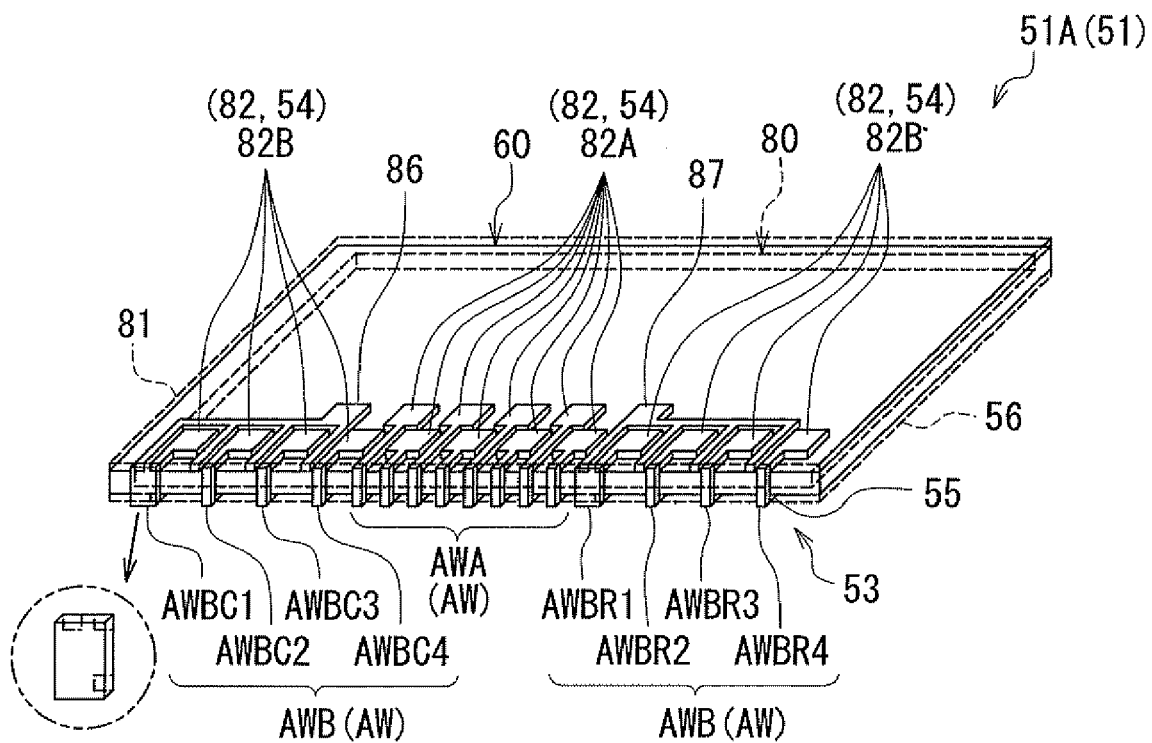
FIG. 6 is a perspective view showing a first example of an additional portion of the first embodiment of the invention.

The insulating portion 81 covers the first surface of the additional semiconductor chip 80 and surrounds the plurality of electrodes 82, not covering the plurality of electrodes 82. The plurality of electrodes 82 are thus exposed. The plurality of first additional portion terminals 54 are formed by using the plurality of electrodes 82. In FIG. 6 to FIG. 9, part of the insulating portion 81 is shown by broken lines. The additional portions 51A, 51B, 51C, and 51D each include an insulating layer 56 that is provided on the bottom surface of the additional portion main body 60 to surround the plurality of second additional portion terminals 55. In FIG. 6 and FIG. 9, the insulating layer 56 is shown by broken lines.

Like the plurality of electrodes 32 of the first-type layer portion 10A, the plurality of electrodes 82 include a plurality of first electrodes 82A that are intended to establish electrical connection to the additional semiconductor chip 80, and a plurality of second electrodes 82B that are not in contact with the additional semiconductor chip 80. The plurality of first electrodes 82A are in contact with and electrically connected to the additional semiconductor chip 80.

Like the plurality of wires W of the layered chip package 1, the plurality of additional portion wires AW include a plurality of common wires AWA and a plurality of layer-dependent wires AWB. The plurality of first electrodes 82A are electrically connected to the plurality of common wires AWA. The plurality of second electrodes 82B are electrically connected to the plurality of layer-dependent wires AWB.

The plurality of layer-dependent wires AWB include wires AWBC1 to AWBC4 and AWBR1 to AWBR4 that correspond to the wires WBC1 to WBC4 and WBR1 to WBR4 shown in FIG. 1 and FIG. 2.

The additional portion main body 60 further includes selective connection electrodes 86 and 87 having the same shape as that of the two selective connection electrodes 36 and 37 of each of the layer portions 10. The selective connection electrodes 86 and 87 are in contact with and electrically connected to the additional semiconductor chip 80, whereby the additional semiconductor chip 80 is electrically connected to two layer-dependent wires AWB.

In the additional portion 51A shown in FIG. 6, as with the layer portions L11 and L12, the wire AWBC1 is broadened, so that the wire AWBC1 makes contact with the end face of the second electrode 82B to which the wire AWBC1 is electrically connected, and also with the end face of the branched part of the selective connection electrode 86 located near the foregoing end face of the electrode 82B. The selective connection electrode 86 is thus electrically connected to the wire AWBC1. In the additional portion 51A, the wire AWBR1 is broadened, so that the wire AWBR1 makes contact with the end face of the second electrode 82B to which the wire AWBR1 is electrically connected, and also with the end face of the branched part of the selective connection electrode 87 located near the foregoing end face of the electrode 82B. The selective connection electrode 87 is thus electrically connected to the wire AWBR1.

The additional portion 51A has the same configuration and functions as those of each of the layer portions L11 and L12. The additional portion 51A is to substitute for the layer portion L11 or L12 when the layer portion L11 or L12 is a second-type layer portion 10B. The additional portion wiring 53 of the additional portion 51A defines electrical connections between the additional semiconductor chip 80 and the plurality of terminals 4 and 5 of the main package 1 so that the additional semiconductor chip 80 substitutes for the semiconductor chip 30 of the layer portion L11 or L12.

Figure 7:
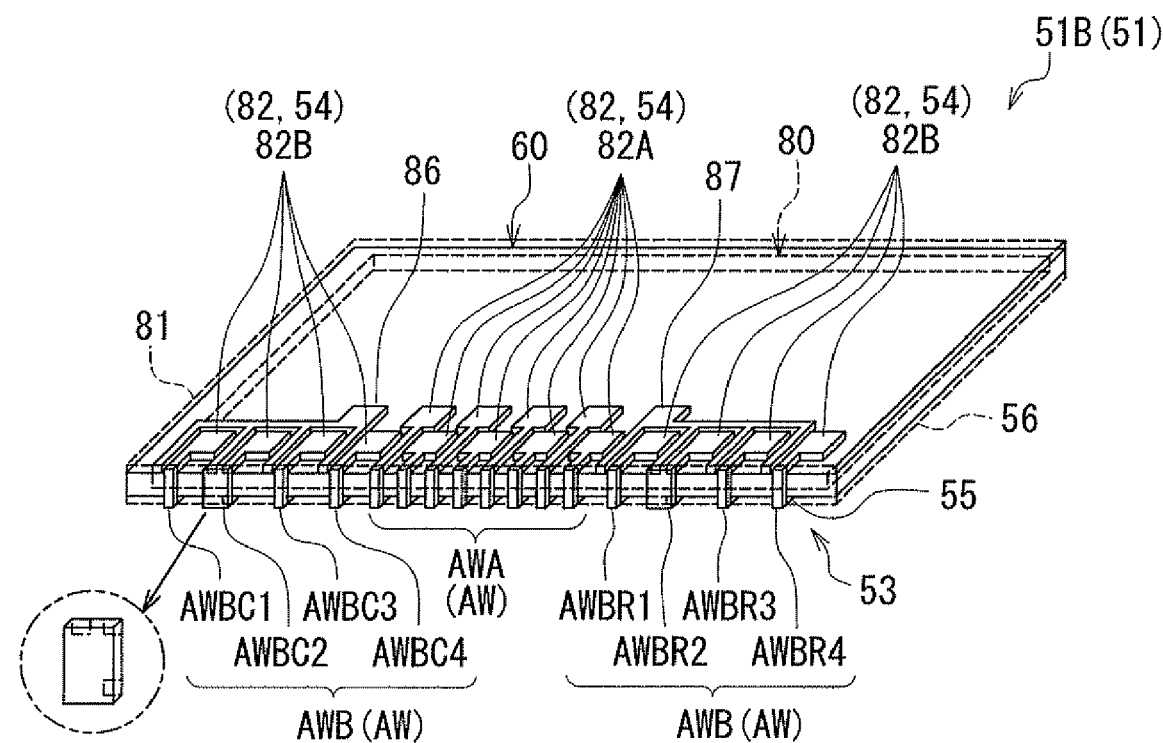
FIG. 7 is a perspective view showing a second example of the additional portion of the first embodiment of the invention.

In the additional portion 51B shown in FIG. 7, as with the layer portions L21 and L22, the wire AWBC2 is broadened, so that the wire AWBC2 makes contact with the end face of the second electrode 82B to which the wire AWBC2 is electrically connected, and also with the end face of the branched part of the selective connection electrode 86 located near the foregoing end face of the electrode 82B. The selective connection electrode 86 is thus electrically connected to the wire AWBC2. In the additional portion 51B, the wire AWBR2 is broadened, so that the wire AWBR2 makes contact with the end face of the second electrode 82B to which the wire AWBR2 is electrically connected, and also with the end face of the branched part of the selective connection electrode 87 located near the foregoing end face of the electrode 82B. The selective connection electrode 87 is thus electrically connected to the wire AWBR2.

The additional portion 51B has the same configuration and functions as those of each of the layer portions L21 and L22. The additional portion 51B is to substitute for the layer portion L21 or L22 when the layer portion L21 or L22 is a second-type layer portion 10B. The additional portion wiring 53 of the additional portion 51B defines electrical connections between the additional semiconductor chip 80 and the plurality of terminals 4 and 5 of the main package 1 so that the additional semiconductor chip 80 substitutes for the semiconductor chip 30 of the layer portion L21 or L22.

Figure 8:
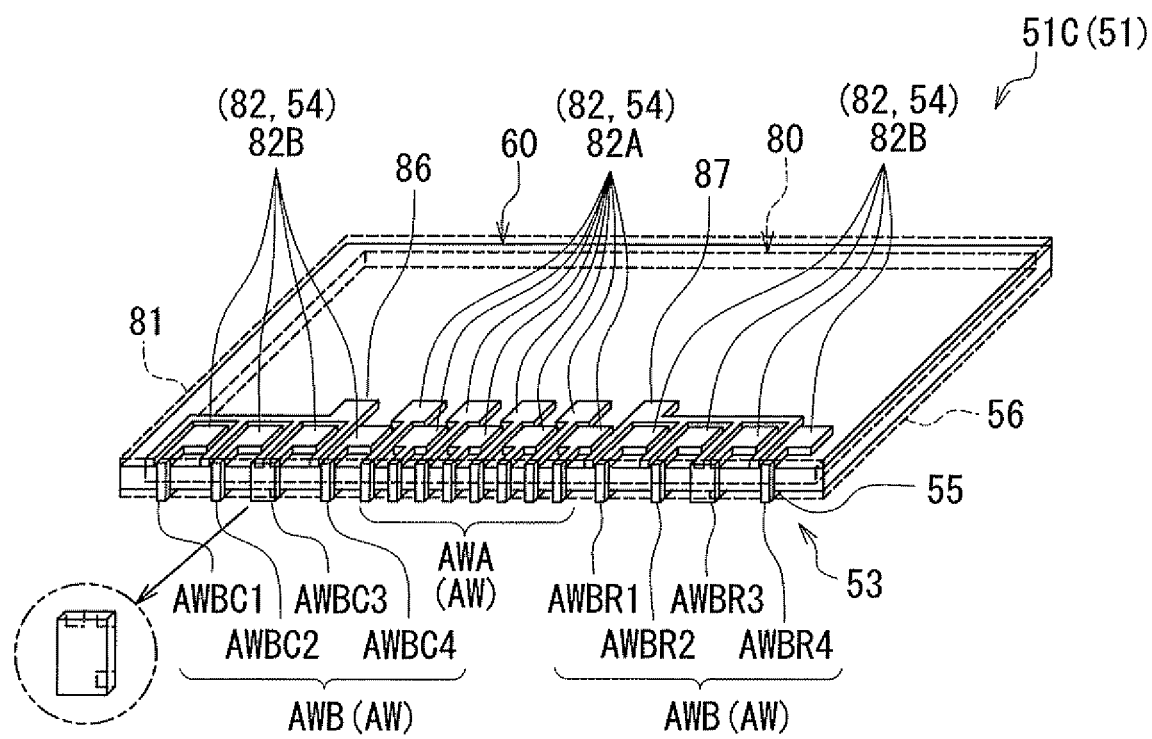
FIG. 8 is a perspective view showing a third example of the additional portion of the first embodiment of the invention.
Figure 9:
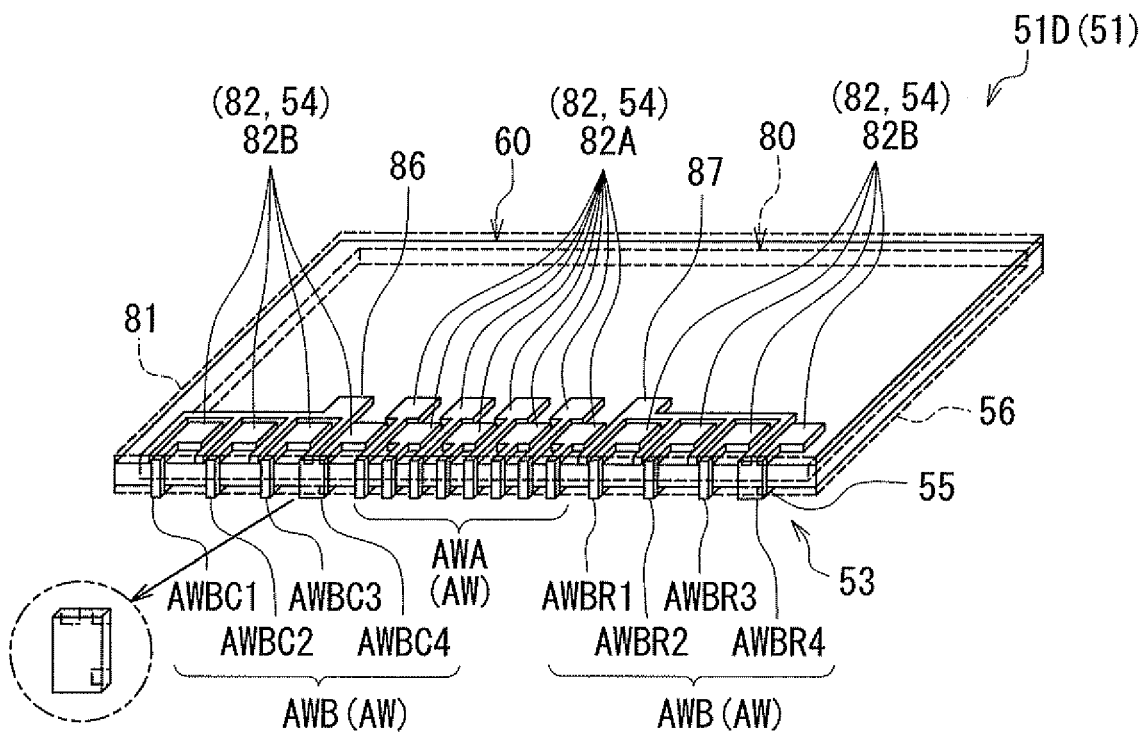
FIG. 9 is a perspective view showing a fourth example of the additional portion of the first embodiment of the invention.

In the additional portion 51C shown in FIG. 8, as with the layer portions L31 and L32, the wire AWBC3 is broadened, so that the wire AWBC3 makes contact with the end face of the second electrode 82B to which the wire AWBC3 is electrically connected, and also with the end face of the branched part of the selective connection electrode 86 located near the foregoing end face of the electrode 82B. The selective connection electrode 86 is thus electrically connected to the wire AWBC3. In the additional portion 51C, the wire AWBR3 is broadened, so that the wire AWBR3 makes contact with the end face of the second electrode 82B to which the wire AWBR3 is electrically connected, and also with the end face of the branched part of the selective connection electrode 87 located near the foregoing end face of the electrode 82B. The selective connection electrode 87 is thus electrically connected to the wire AWBR3.

The additional portion 51C has the same configuration and functions as those of each of the layer portions L31 and L32. The additional portion 51C is to substitute for the layer portion L31 or L32 when the layer portion L31 or L32 is a second-type layer portion 10B. The additional portion wiring 53 of the additional portion 51C defines electrical connections between the additional semiconductor chip 80 and the plurality of terminals 4 and 5 of the main package 1 so that the additional semiconductor chip 80 substitutes for the semiconductor chip 30 of the layer portion L31 or L32.

In the additional portion 51D shown in FIG. 9, as with the layer portions L41 and L42, the wire AWBC4 is broadened, so that the wire AWBC4 makes contact with the end face of the second electrode 82B to which the wire AWBC4 is electrically connected, and also with the end face of the branched part of the selective connection electrode 86 located near the foregoing end face of the electrode 82B. The selective connection electrode 86 is thus electrically connected to the wire AWBC4. In the additional portion 51D, the wire AWBR4 is broadened, so that the wire AWBR4 makes contact with the end face of the second electrode 82B to which the wire AWBR4 is electrically connected, and also with the end face of the branched part of the selective connection electrode 87 located near the foregoing end face of the electrode 82B. The selective connection electrode 87 is thus electrically connected to the wire AWBR4.

The additional portion 51D has the same configuration and functions as those of each of the layer portions L41 and L42. The additional portion 51D is to substitute for the layer portion L41 or L42 when the layer portion L41 or L42 is a second-type layer portion 10B. The additional portion wiring 53 of the additional portion 51D defines electrical connections between the additional semiconductor chip 80 and the plurality of terminals 4 and 5 of the main package 1 so that the additional semiconductor chip 80 substitutes for the semiconductor chip 30 of the layer portion L41 or L42.

According to the layered chip package 1 of the present embodiment, in the second-type layer portion 10B, the plurality of electrodes 32 and the selective connection electrodes 36 and 37 are not electrically connected to the semiconductor chip 30. Consequently, the defective semiconductor chip 30 in the second-type layer portion 10B is not electrically connected to the plurality of wires W, and is thus disabled.

According to the present embodiment, if the layered chip package 1 includes one or more second-type layer portions 10B, one or more additional portions 51 to substitute for the one or more second-type layer portions 10B are stacked together with the layered chip package 1 as the main package 1, whereby a composite layered chip package is formed. The composite layered chip package has the same functions as those of a layered chip package 1 that includes no defective semiconductor chip 30.

When forming a composite layered chip package by using any one of the additional portions 51A to 51D, the additional portion 51A, 51B, 51C, or 51D can be placed on either the top or bottom of the main package 1. If any one of the additional portions 51A to 51D is placed on the top of the main package 1, the plurality of second additional portion terminals 55 of the additional portion 51A, 51B, 51C, or 51D are electrically connected to the plurality of first terminals 4 of the main package 1. If any one of the additional portions 51A to 51D is placed on the bottom of the main package 1, the plurality of first additional portion terminals 54 of the additional portion 51A, 51B, 51C, or 51D are electrically connected to the plurality of second terminals 5 of the main package 1.

A stack of two or more additional portions 51 may be placed on the top or bottom of the main package 1 to form a composite layered chip package. In such a case, the plurality of second additional portion terminals 55 of the upper one of two vertically adjacent additional portions 51 are electrically connected to the plurality of first additional portion terminals 54 of the lower one. Alternatively, one or more additional portions 51 may be placed on both of the top and bottom of the main package 1 to form a composite layered chip package.

In any of the composite layered chip packages having the foregoing configurations, the additional semiconductor chip 80 in the additional portion 51 is electrically connected to the plurality of wires W of the main package 1 via the additional portion wiring 53 so that the additional semiconductor chip 80 substitutes for a defective semiconductor chip 30 in the main package 1.

Figure 10:
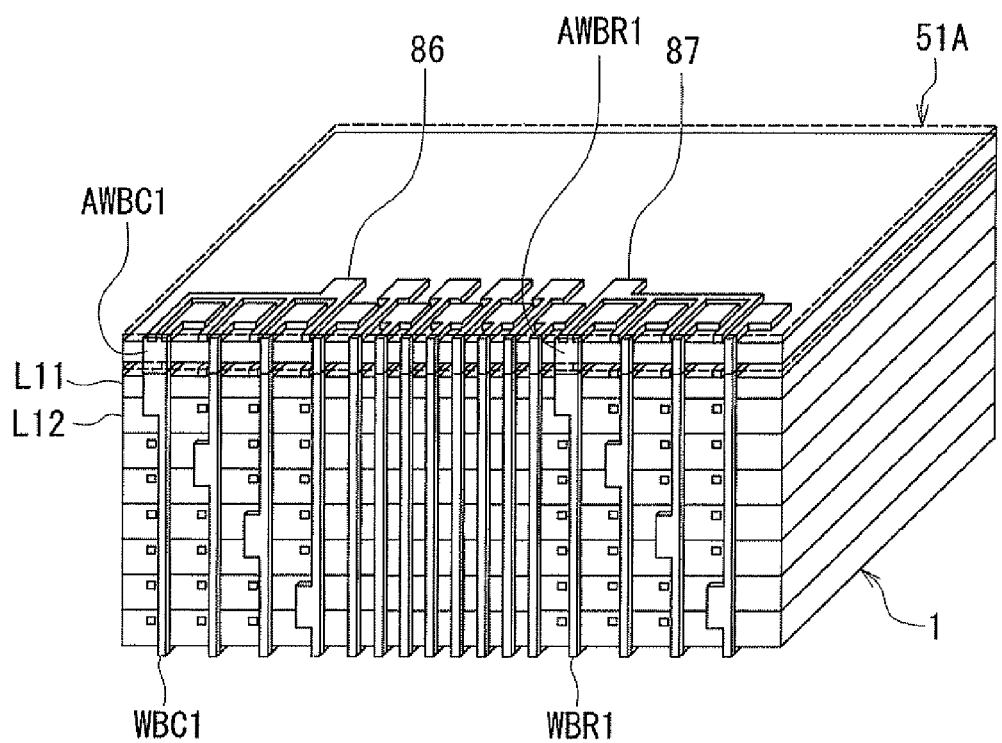
FIG. 10 is a perspective view showing a first example of a composite layered chip package according to the first embodiment of the invention.

FIG. 10 to FIG. 16 show first to seventh examples of the composite layered chip package. The first example shown in FIG. 10 is where the layer portion L11 or L12 of the main package 1 is a second-type layer portion 10B. In the example, the additional portion 51A to substitute for the layer portion L11 or L12 is placed on the top of the main package 1 to form a composite layered chip package. In the example, as with the layer portions L11 and L12, the selective connection electrodes 86 and 87 of the additional portion 51A are electrically connected to the wires WBC1 and WBR1 of the main package 1, respectively.

Figure 11:
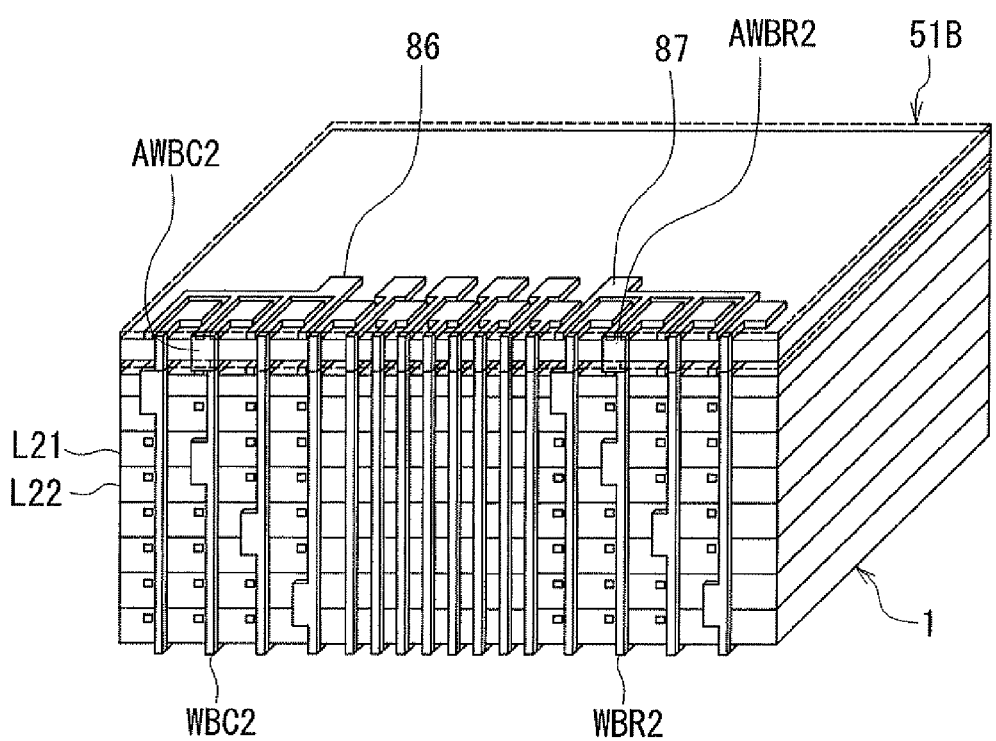
FIG. 11 is a perspective view showing a second example of the composite layered chip package according to the first embodiment of the invention.

The second example shown in FIG. 11 is where the layer portion L21 or L22 of the main package 1 is a second-type layer portion 10B. In the example, the additional portion 51B to substitute for the layer portion L21 or L22 is placed on the top of the main package 1 to form a composite layered chip package. In the example, as with the layer portions L21 and L22, the selective connection electrodes 86 and 87 of the additional portion 51B are electrically connected to the wires WBC2 and WBR2 of the main package 1, respectively.

Figure 12:
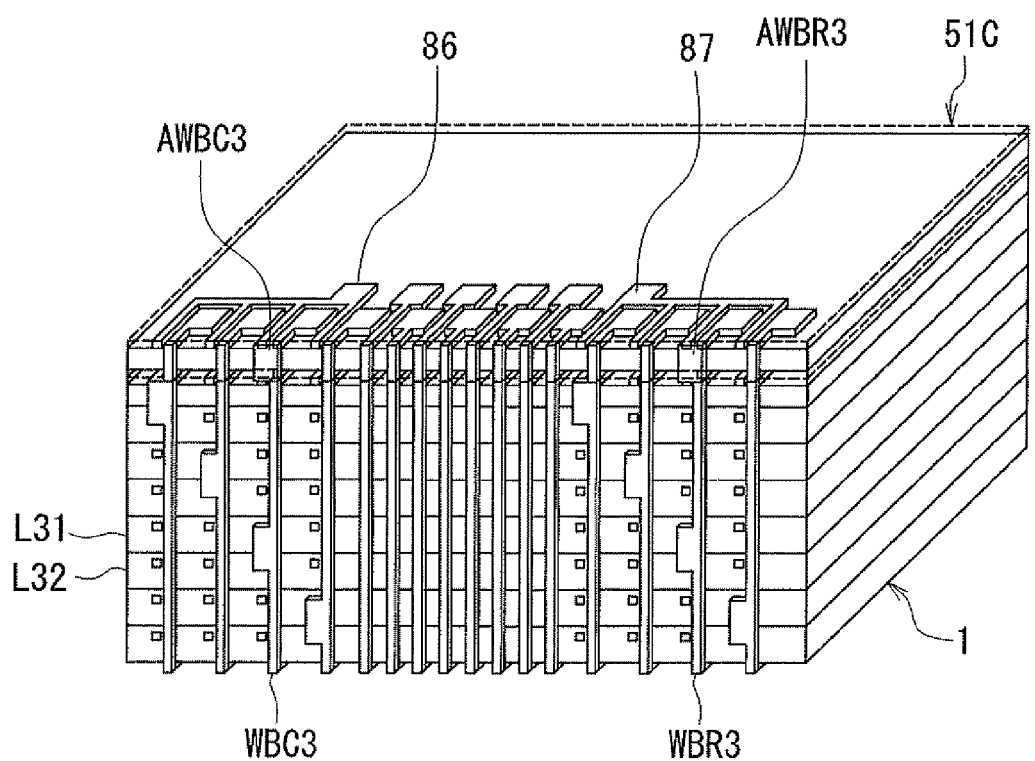
FIG. 12 is a perspective view showing a third example of the composite layered chip package according to the first embodiment of the invention.

The third example shown in FIG. 12 is where the layer portion L31 or L32 of the main package 1 is a second-type layer portion 10B. In the example, the additional portion 51C to substitute for the layer portion L31 or L32 is placed on the top of the main package 1 to form a composite layered chip package. In the example, as with the layer portions L31 and L32, the selective connection electrodes 86 and 87 of the additional portion 51C are electrically connected to the wires WBC3 and WBR3 of the main package 1, respectively.

Figure 13:
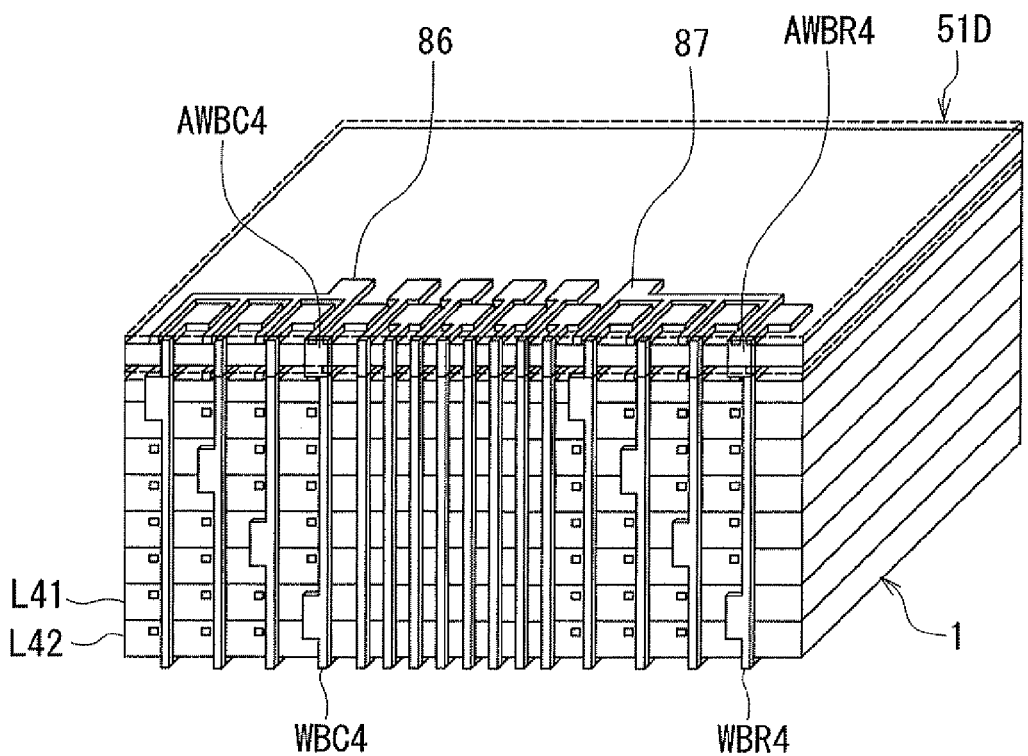
FIG. 13 is a perspective view showing a fourth example of the composite layered chip package according to the first embodiment of the invention.

The fourth example shown in FIG. 13 is where the layer portion L41 or L42 of the main package 1 is a second-type layer portion 10B. In the example, the additional portion 51D to substitute for the layer portion L41 or L42 is placed on the top of the main package 1 to form a composite layered chip package. In the example, as with the layer portions L41 and L42, the selective connection electrodes 86 and 87 of the additional portion 51D are electrically connected to the wires WBC4 and WBR4 of the main package 1, respectively.

Figure 14:
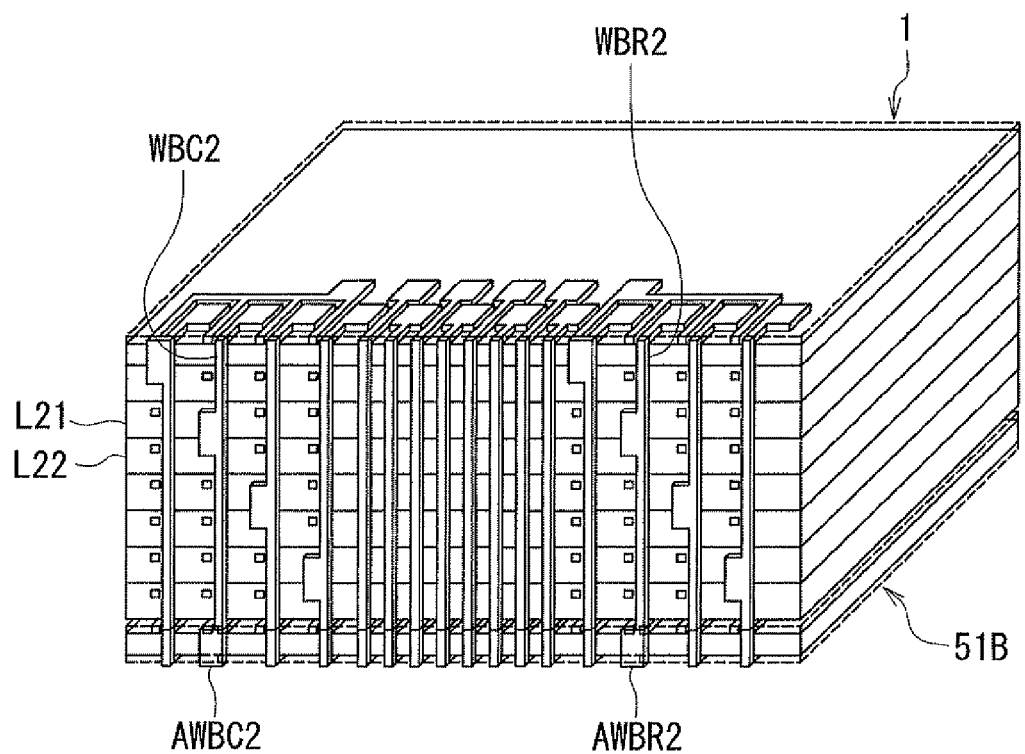
FIG. 14 is a perspective view showing a fifth example of the composite layered chip package according to the first embodiment of the invention.

The fifth example shown in FIG. 14 is where the layer portion L21 or L22 of the main package 1 is a second-type layer portion 10B. In the example, the additional portion 51B to substitute for the layer portion L21 or L22 is placed on the bottom of the main package 1 to form a composite layered chip package. The composite layered chip package of the fifth example has the same configuration as that of the composite layered chip package of the second example shown in FIG. 11.

It should be appreciated that the additional portion 51A to substitute for the layer portion L11 or L12 may be placed on the bottom of the main package 1 to form a composite layered chip package equivalent to that of the first example shown in FIG. 10. The additional portion 51C to substitute for the layer portion L31 or L32 may be placed on the bottom of the main package 1 to form a composite layered chip package equivalent to that of the third example shown in FIG. 12. The additional portion 51D to substitute for the layer portion L41 or L42 may be placed on the bottom of the main package 1 to form a composite layered chip package equivalent to that of the fourth example shown in FIG. 13.

Figure 15:
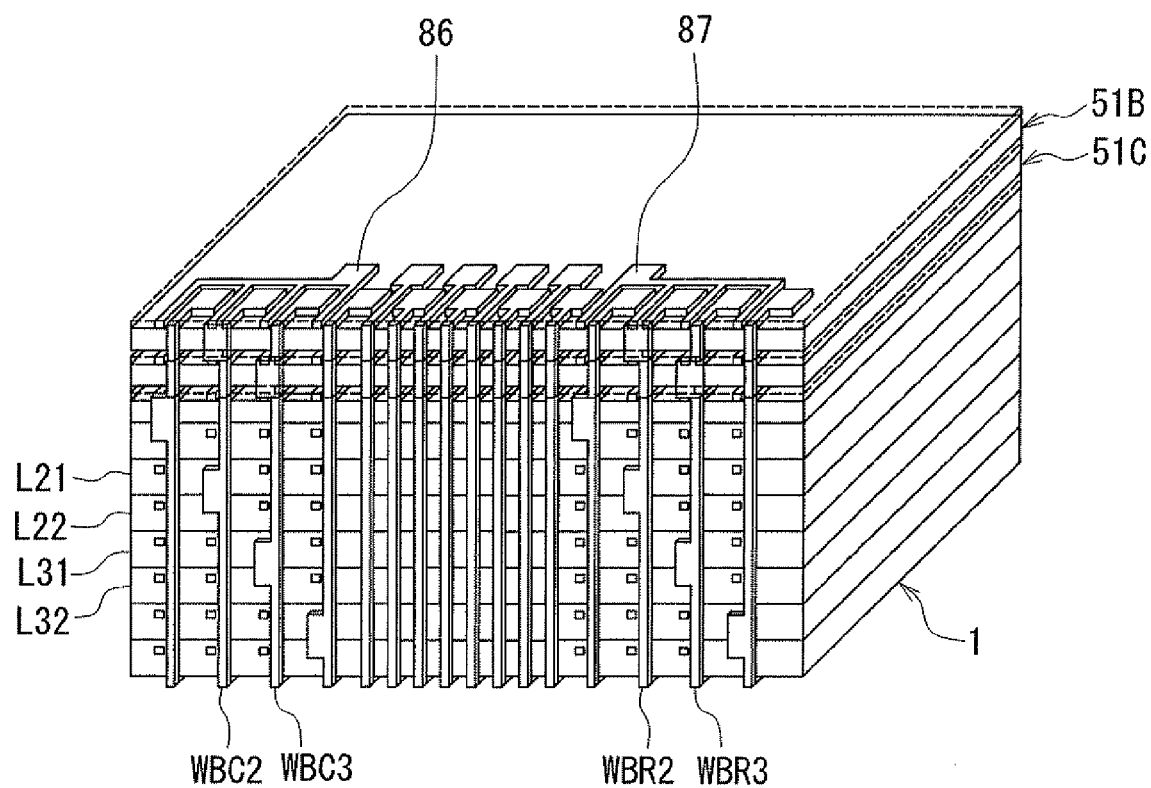
FIG. 15 is a perspective view showing a sixth example of the composite layered chip package according to the first embodiment of the invention.

The sixth example shown in FIG. 15 is where either one of the layer portions L21 and L22 and either one of the layer portions L31 and L32 of the main package 1 are second-type layer portions 10B. In the example, a stack of the additional portion 51C to substitute for the layer portion L31 or L32 and the additional portion 51B to substitute for the layer portion L21 or L22 is placed on the top of the main package 1 to form a composite layered chip package.

Figure 16:
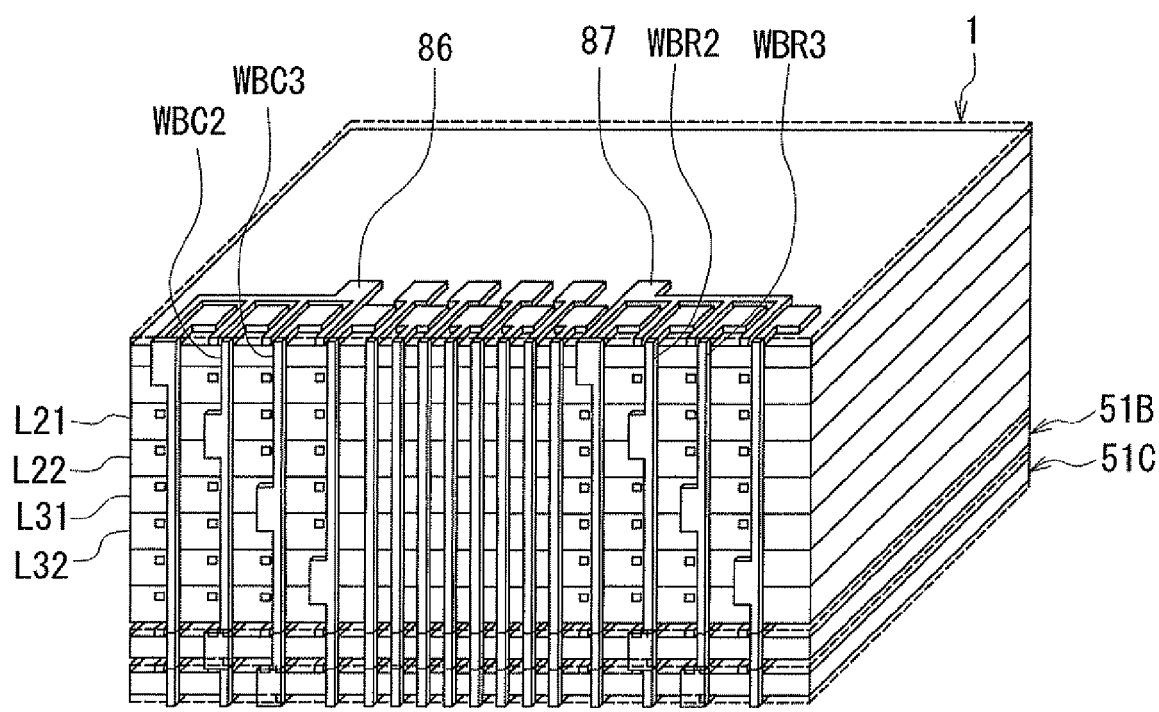
FIG. 16 is a perspective view showing a seventh example of the composite layered chip package according to the first embodiment of the invention.

The seventh example shown in FIG. 16 is where either one of the layer portions L21 and L22 and either one of the layer portions L31 and L32 of the main package 1 are second-type layer portions 10B. In the example, a stack of the additional portion 51C to substitute for the layer portion L31 or L32 and the additional portion 51B to substitute for the layer portion L21 or L22 is placed on the bottom of the main package 1 to form a composite layered chip package.

Needless to say, possible configurations of the composite layered chip package according to the embodiment are not limited to the first to seventh examples shown in FIG. 10 to FIG. 16. In the present embodiment, when the main package 1 includes one or more second-type layer portions 10B, one or more additional portions 51 to substitute for the one or more layer portions 10B are selected according to which of the layer portions L11, L12, L21, L22, L31, L32, L41 and L42 is/are the layer portion(s) 10B. The one or more additional portions 51 selected and the main package 1 are then stacked on each other and electrically connected to each other to form a composite layered chip package. Consequently, according to the embodiment, it is possible to easily provide a composite layered chip package having the same functions as those of a layered chip package 1 that includes no defective semiconductor chip 30, regardless of the number and location(s) of the second-type layer portion(s) 10B in the main package 1.

In the present embodiment, an additional portion including two or more additional semiconductor chips 80 may be prepared. Such an additional portion and a main package 1 that includes two or more second-type layer portions 10B may be stacked to form a composite layered chip package. The additional portion including two or more additional semiconductor chips 80 has the same configuration as that of a layered chip package 1 that includes two or more first-type layer portions 10A, except that the insulating layer 56 is disposed around the plurality of second additional portion terminals 55 corresponding to the plurality of second terminals 5. In such a case, the terminals 4 and 5, the electrodes 32, 36, and 37, and the wires W of the layered chip package 1 correspond to the terminals 54 and 55, the electrodes 82, 86, and 87, and the wires AW of the additional portion, respectively. In the additional portion including two or more additional semiconductor chips 80, the layer-dependent wires AWB for the electrodes 86 and 87 to be electrically connected to are selected for each of the layer portions 10A included in the additional portion, according to which of the layer portions of the main package 1 the layer portion 10A substitutes for.

Figure 17:
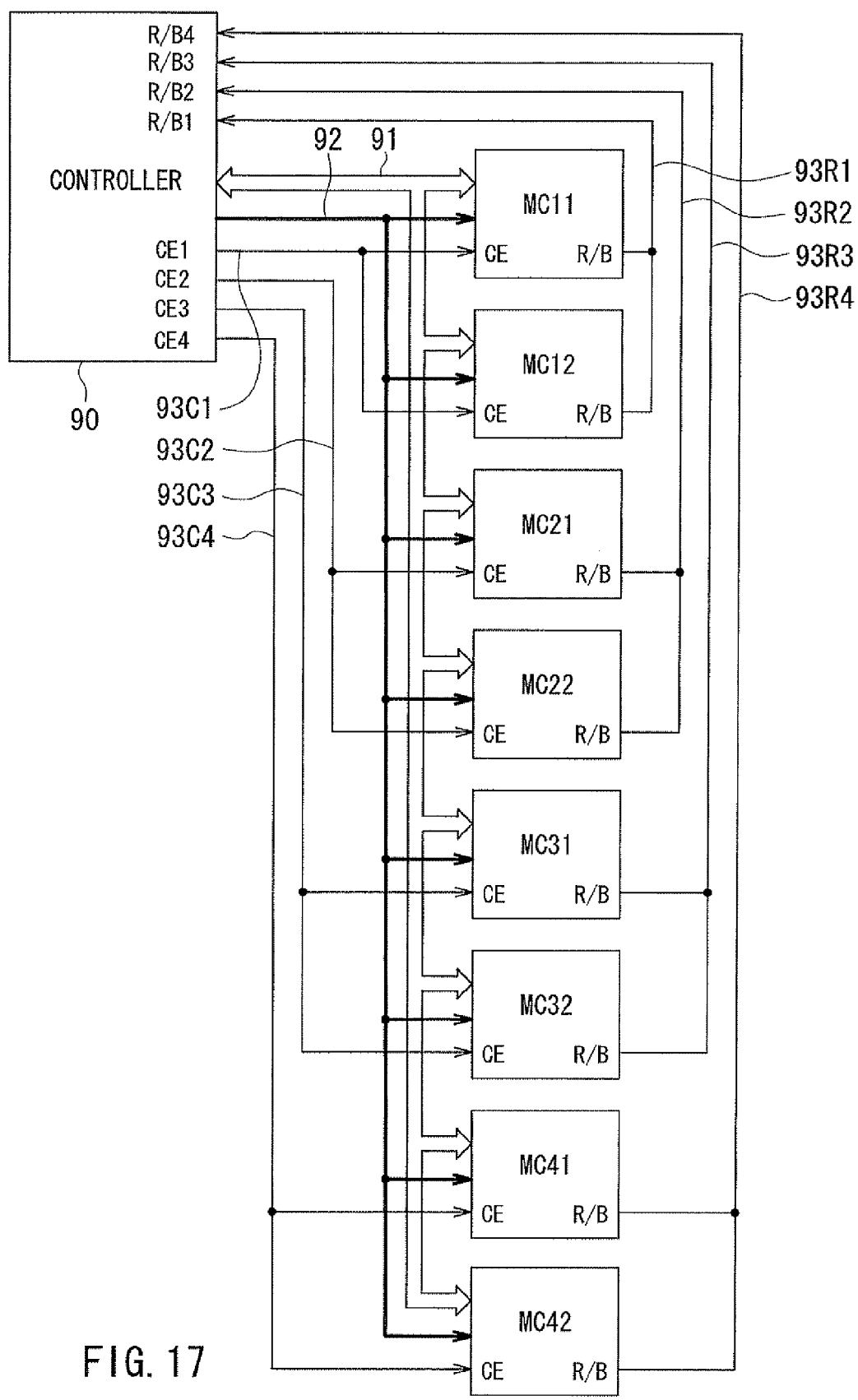
FIG. 17 is a block diagram showing the configuration of a memory device that uses the layered chip package according to the first embodiment of the invention.

Hereinafter, the layered chip package 1 and the composite layered chip package will be described in more detail with reference to a case where the layered chip package 1 according to the embodiment is used to construct a memory device. FIG. 17 is a block diagram showing the configuration of the memory device that uses the layered chip package 1 according to the embodiment. The memory device includes eight memory chips MC11, MC12, MC21, MC22, MC31, MC32, MC41, and MC42, and a controller 90 which controls these memory chips.

The memory chips MC11, MC12, MC21, MC22, MC31, MC32, MC41, and MC42 are the respective semiconductor chips 30 in the layer portions L11, L12, L21, L22, L31, L32, L41, and L42 of the layered chip package 1 shown in FIG. 1 and FIG. 2. Each of the memory chips includes a plurality of memory cells and a peripheral circuit such as an address decoder. The controller 90 is provided independent of the layered chip package 1, and is electrically connected to the plurality of first terminals 4 or second terminals 5 of the layered chip package 1.

The memory device further includes a data bus 91 which electrically connects the controller 90 to the eight memory chips, and one or more common lines 92 which electrically connect the controller 90 to the eight memory chips. Each of the eight memory chips includes a plurality of electrode pads to which the data bus 91 is electrically connected, and one or more electrode pads to which the one or more common lines 92 are electrically connected. The data bus 91 transmits addresses, commands, data, etc. The one or more common lines 92 include power lines as well as signal lines for transmitting signals that are other than those transmitted by the data bus 91 and are used in common by the eight memory chips.

Each of the eight memory chips further includes an electrode pad CE for receiving a chip enable signal and an electrode pad RB for outputting a ready/busy signal. The chip enable signal is a signal for controlling whether to select or deselect the memory chip. The ready/busy signal is a signal for indicating the operating state of the memory chip.

The memory device shown in FIG. 17 further includes signal lines 93C1, 93C2, 93C3, and 93C4. The signal line 93C1 electrically connects the controller 90 to the electrode pads CE of the memory chips MC11 and MC12, and transmits a chip enable signal CE1. The signal line 93C2 electrically connects the controller 90 to the electrode pads CE of the memory chips MC21 and MC22, and transmits a chip enable signal CE2. The signal line 93C3 electrically connects the controller 90 to the electrode pads CE of the memory chips MC31 and MC32, and transmits a chip enable signal CE3. The signal line 93C4 electrically connects the controller 90 to the electrode pads CE of the memory chips MC41 and MC42, and transmits a chip enable signal CE4.

The memory device shown in FIG. 17 further includes signal lines 93R1, 93R2, 93R3, and 93R4. The signal line 93R1 electrically connects the controller 90 to the electrode pads R/B of the memory chips MC11 and MC12, and transmits a ready/busy signal R/B1. The signal line 93R2 electrically connects the controller 90 to the electrode pads R/B of the memory chips MC21 and MC22, and transmits a ready/busy signal R/B2. The signal line 93R3 electrically connects the controller 90 to the electrode pads R/B of the memory chips MC31 and MC32, and transmits a ready/busy signal R/B3. The signal line 93R4 electrically connects the controller 90 to the electrode pads R/B of the memory chips MC41 and MC42, and transmits a ready/busy signal R/B4.

As described above, in the example shown in FIG. 17, the signal lines 93C1 and 93R1 are used by the memory chips MC11 and MC12 in common. The signal lines 93C2 and 93R2 are used by the memory chips MC21 and MC22 in common. The signal lines 93C3 and 93R3 are used by the memory chips MC31 and MC32 in common. The signal lines 93C4 and 93R4 are used by the memory chips MC41 and MC42 in common. Nevertheless, eight signal lines for transmitting respective different chip enable signals to the memory chips may be provided instead of the signal lines 93C1, 93C2, 93C3, and 93C4. Eight signal lines for transmitting respective different ready/busy signals from the memory chips may also be provided instead of the signal lines 93R1, 93R2, 93R3, and 93R4.

In the layered chip package 1 shown in FIG. 1 and FIG. 2, the plurality of common wires WA constitute parts of the data bus 91 and the one or more common lines 92. To all of the layer portions 10 in the main part 2M in common, the plurality of common wires WA thus have the use of transmitting signals and the like that are used in common by all the semiconductor chips 30 (memory chips) in the main part 2M. The wires WBC1, WBC2, WBC3, and WBC4 constitute parts of the signal lines 93C1, 93C2, 93C3, and 93C4, respectively. The wires WBR1, WBR2, WBR3, and WBR4 constitute parts of the signal lines 93R1, 93R2, 93R3, and 93R4, respectively.

Figure 18:
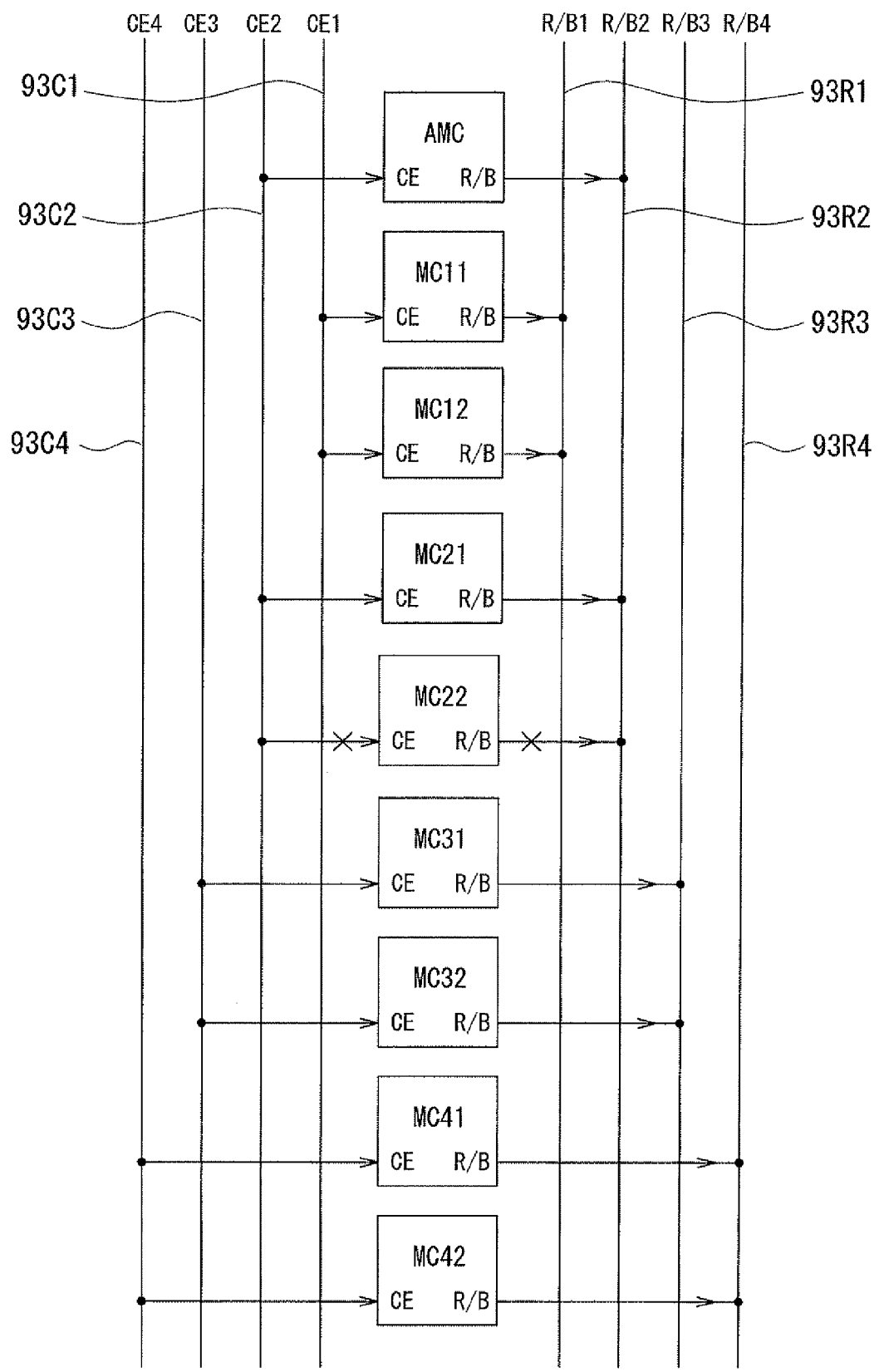
FIG. 18 is a block diagram showing a remedy for coping with situations where the memory device shown in FIG. 17 includes a defective chip.

FIG. 17 shows the case where the layered chip package 1 includes no defective semiconductor chip 30 (memory chip). Now, a description will be given of remedies according to the embodiment for coping with situations where the layered chip package 1 includes one or more defective semiconductor chips 30 (memory chips). As one example, FIG. 18 shows a remedy for coping with the situation where the memory chip MC22 of the layer portion L22 is defective. FIG. 18 shows the relationship between the plurality of memory chips and the signal lines 93C1, 93C2, 93C3, 93C4, 93R1, 93R2, 93R3, and 93R4.

If the memory chip MC22 is defective, the plurality of electrodes 32 and the selective connection electrodes 36 and 37 of the layer portion L22 are not electrically connected to the memory chip MC22. Consequently, the defective memory chip MC22 is not electrically connected to the plurality of wires W, and is thus disabled. In such a case, according to the embodiment, the layered chip package 1, which functions as the main package 1, and the additional portion 51B having the same configuration and functions as those of the layer portion L22 are stacked on each other to form a composite layered chip package as shown in FIG. 11 or 14.

In FIG. 18, the symbol AMC represents the memory chip that is the additional semiconductor chip 80 of the additional portion 51B. The memory chip AMC is electrically connected to the plurality of wires W of the main package 1 via the additional portion wiring 53. In particular, the selective connection electrodes 86 and 87 of the additional portion 51B are electrically connected to the wires WBC2 and WBR2 of the main package 1, respectively, as with the layer portion L22. Consequently, as shown in FIG. 18, the electrode pads CE and R/B of the memory chip AMC are electrically connected to the signal lines 93C2 and 93R2, respectively. The composite layered chip package therefore has the same functions as those of a layered chip package 1 that includes no defective semiconductor chip 30 (memory chip).

Figure 19:
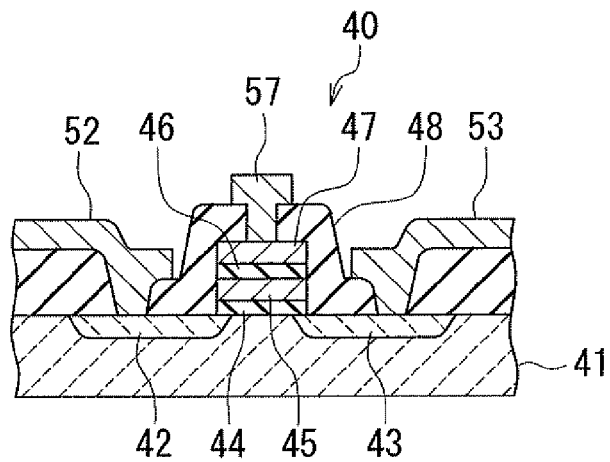
FIG. 19 is a cross-sectional view showing an example of a memory cell included in the semiconductor chip.

Reference is now made to FIG. 19 to describe an example of the configuration of the memory cells included in the semiconductor chip 30 (memory chip). The memory cell 40 shown in FIG. 19 includes a source 42 and a drain 43 formed near a surface of a P-type silicon substrate 41. The source 42 and the drain 43 are both N-type regions. The source 42 and the drain 43 are disposed at a predetermined distance from each other so that a channel composed of a part of the P-type silicon substrate 41 is provided between the source 42 and the drain 43. The memory cell 40 further includes an insulating film 44, a floating gate 45, an insulating film 46, and a control gate 47 that are stacked in this order on the surface of the substrate 41 at the location between the source 42 and the drain 43. The memory cell 40 further includes an insulating layer 48 that covers the source 42, the drain 43, the insulating film 44, the floating gate 45, the insulating film 46 and the control gate 47. The insulating layer 48 has contact holes that open in the tops of the source 42, the drain 43 and the control gate 47, respectively. The memory cell 40 includes a source electrode 52, a drain electrode 53, and a control gate electrode 57 that are formed on the insulating layer 48 at locations above the source 42, the drain 43 and the control gate 47, respectively. The source electrode 52, the drain electrode 53 and the control gate electrode 57 are connected to the source 42, the drain 43 and the control gate 47, respectively, through the corresponding contact holes.

A description will now be given of a method of manufacturing the layered chip package 1 according to the present embodiment. The method of manufacturing the layered chip package 1 according to the embodiment is a method by which a plurality of layered chip packages 1 are manufactured. The method includes the steps of fabricating a layered substructure by stacking a plurality of substructures each of which includes an array of a plurality of preliminary layer portions, each of the preliminary layer portions being intended to become any one of the layer portions 10 included in the main part 2M, the substructures being intended to be cut later at positions of boundaries between every adjacent preliminary layer portions; and forming the plurality of layered chip packages 1 from the layered substructure.

Figure 20:
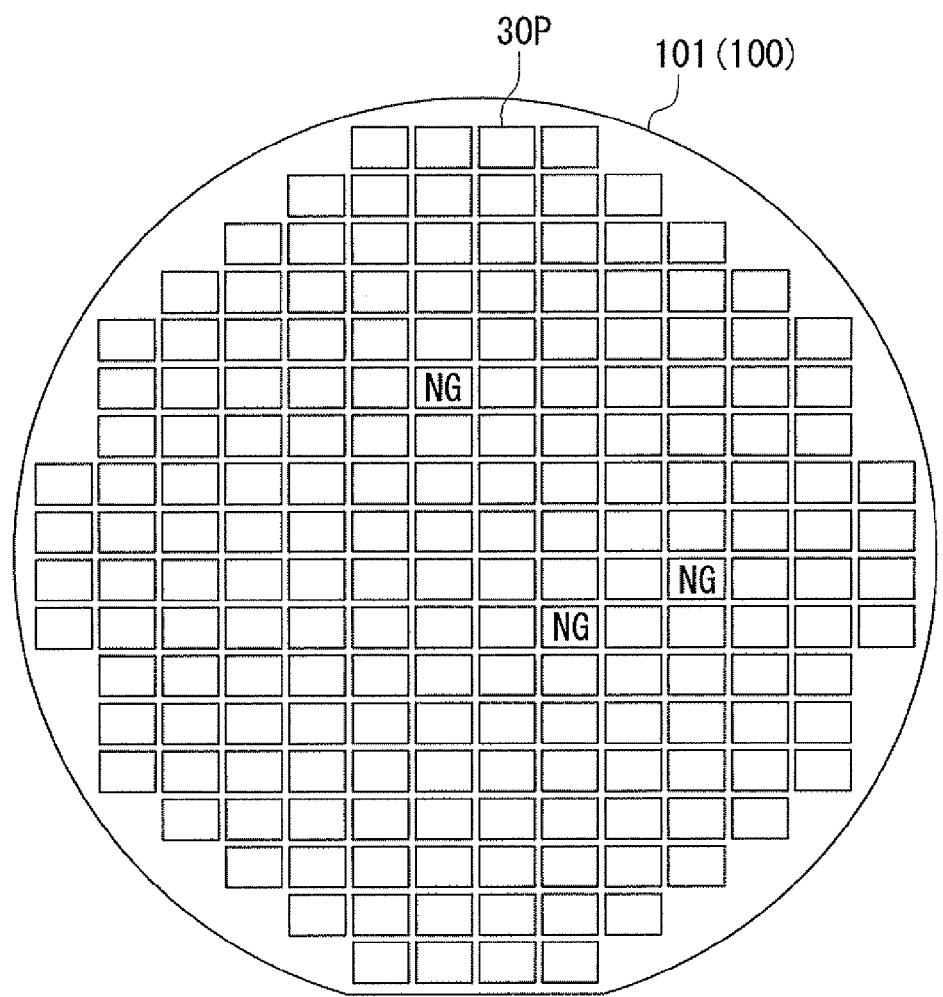
FIG. 20 is a plan view showing a pre-substructure wafer fabricated in a step of a method of manufacturing the composite layered chip package according to the first embodiment of the invention.
Figure 21:
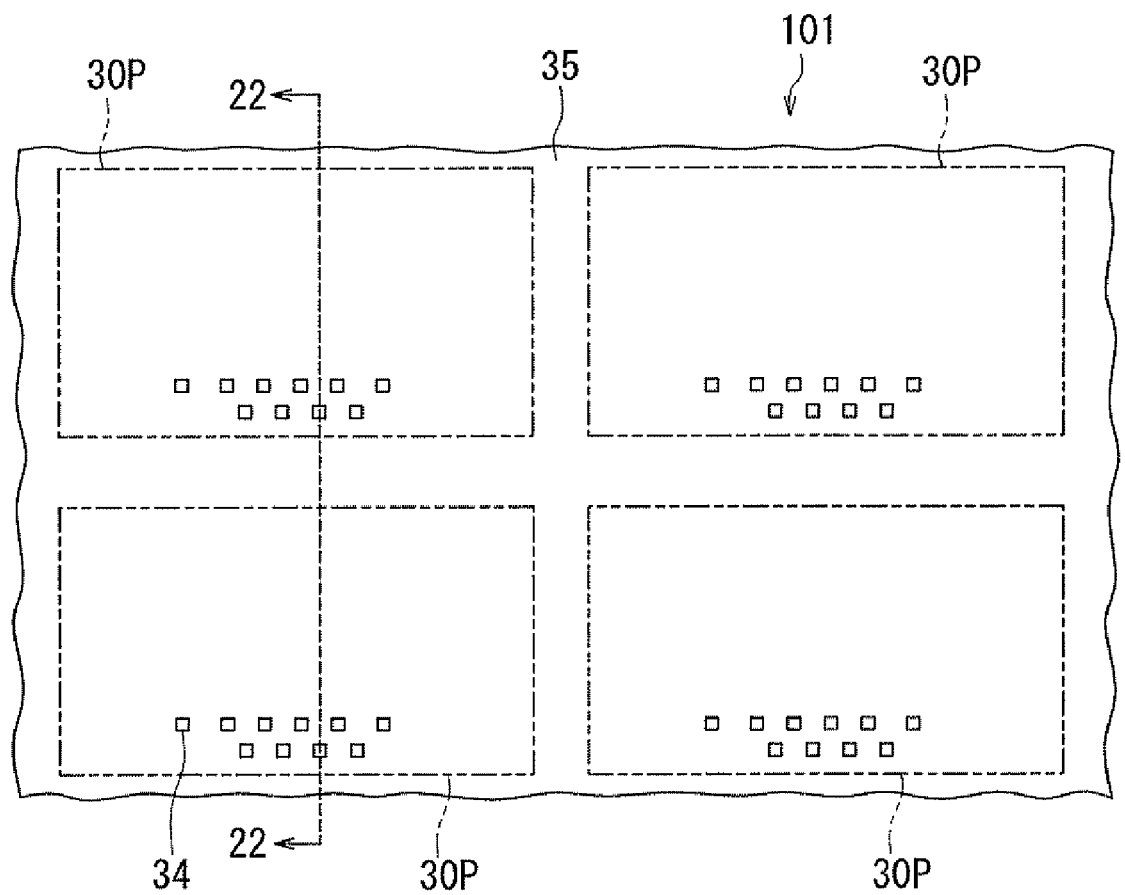
FIG. 21 is a magnified plan view of a part of the pre-substructure wafer shown in FIG. 20.
Figure 22:
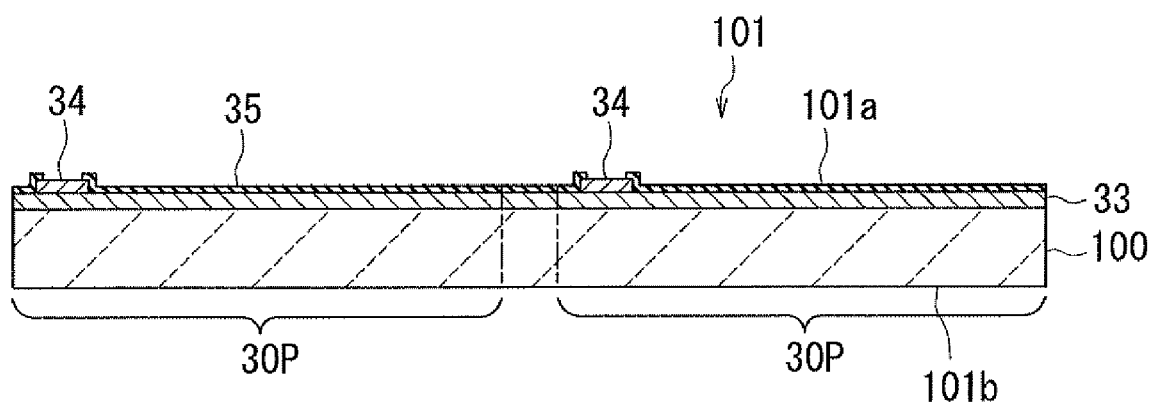
FIG. 22 shows a cross section taken along line 22-22 of FIG. 21.

The step of fabricating the layered substructure will now be described in detail with reference to FIG. 20 to FIG. 34. In the step of fabricating the layered substructure, a pre-substructure wafer 101 is initially fabricated. The pre-substructure wafer 101 includes an array of a plurality of pre-semiconductor-chip portions 30P that are intended to become individual semiconductor chips 30. FIG. 20 is a plan view of the pre-substructure wafer 101. FIG. 21 is a magnified plan view of a part of the pre-substructure wafer 101 shown in FIG. 20. FIG. 22 shows a cross section taken along line 22-22 of FIG. 21.

Specifically, in the step of fabricating the pre-substructure wafer 101, a semiconductor wafer 100 having two mutually opposite surfaces is subjected to processing, such as a wafer process, at one of the two surfaces. This forms the pre-substructure wafer 101 including an array of a plurality of pre-semiconductor-chip portions 30P, each of the pre-semiconductor-chip portions 30P including a device. In the pre-substructure wafer 101, the plurality of pre-semiconductor-chip portions 30P may be in a row, or in a plurality of rows such that a number of pre-semiconductor-chip portions 30P are arranged both in vertical and horizontal directions. In the following description, assume that the plurality of pre-semiconductor-chip portions 30P in the pre-substructure wafer 101 are in a plurality of rows such that a number of pre-semiconductor-chip portions 30P are arranged both in vertical and horizontal directions. The semiconductor wafer 100 may be a silicon wafer, for example. The wafer process is a process in which a semiconductor wafer is processed into a plurality of devices that are not yet separated into a plurality of chips. For ease of understanding, FIG. 20 depicts the pre-semiconductor-chip portions 30P larger relative to the semiconductor wafer 100. For example, if the semiconductor wafer 100 is a 12-inch wafer and the top surface of each pre-semiconductor-chip portion 30 is 8 to 10 mm long at each side, then 700 to 900 pre-semiconductor-chip portions 30P are obtainable from a single semiconductor wafer 100.

As shown in FIG. 22, the pre-semiconductor-chip portions 30P include a device-forming region 33 that is formed near one of the surfaces of the semiconductor wafer 100. The device-forming region 33 is a region where devices are formed by processing the one of the surfaces of the semiconductor wafer 100. The pre-semiconductor-chip portions 30P further include a plurality of electrode pads 34 disposed on the device-forming region 33, and a passivation film 35 disposed on the device-forming region 33. The passivation film 35 is made of an insulating material such as phospho-silicate-glass (PSG), silicon nitride, or polyimide resin. The passivation film 35 has a plurality of openings for exposing the top surfaces of the plurality of electrode pads 34. The plurality of electrode pads 34 are located in the positions corresponding to the plurality of electrodes 32A, 36, and 37 to be formed later, and are electrically connected to the devices formed in the device-forming region 33. Hereinafter, the surface of the pre-substructure wafer 101 located closer to the plurality of electrode pads 34 and the passivation film 35 will be referred to as a first surface 101a, and the opposite surface will be referred to as a second surface 101b.

In the step of fabricating the layered substructure, next, a wafer sort test is performed to distinguish the plurality of pre-semiconductor-chip portions 30P included in the pre-substructure wafer 101 into normally functioning pre-semiconductor-chip portions and malfunctioning pre-semiconductor-chip portions. In this step, a probe of a testing device is brought into contact with the plurality of electrode pads 34 of each pre-semiconductor-chip portion 30P so that whether the pre-semiconductor-chip portion 30P functions normally or not is tested with the testing device. In FIG. 20, the pre-semiconductor-chip portions 30P marked with "NG" are malfunctioning ones, and the other pre-semiconductor-chip portions 30P are normally functioning ones. This step provides location information on the normally functioning pre-semiconductor-chip portions 30P and the malfunctioning pre-semiconductor-chip portions 30P in each pre-substructure wafer 101. The location information is used in a step to be performed later. The passivation film 35 may be formed after the wafer sort test, and may thus be yet to be formed at the time of performing the wafer sort test.

Figure 23:
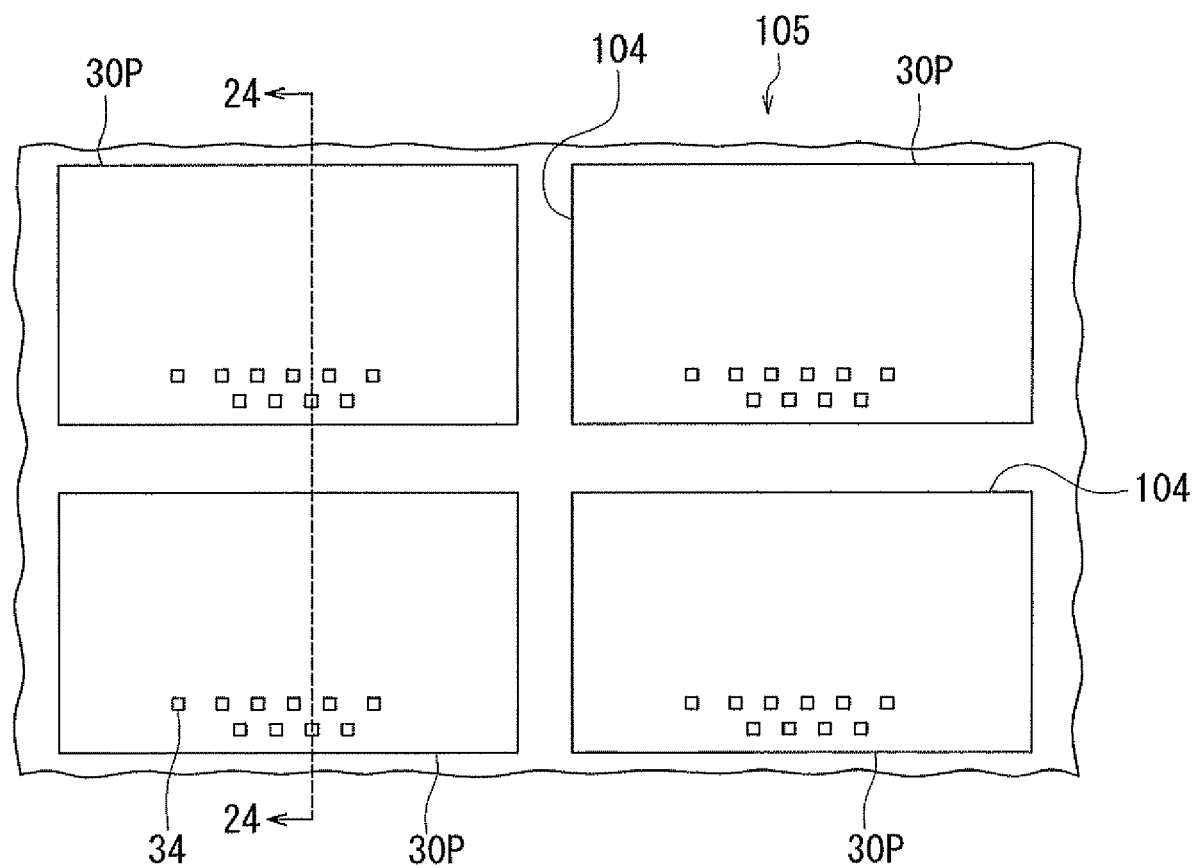
FIG. 23 is a plan view showing a step that follows the step shown in FIG. 21.
Figure 24:
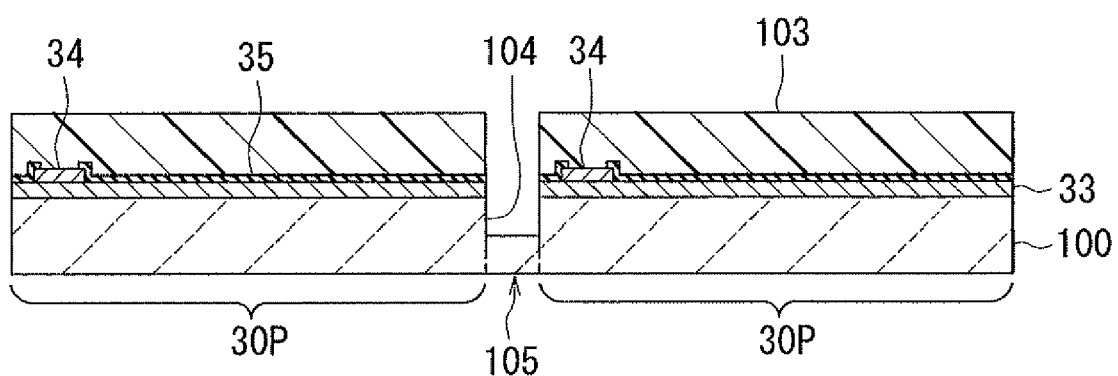
FIG. 24 shows a cross section taken along line 24-24 of FIG. 23.

FIG. 23 is a plan view showing a step that follows the step shown in FIG. 21. FIG. 24 shows a cross section taken along line 24-24 of FIG. 23. In this step, a protection layer 103 is initially formed to cover the first surface 101a of the pre-substructure wafer 101. The protection layer 103 is formed of a photoresist, for example. Next, a plurality of grooves 104 that open in the first surface 101a of the pre-substructure wafer 101 are formed in the pre-substructure wafer 101 so as to define the respective areas of the plurality of pre-semiconductor-chip portions 30P. Note that the protection layer 103 is omitted in FIG. 23.

In the positions of the boundaries between every two adjacent pre-semiconductor-chip portions 30P, the grooves 104 are formed to pass through the boundaries between every two adjacent pre-semiconductor-chip portions 30P. The grooves 104 are formed such that their bottoms do not reach the second surface 101b of the pre-substructure wafer 101. The grooves 104 have a width in the range of 50 to 150 µm, for example. The grooves 104 have a depth in the range of 20 to 80 µm, for example.

The grooves 104 may be formed using a dicing saw or by performing etching, for example. The etching may be reactive ion etching or anisotropic wet etching using KOH as the etching solution, for example. When forming the grooves 104 by etching, the protection layer 103 made of photoresist may be patterned by photolithography to form the etching mask. The protection layer 103 is removed after the formation of the grooves 104. A pre-polishing substructure main body 105 is thus formed by the pre-substructure wafer 101 with the plurality of grooves 104 formed therein.

Figure 25:
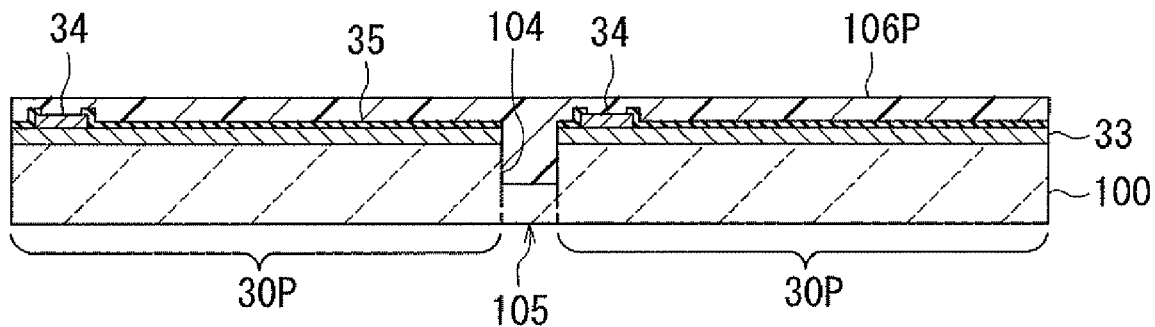
FIG. 25 is a cross-sectional view showing a step that follows the step shown in FIG. 24.

FIG. 25 shows a step that follows the step shown in FIG. 24. In this step, an insulating film 106P is formed to fill the plurality of grooves 104 of the pre-polishing substructure main body 105 and to cover the plurality of electrode pads 34 and the passivation film 35. The insulating film 106P is to become a part of the insulating portion 31 later. The insulating film 106P may be formed of a resin such as an epoxy resin or a polyimide resin. The insulating film 106P may also be formed of a photosensitive material such as a sensitizer-containing polyimide resin. The insulating film 106P may also be formed of an inorganic material such as silicon oxide or silicon nitride.

The insulating film 106P is preferably formed of a resin having a low thermal expansion coefficient. If the insulating film 106P is formed of a resin having a low thermal expansion coefficient, it becomes easy to cut the insulating film 106P when it is cut later with a dicing saw.

The insulating film 106P is preferably transparent. If the insulating film 106P is transparent, alignment marks that are recognizable through the insulating film 106P can be formed on the insulating film 106P. Such alignment marks facilitates alignment of a plurality of substructures to be stacked.

The insulating film 106P may include a first layer that fills the plurality of grooves 104 and a second layer that covers the first layer, the plurality of electrode pads 34 and the passivation film 35. In such a case, the first layer and the second layer may be formed of the same material or different materials. The first layer is preferably formed of a resin having a low thermal expansion coefficient. The second layer may be formed of a photosensitive material such as a sensitizer-containing polyimide resin. The first layer may be flattened at the top by, for example, ashing or chemical mechanical polishing (CMP), before forming the second layer on the first layer.

If the passivation film 35 is not formed by the time of performing the wafer sort test, the second layer of the insulating film 106P may be used as the passivation film. In such a case, the second layer may be formed of an inorganic material such as silicon oxide or silicon nitride. If the second layer of the insulating film 106P is to be used as the passivation film, the plurality of openings for exposing the top surfaces of the plurality of electrode pads 34 are not formed in the second layer as initially formed.

Figure 26:
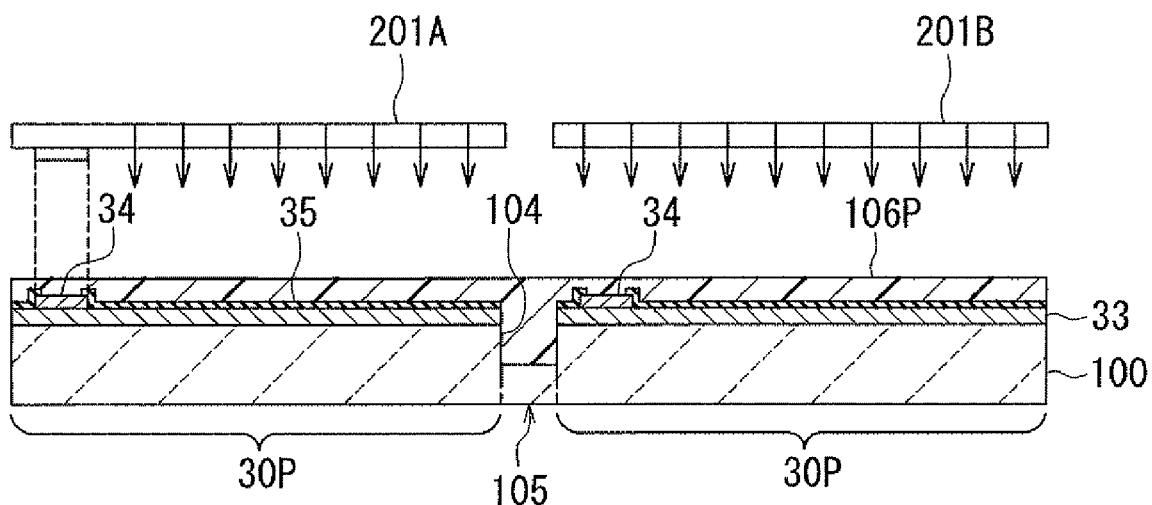
FIG. 26 is a cross-sectional view showing a step that follows the step shown in FIG. 25.
Figure 27:
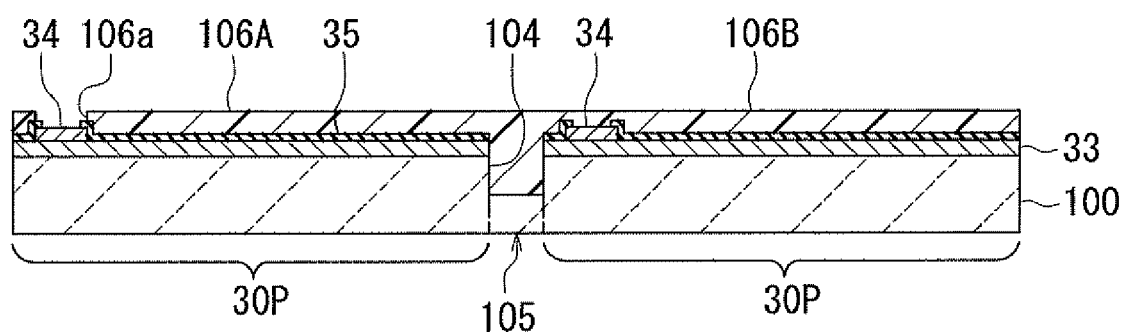
FIG. 27 is a cross-sectional view showing a step that follows the step shown in FIG. 26.

Reference is now made to FIG. 26 and FIG. 27 to describe the step of forming the plurality of openings for exposing the plurality of electrode pads 34 in the insulating film 106P in the normally-functioning pre-semiconductor-chip portions 30P. FIG. 26 shows a step that follows the step shown in FIG. 25. FIG. 27 shows a step that follows the step shown in FIG. 26.

Here, a description will initially be given of a case where the entire insulating film 106P or the second layer of the insulating film 106P is formed of a negative photosensitive material and the openings are formed in the insulating film 106P by photolithography. In this case, all the pre-semiconductor-chip portions 30P are simultaneously subjected to the exposure of the insulating film 106P by using a mask 201A shown in FIG. 26. The mask 201A has such a pattern that the areas of the insulating film 106P where to form the openings are not irradiated with light while the other areas are irradiated with light. The non-irradiated areas of the insulating film 106P are soluble in a developing solution, and the irradiated areas become insoluble in the developing solution.

Next, using a stepping projection exposure apparatus, or a so-called stepper, the insulating film 106P is selectively exposed in the malfunctioning pre-semiconductor-chip portions 30P only, using a mask 201B shown in FIG. 26. This exposure process uses the location information on the normally functioning pre-semiconductor-chip portions 30P and the malfunctioning pre-semiconductor-chip portions 30P in each pre-substructure wafer 101 which was obtained by the wafer sort test. In FIG. 26, the pre-semiconductor-chip portion 30P on the left is a normally functioning one, whereas the pre-semiconductor-chip portion 30P on the right is a malfunctioning one. The mask 201B entirely transmits light. As a result of this exposure process, the entire insulating film 106P in the malfunctioning pre-semiconductor-chip portions 30P becomes insoluble in the developing solution.

Next, the insulating film 106P is developed with the developing solution. As a result, as shown in FIG. 27, a plurality of openings 106a for exposing the plurality of electrode pads 34 are formed in the insulating film 106P in the normally functioning pre-semiconductor chip portion 30P (the left side). On the other hand, no openings 106P are formed in the insulating film 106P in the malfunctioning pre-semiconductor chip portion 30P (the right side). After the development, the area of the insulating film 106P corresponding to the normally functioning pre-semiconductor chip portion 30P becomes a first-type insulating layer 106A, and the area corresponding to the malfunctioning pre-semiconductor chip portion 30P becomes a second-type insulating layer 106B. The first-type insulating layer 106A has the plurality of openings 106a for exposing the plurality of electrode pads 34, and is disposed around the plurality of electrode pads 34. The second-type insulating layer 106B covers the plurality of electrode pads 34 so as to avoid exposure.

Now, an example of the method for forming the plurality of openings 106a in the insulating film 106P will be described for the case where the entire insulating film 106P or the second layer of the insulating film 106P is formed of a non-photosensitive material. In the example, a negative photoresist layer is initially formed on the insulating film 106P. The photoresist layer is then exposed and developed by the same method as with the exposure and development of the foregoing insulating film 106P. Consequently, in the normally functioning pre-semiconductor-chip portions 30P, a plurality of openings are formed in the photoresist layer at positions corresponding to the plurality of electrode pads 34. Meanwhile, no opening is formed in the photoresist layer in the malfunctioning pre-semiconductor-chip portions 30P. Next, the insulating film 106P is selectively etched by using the photoresist layer as the etching mask, whereby the plurality of openings 106a are formed in the insulating film 106P. The photoresist layer may be subsequently removed, or may be left and used as part of the insulating layers 106A and 106B.

Figure 28:
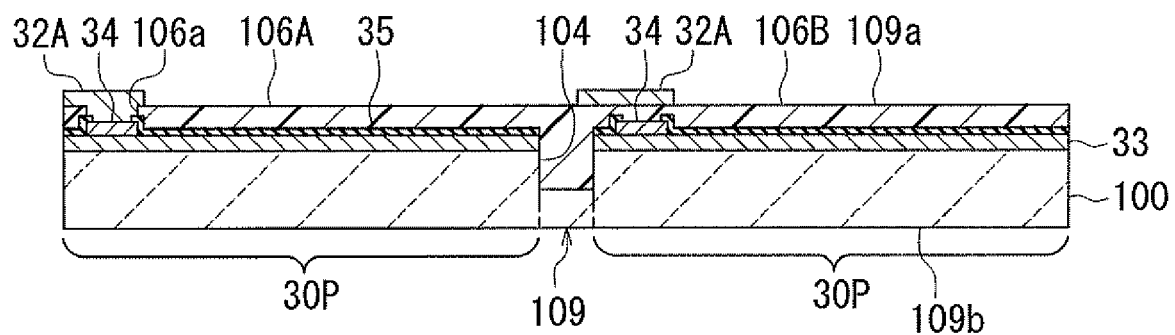
FIG. 28 is a cross-sectional view showing a step that follows the step shown in FIG. 27.
Figure 29:
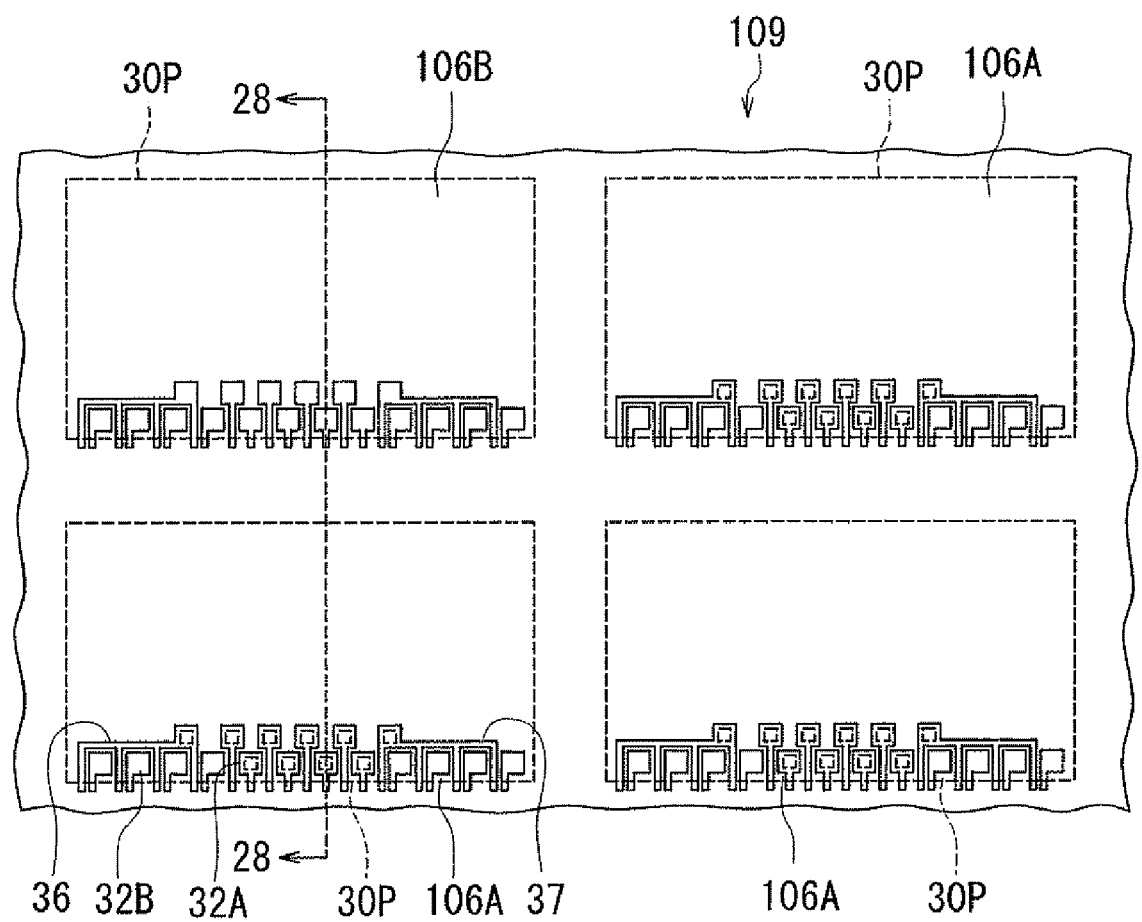
FIG. 29 is a plan view showing the step of FIG. 28.

FIG. 28 and FIG. 29 show a step that follows the step shown in FIG. 27. In this step, the electrodes 32A, 32B, 36, and 37 are formed on the insulating layers 106A and 106B by plating, for example. Note that the electrodes 32B, 36, and 37 are not shown in FIG. 28. In the present embodiment, the electrodes 32A, 36, and 37 are formed so that the electrodes 32A, 36, and 37 are in contact with and electrically connected to the normally functioning pre-semiconductor chip portions 30P while the electrodes 32A, 36, and 37 are not in contact with the malfunctioning pre-semiconductor chip portions 30P.

More specifically, in the normally functioning pre-semiconductor chip portions 30P, the electrodes 32A, 36, and 37 are in contact with and electrically connected to the respective corresponding electrode pads 34 through the plurality of openings 106a of the insulating layer 106A. In the malfunctioning pre-semiconductor-chip portions 30P, on the other hand, the electrodes 32A, 36, and 37 are not in contact with and not electrically connected to any corresponding electrode pads 34 since no openings 106a are formed in the insulating layer 106B.

Since there is no electrode pads 34 corresponding to the plurality of electrodes 32B, the plurality of electrodes 32B are not in contact with any of the pre-semiconductor-chip portions 30P regardless of whether the pre-semiconductor-chip portions 30P are normally functioning ones or malfunctioning ones. In this way, there is fabricated a pre-polishing substructure 109 shown in FIG. 28 and FIG. 29. The pre-polishing substructure 109 has a first surface 109a corresponding to the first surface 101a of the pre-substructure wafer 101, and a second surface 109b corresponding to the second surface 101b of the pre-substructure wafer 101.

The electrodes 32A, 32B, 36, and 37 are each formed of a conductive material such as Cu. In the case of forming the electrodes 32A, 32B, 36, and 37 by plating, a seed layer for plating is initially formed. Next, a photoresist layer is formed on the seed layer. The photoresist layer is then patterned by photolithography to form a frame that has a plurality of openings in which the electrodes 32A, 32B, 36, and 37 are to be accommodated later. Next, plating layers that are intended to constitute respective portions of the electrodes 32A, 32B, 36, and 37 are formed by plating on the seed layer in the openings of the frame. The plating layers have a thickness in the range of 5 to 15 µm, for example. Next, the frame is removed, and portions of the seed layer other than those lying under the plating layers are also removed by etching. The plating layers and the remaining portions of the seed layer under the plating layers thus form the electrodes 32A, 32B, 36, and 37.

Figure 30:
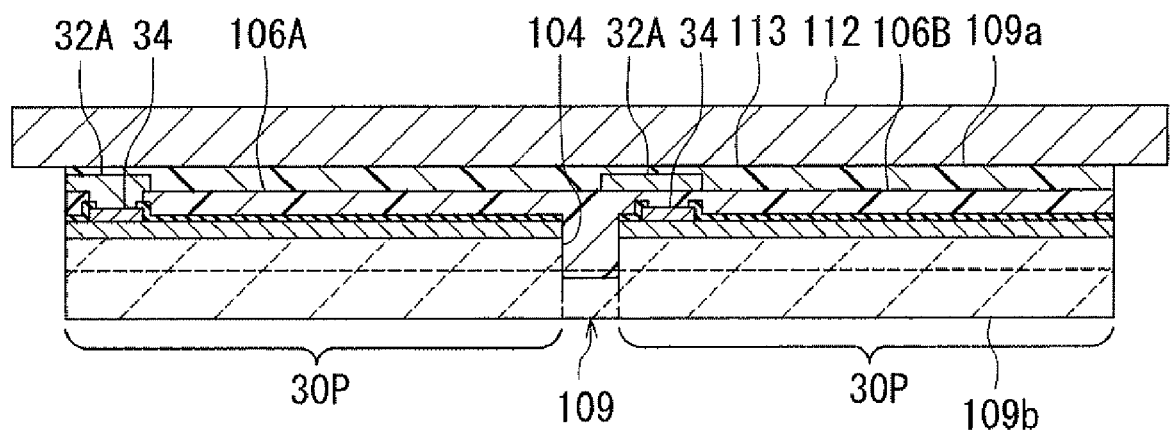
FIG. 30 is a cross-sectional view showing a step that follows the step shown in FIG. 28.

FIG. 30 shows a step that follows the step shown in FIG. 28. In this step, using an insulating adhesive, the pre-polishing substructure 109 is bonded to a plate-shaped jig 112 shown in FIG. 30, with the first surface 109a of the pre-polishing substructure 109 arranged to face a surface of the jig 112. The pre-polishing substructure 109 bonded to the jig 112 will hereinafter be referred to as a first pre-polishing substructure 109. In FIG. 30, the reference numeral 113 indicates an insulating layer formed by the adhesive.

Figure 31:
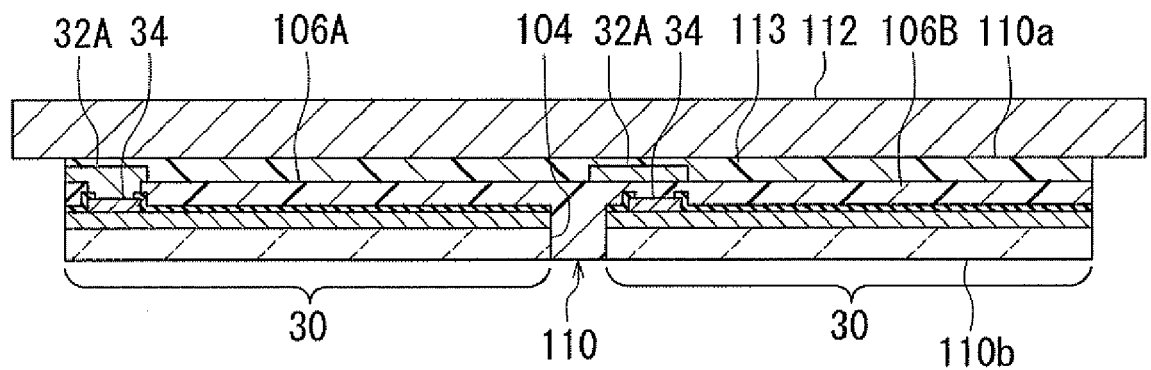
FIG. 31 is a cross-sectional view showing a step that follows the step shown in FIG. 30.

FIG. 31 shows a step that follows the step shown in FIG. 30. In this step, the second surface 109b of the first pre-polishing substructure 109 is polished. This polishing is performed until the plurality of grooves 104 are exposed. The broken line in FIG. 30 indicates the level of the second surface 109b after the polishing. By polishing the second surface 109b of the first pre-polishing substructure 109, the first pre-polishing substructure 109 is thinned. Consequently, there is formed a substructure 110 in the state of being bonded to the jig 112. The substructure 110 has a thickness of 20 to 80 µm, for example. Hereinafter, the substructure 110 bonded to the jig 112 will be referred to as a first substructure 110. The first substructure 110 has a first surface 110a corresponding to the first surface 109a of the first pre-polishing substructure 109, and a second surface 110b opposite to the first surface 110a. The second surface 110b is the polished surface. By polishing the second surface 109b of the first pre-polishing substructure 109 until the plurality of grooves 104 are exposed, the plurality of pre-semiconductor-chip portions 30P are separated from each other into individual semiconductor chips 30.

Figure 32:
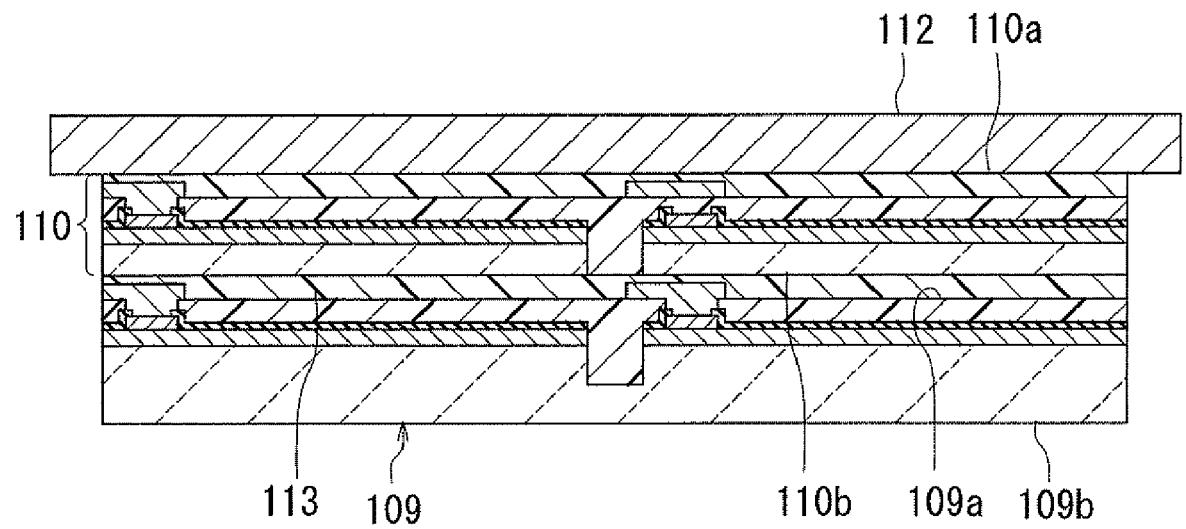
FIG. 32 is a cross-sectional view showing a step that follows the step shown in FIG. 31.

FIG. 32 shows a step that follows the step shown in FIG. 31. In this step, using an insulating adhesive, a pre-polishing substructure 109 is initially bonded to the first substructure 110 bonded to the jig 112. The pre-polishing substructure 109 is bonded to the first substructure 110 with the first surface 109a arranged to face the polished surface, i.e., the second surface 110*b*, of the first substructure 110. Hereinafter, the pre-polishing substructure 109 to be bonded to the first substructure 110 will be referred to as a second pre-polishing substructure 109. The insulating layer 113 formed by the adhesive between the first substructure 110 and the second pre-polishing substructure 109 covers the electrodes 32A, 32B, 36, and 37 of the second pre-polishing substructure 109, and is to become part of the insulating portion 31 later.

Next, although not shown, the second surface 109*b* of the second pre-polishing substructure 109 is polished. This polishing is performed until the plurality of grooves 104 are exposed. By polishing the second surface 109*b* of the second pre-polishing substructure 109, the second pre-polishing substructure 109 is thinned. Consequently, there is formed a second substructure 110 in the state of being bonded to the first substructure 110. The second substructure 110 has a thickness of, for example, 20 to 80 μm, as does the first substructure 110.

Figure 33:
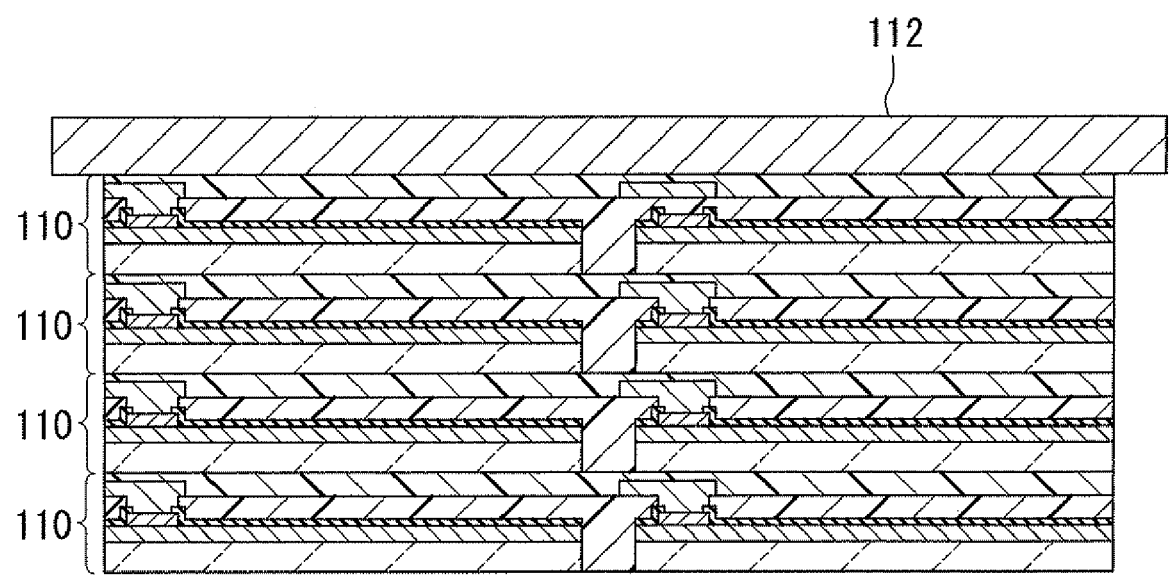
FIG. 33 is a cross-sectional view showing a step that follows the step shown in FIG. 32.

The same step as shown in FIG. 32 may subsequently be repeated to form three or more substructures 110 into a stack. FIG. 33 shows the case where four substructures 110 are formed into a stack.

Figure 34:
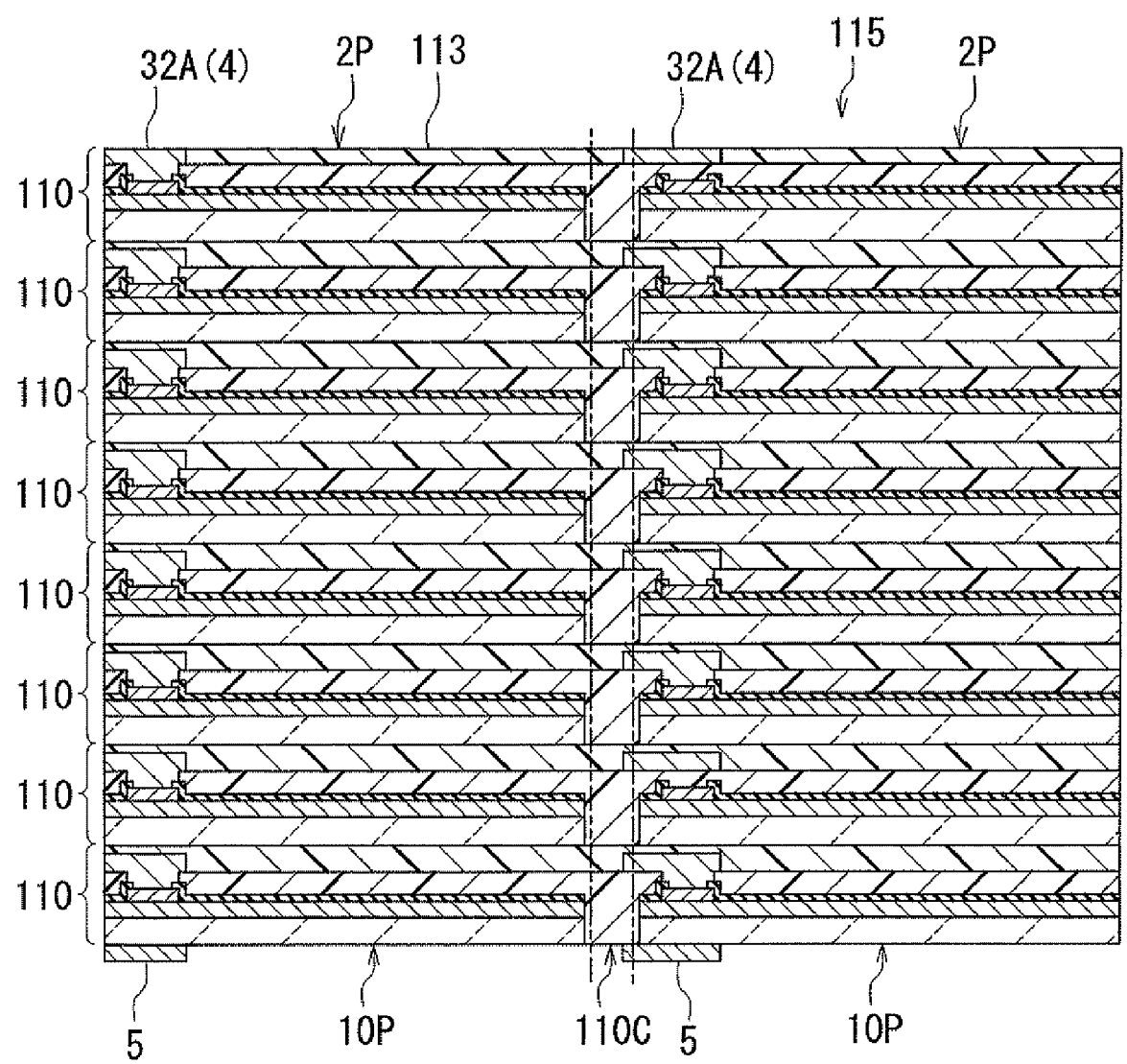
FIG. 34 is a cross-sectional view showing a part of a first layered substructure fabricated in a step that follows the step shown in FIG. 33.

FIG. 34 shows a step that follows the step shown in FIG. 33. After the same step as shown in FIG. 32 is repeated to form a predetermined number of substructures 110 into a stack, the stack of the predetermined number of substructures 110 is released from the jig 112. FIG. 34 shows an example where a stack of eight substructures 110 is formed.

Next, as shown in FIG. 34, the electrodes 32A, 32B, 36, and 37 of the uppermost substructure 110 of the stack are exposed by removing part of the insulating layer 113 from the uppermost substructure 110 by etching or polishing. The plurality of first terminals 4 are formed by using the electrodes 32A and 32B thus exposed.

The plurality of second terminals 5 are formed on the bottom surface of the lowermost substructure 110 of the stack. The terminals 5 are formed of a conductive material such as Cu or Au. The terminals 5 are formed by the same method as for the electrodes 32A, 32B, 36, and 37, i.e., by plating.

At least either the terminals 4 or the terminals 5 may each include a solder layer made of a solder material, the solder layer being exposed in the surface of each of the terminals 4 or each of the terminals 5. An example of the solder material is AuSn. The solder layer has a thickness in the range of 1 to 2 μM, for example. If the terminals 4 are to include the solder layer, the solder layer is formed on the surface of each of the electrodes 32A and 32B of the uppermost substructure 110 directly or via an underlayer. The solder layer is formed by plating, for example. If the terminals 5 are to include the solder layer, a conductor layer that is to become portions of the terminals 5 is formed on the bottom surface of the lowermost substructure 110 of the stack, using a conductive material such as Cu or Au. The solder layer is then formed on the surface of the conductor layer directly or via an underlayer by plating, for example.

AuSn is highly adhesive to Au. When either the terminals 4 or the terminals 5 each include a solder layer made of AuSn, it is preferred that the other of the terminals 4 and 5 each include an Au layer that is exposed in the surface of each of the terminals 4 or 5. The Au layer is formed by plating or sputtering, for example. The melting point of AuSn varies according to the ratio between Au and Sn. For example, if the ratio between Au and Sn is 1:9 by weight, AuSn has a melting point of 217° C. If the ratio between Au and Sn is 8:2 by weight, AuSn has a melting point of 282° C.

Consequently, there is formed a first layered substructure 115 including a plurality of substructures 110 stacked. Each of the substructures 110 includes an array of a plurality of preliminary layer portions 10P. Each of the preliminary layer portions 10P is to become any one of the layer portions 10 included in the main part 2M of the main body 2. The substructures 110 are to be cut later in the positions of the boundaries between every adjacent preliminary layer portions 10P. In FIG. 34, the reference symbol 110C indicates the cutting positions in the substructures 110. The first layered substructure 115 includes an array of a plurality of pre-separation main bodies 2P that are to be separated from each other into individual main bodies 2 later. In the example shown in FIG. 34, each of the pre-separation main bodies 2P includes eight preliminary layer portions 10P.

Now, the process for forming a plurality of layered chip packages 1 by using the first layered substructure 115 will be described in detail with reference to FIG. 35 to FIG. 45. The following will describe an example where the first layered substructure 115 of FIG. 34, which includes eight substructures 110 stacked, is used to form a plurality of layered chip packages 1 each including eight layer portions 10.

Figure 35:
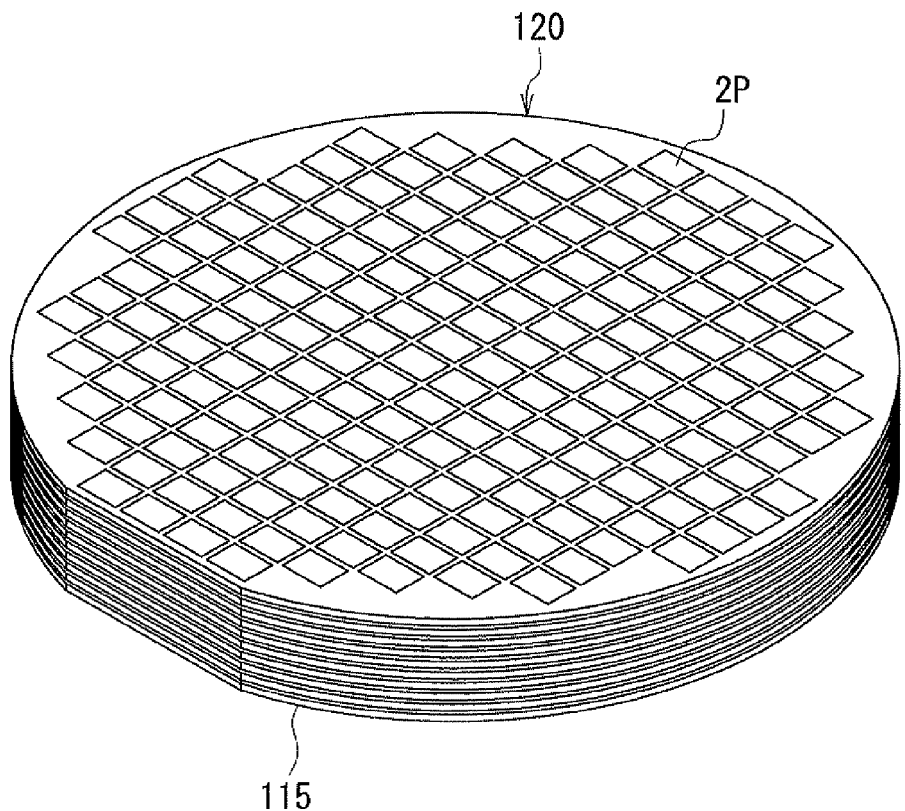
FIG. 35 is a perspective view showing a second layered substructure fabricated in a step that follows the step shown in FIG. 34.
Figure 36:
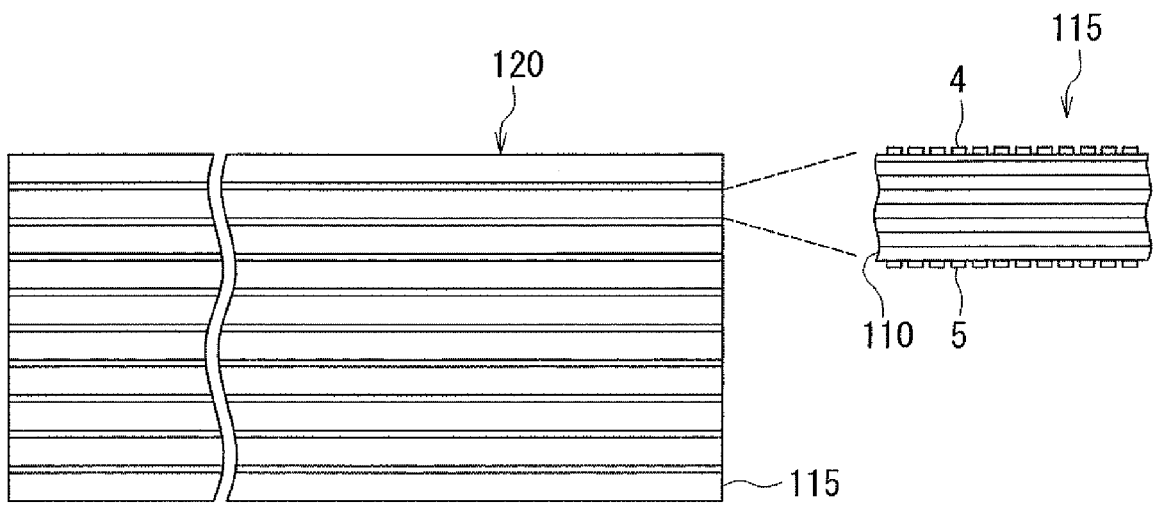
FIG. 36 is a side view of the second layered substructure shown in FIG. 35.

FIG. 35 and FIG. 36 show a step that follows the step shown in FIG. 34. In this step, a plurality of first layered substructures 115 are stacked and every two vertically adjacent first layered substructures 115 are bonded to each other, whereby a second layered substructure 120 is fabricated. FIG. 35 and FIG. 36 show an example where ten first layered substructures 115 are stacked to fabricate the second layered substructure 120. Every two vertically adjacent first layered substructures 115 are bonded to each other with an adhesive so as to be easily detachable. In this example, as shown in FIG. 36, the second layered substructure 120 includes ten first layered substructures 115 stacked, each of the first layered substructures 115 including eight substructures 110 stacked. That is, the second layered substructure 120 includes 80 substructures 110 stacked. Suppose that each individual substructure 110 has a thickness of 50 μm. Ignoring the thickness of the adhesive that bonds every two vertically adjacent substructures 110 to each other and the thickness of the adhesive that bonds every two vertically adjacent first layered substructures 115 to each other, the second layered substructure 120 has a thickness of 50 μm×80, i.e., 4 mm.

Figure 37:
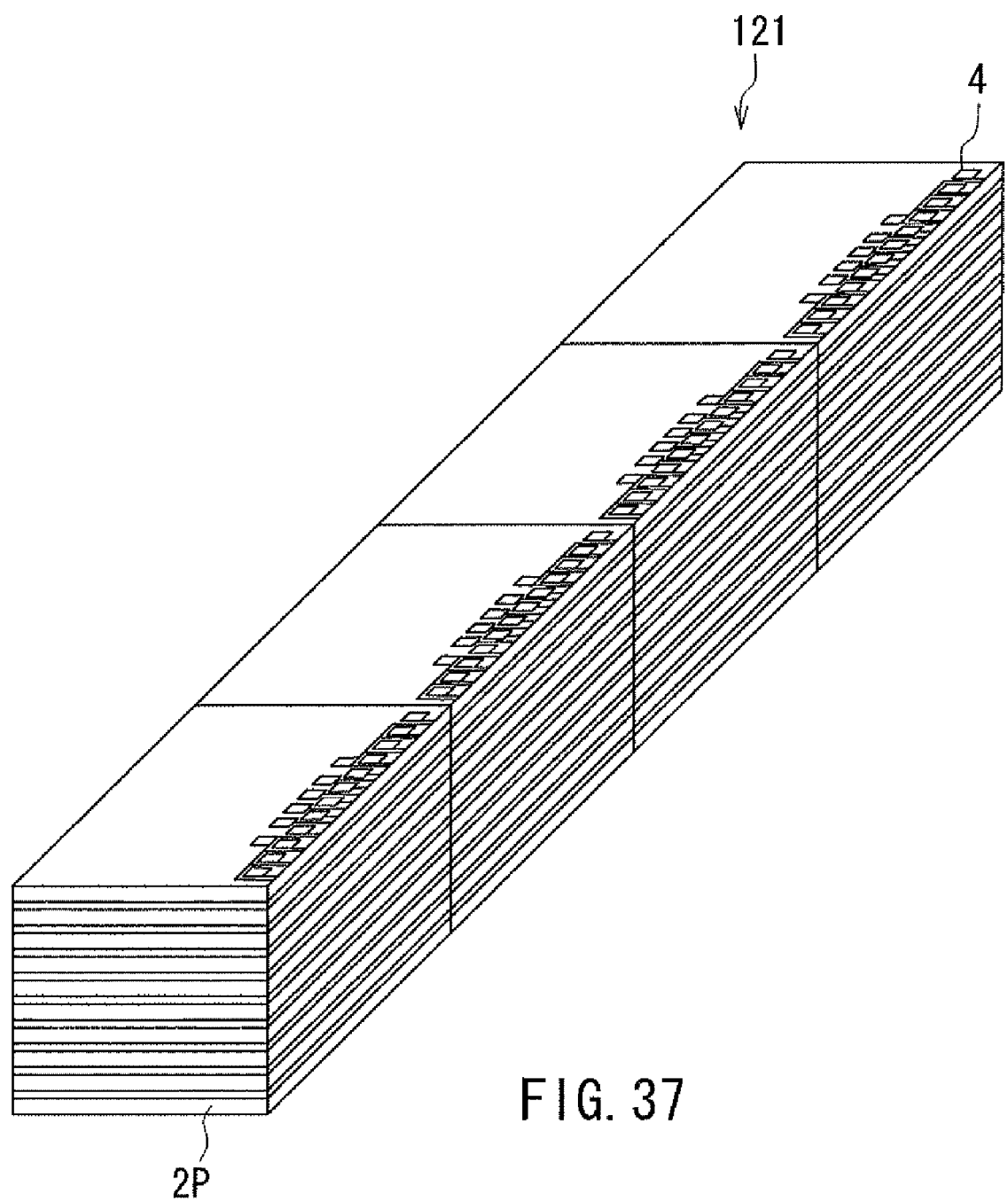
FIG. 37 is a perspective view showing an example of a block obtained by cutting the second layered substructure.

FIG. 37 shows a step that follows the step shown in FIG. 35 and FIG. 36. In this step, the second layered substructure 120 is cut into at least one block 121 in which a plurality of pre-separation main bodies 2P are arranged both in the direction of stacking of the first layered substructures 115 and in a direction orthogonal thereto. FIG. 37 shows an example of the block 121. In the block 121 shown in FIG. 37, ten pre-separation main bodies 2P are arranged in the direction of stacking of the first layered substructures 115, and four are arranged in the direction orthogonal to the direction of stacking of the first layered substructures 115. In this example, the block 121 includes 40 pre-separation main bodies 2P.

Figure 38:
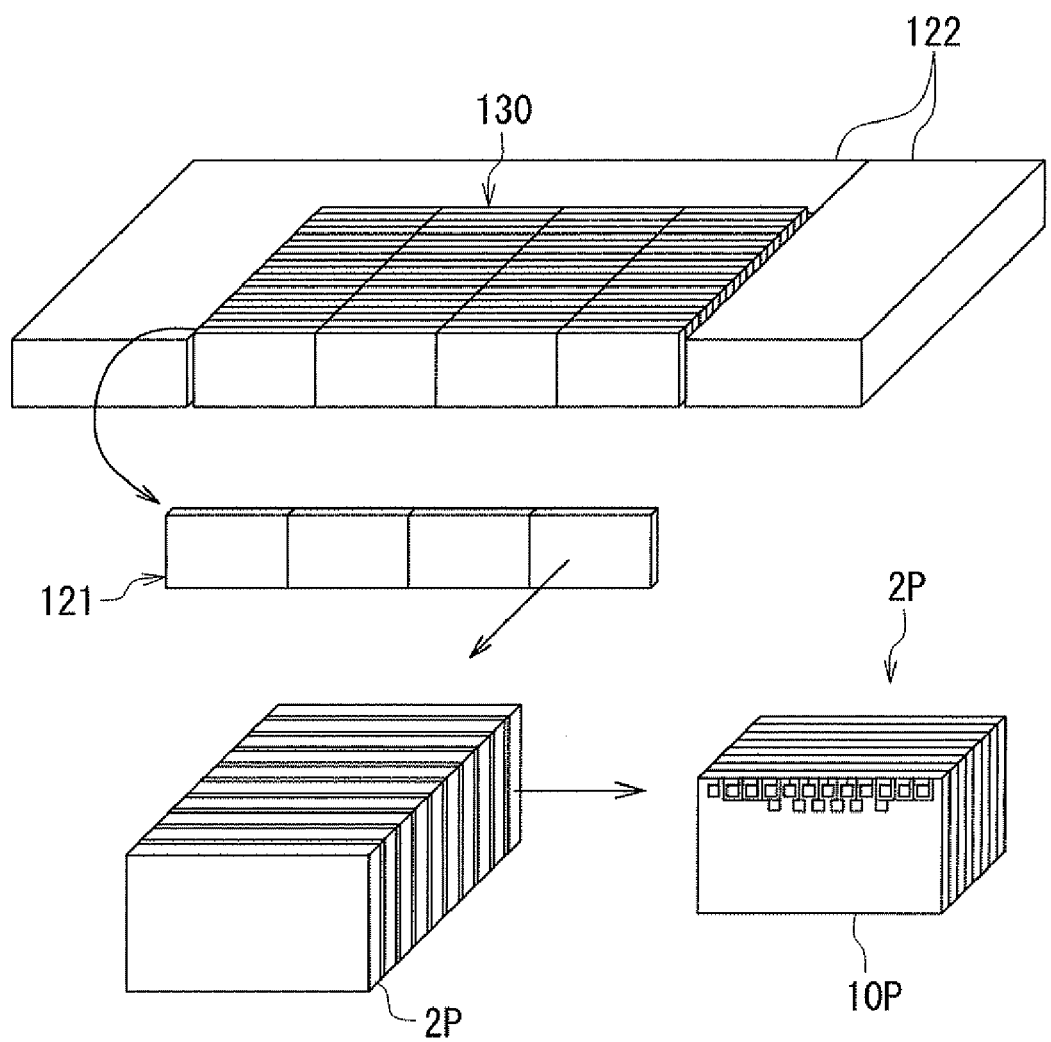
FIG. 38 is an explanatory diagram showing a step that follows the step shown in FIG. 37.

FIG. 38 shows a step that follows the step shown in FIG. 37. In this step, a plurality of jigs 122 are used to arrange two or more blocks 121 to form a block assembly 130. The plurality of jigs 122 are combined to form a frame for surrounding the block assembly 130. FIG. 38 shows an example where 19 blocks 121 shown in FIG. 37 are arranged to form the block assembly 130. In this example, the block assembly 130 includes 19 blocks 121, each of the blocks 121 includes 40 pre-separation main bodies 2P, and each of the pre-separation main bodies 2P includes 8 preliminary layer portions 10P. That is, the block assembly 130 includes 19×40, i.e., 760 pre-separation main bodies 2P, and 19×40×8, i.e., 6080 preliminary layer portions 10P. All the pre-separation main bodies 2P included in the block assembly 130 are arranged so that their respective surfaces on which the wiring 3 is to be formed later face toward the same direction, i.e., upward.

Figure 39:
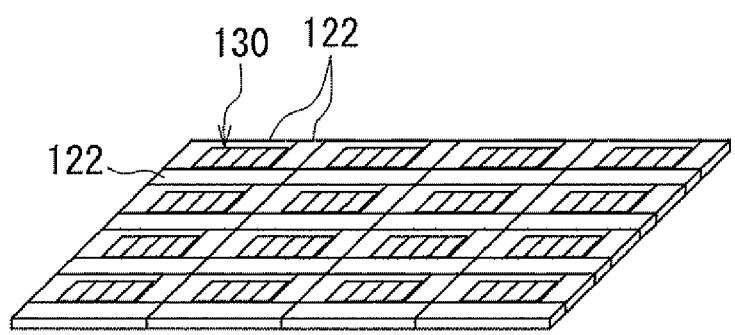
FIG. 39 is a perspective view showing a plurality of block assemblies that are arranged in a step that follows the step shown in FIG. 38.

FIG. 39 shows a step that follows the step shown in FIG. 38. In this step, a plurality of block assemblies 130 are arranged in one plane by using a plurality of jigs 122. Here, all the pre-separation main bodies 2P included in the plurality of block assemblies 130 are arranged so that their respective surfaces on which the wiring 3 is to be formed later face toward the same direction, i.e., upward. FIG. 39 shows an example where 16 block assemblies 130 are arranged in one plane. In such a case, the 16 block assemblies 130 include 760×16, i.e., 12160 pre-separation main bodies 2P, and 6080× 16, i.e., 97280 preliminary layer portions 10P.

In the present embodiment, the wiring 3 is then simultaneously formed on all the pre-separation main bodies 2P that are included in the plurality of block assemblies 130 arranged as shown in FIG. 39. The step of forming the wiring 3 will be described with reference to FIG. 40 to FIG. 44.

Figure 40:
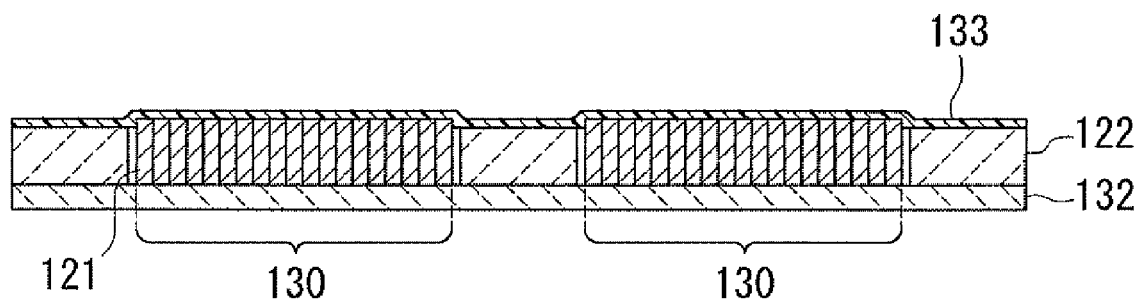
FIG. 40 is a cross-sectional view showing a step of the process for forming the wiring in the first embodiment of the invention.

In the step of forming the wiring 3, as shown in FIG. 40, the plurality of jigs 122 and the plurality of block assemblies 130 shown in FIG. 39 are placed on a flat top surface of a jig 132. The plurality of block assemblies 130 are thereby arranged in one plane. In such a state, the top surfaces of the jigs 122 are located at a level slightly lower than that of the top surfaces of the block assemblies 130.

In the step of forming the wiring 3, a resin layer 133 is then formed to cover the top surfaces of the jigs 122 and the top surfaces of the block assemblies 130. The resin layer 133 may be formed by applying an uncured resin and then curing the resin, or by using a dry film.

Figure 41:
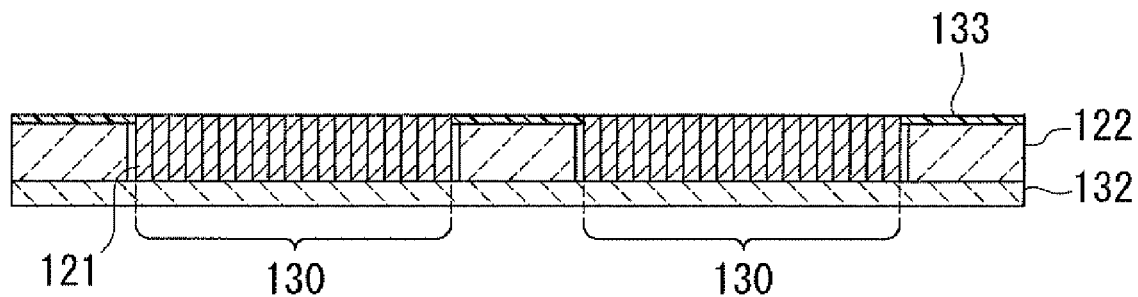
FIG. 41 is a cross-sectional view showing a step that follows the step shown in FIG. 40.

FIG. 41 shows a step that follows the step shown in FIG. 40. In this step, the resin layer 133 is polished by, for example, CMP, until the top surfaces of the plurality of block assemblies 130 are exposed. The top surfaces of the plurality of block assemblies 130 and the top surface of the resin layer 133 are thereby made even with each other.

Figure 42:
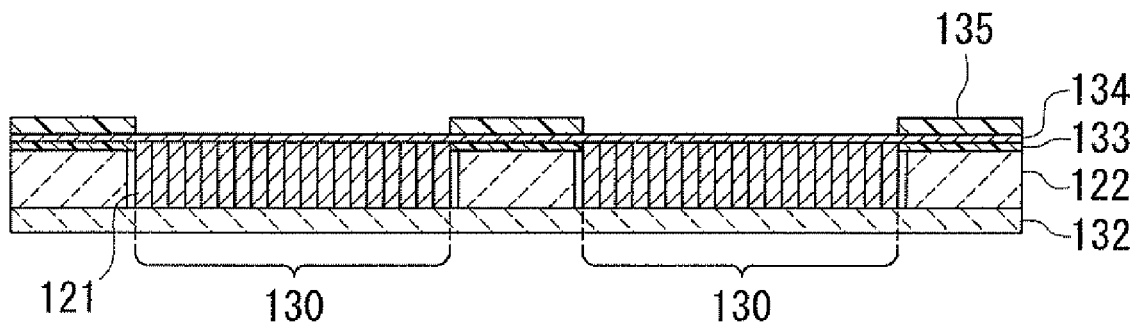
FIG. 42 is a cross-sectional view showing a step that follows the step shown in FIG. 41.

FIG. 42 shows a step that follows the step shown in FIG. 41. In this step, a seed layer 134 for plating is initially formed over the top surfaces of the plurality of block assemblies 130 and the resin layer 133. Next, a photoresist layer is formed on the seed layer 134. The photoresist layer is then patterned by photolithography to form a frame 135. The frame 135 has a plurality of openings in which a plurality of units of wiring 3 corresponding to the plurality of pre-separation main bodies 2P are to be accommodated later. Although not shown in FIG. 42, the frame 135 includes a plurality of portions located above the respective surfaces of all the pre-separation main bodies 2P included in the plurality of block assemblies 130 on which the wiring 3 is to be formed. These plurality of portions have the respective openings to accommodate the wiring 3 later.

Figure 43:
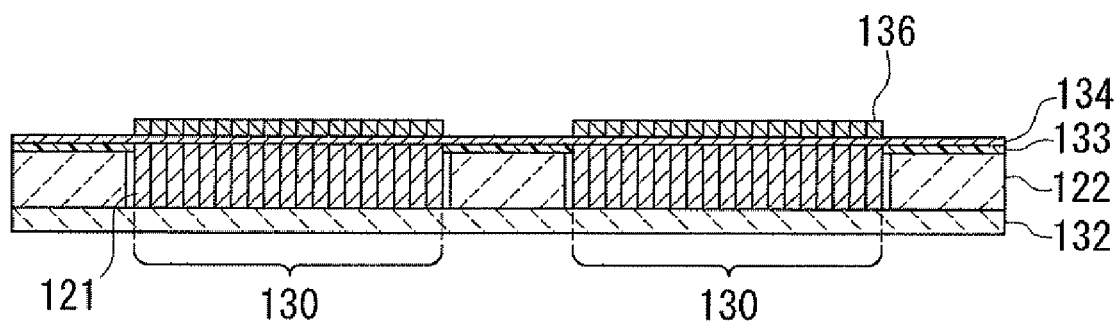
FIG. 43 is a cross-sectional view showing a step that follows the step shown in FIG. 42.

FIG. 43 shows a step that follows the step shown in FIG. 42. In this step, a plating layer 136 to constitute part of the wiring 3 is initially formed in each of the openings of the frame 135 by plating. Next, the frame 135 is removed. For the sake of convenience, FIG. 43 shows the plating layer 136 in a rectangular shape for each of the blocks 121. Actually, however, the plating layer 136 is formed in a shape corresponding to the wiring 3 for each of the pre-separation main bodies 2P.

Figure 44:
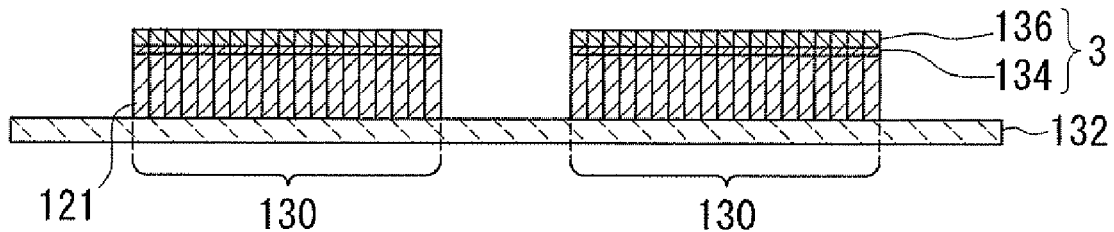
FIG. 44 is a cross-sectional view showing a step that follows the step shown in FIG. 43.

FIG. 44 shows a step that follows the step shown in FIG. 43. In this step, portions of the seed layer 134 other than those lying under the plating layers 136 are initially removed by etching. The plating layers 136 and the remaining portions of the seed layer 134 under the plating layers 136 thus form the wiring 3. The wiring 3 is formed on each of the pre-separation main bodies 2P. Next, the jigs 122 and the resin layer 133 remaining on the jigs 122 are removed.

If the wiring 3 (the plurality of wires W) is to be disposed on one of the side surfaces of the main body 2 as shown in FIG. 1, the process for forming the wiring 3 is completed by the steps shown in FIG. 40 to FIG. 44. If the wiring 3 (the plurality of wires W) is to be disposed on two mutually opposite side surfaces of the main body 2, the process shown in FIG. 40 to FIG. 44 can be repeated twice to form the wiring 3 (the plurality of wires W) on the two side surfaces.

Figure 45:
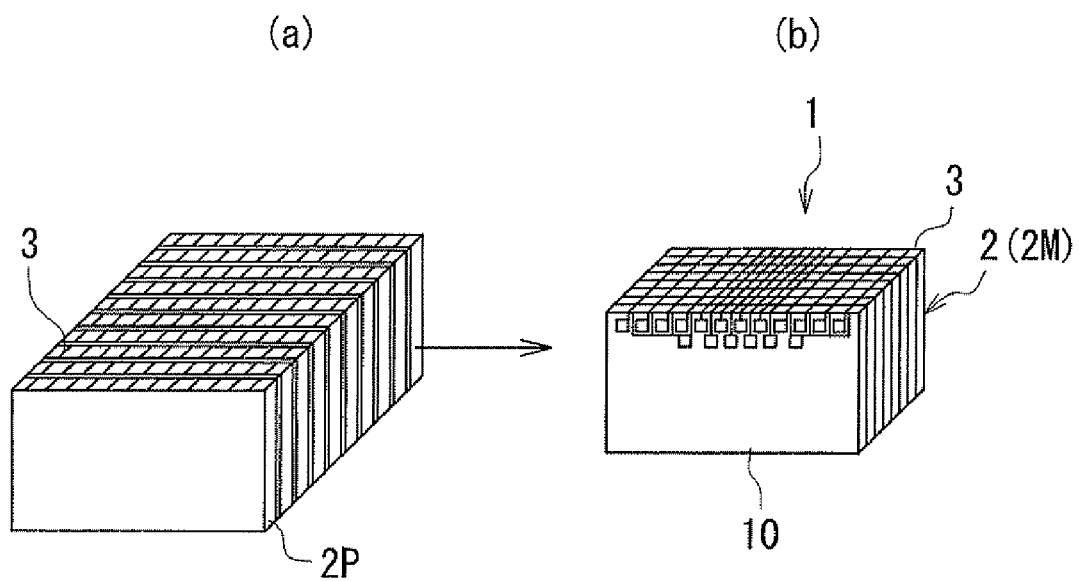
FIG. 45 is an explanatory diagram showing the step that follows the step shown in FIG. 43.

The process for forming a plurality of layered chip packages 1 then proceeds to the step of separating the plurality of pre-separation main bodies 2P from each other. Here, the pre-separation main bodies 2P each provided with the wiring 3 are separated from each other so that the plurality of layered chip packages 1 are formed. This step will be described with reference to FIG. 45. In the step, the block 121 is initially cut in the positions of the boundaries between every two pre-separation main bodies 2P that are adjacent to each other in the direction orthogonal to the direction of stacking of the pre-separation main bodies 2P. This produces a plurality of stacks shown in portion (a) of FIG. 45. Each of the stacks includes a plurality of pre-separation main bodies 2P stacked. In each of the stacks, every two adjacent pre-separation main bodies 2P are easily detachably bonded to each other by the adhesive that was used to bond every two vertically adjacent first layered substructures 115 when fabricating the second layered substructure 120 in the step shown in FIG. 35 and FIG. 36. Next, the plurality of pre-separation main bodies 2P included in the stack shown in portion (a) of FIG. 45 are separated from each other. This makes the pre-separation main bodies 2P into main bodies 2, whereby a plurality of layered chip packages 1, each of which includes the main body 2 and the wiring 3, are formed. Portion (b) of FIG. 45 shows one of the layered chip packages 1.

A plurality of layered chip packages 1 are thus formed through the series of steps that have been described with reference to FIG. 20 to FIG. 45. So far the description has dealt with the case where a plurality of layered chip packages 1 each including eight layer portions 10 are formed by using the first layered substructure 115 that includes eight stacked substructures 110 shown in FIG. 34. In the present embodiment, however, the number of the substructures 110 to be included in the first layered substructure 115 can be changed to fabricate a plurality of types of layered chip packages 1 with different numbers of layer portions 10. Moreover, in the present embodiment, a structure composed of a single substructure 110 and a plurality of terminals 5 formed on its bottom surface may be fabricated instead of the first layered substructure 115, and such a structure may be used instead of the first layered substructure 115 to form a plurality of packages each of which includes only a single layer portion 10, through the series of steps described with reference to FIG. 35 to FIG. 45. It is thereby possible to form a plurality of additional portions 51 such as ones shown in FIG. 6 to FIG. 9.

Figure 46:
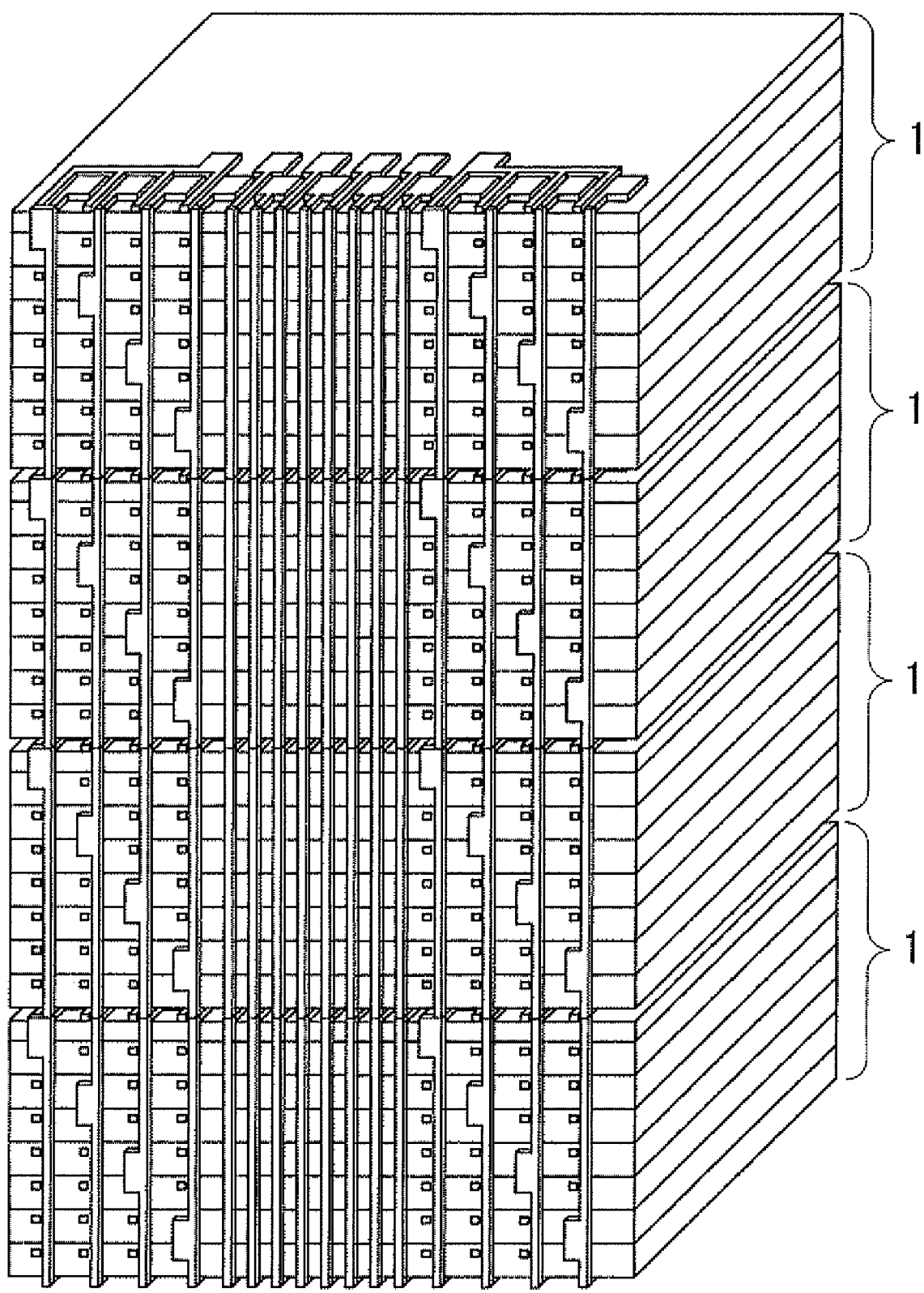
FIG. 46 is a perspective view showing four layered chip packages stacked.

The layered chip package 1 according to the present embodiment has the wiring 3 that includes the plurality of wires W disposed on at least one of the side surfaces of the main body 2. The main body 2 includes the plurality of first terminals 4 disposed on the top surface 2Ma of the main part 2M, and the plurality of second terminals 5 disposed on the bottom surface 2Mb of the main part 2M. Both the first terminals 4 and the second terminals 5 are electrically connected to the plurality of wires W. With the layered chip package 1 of such a configuration, it is possible to establish electrical connection between two or more layered chip packages 1 by stacking the two or more layered chip packages 1 on each other and electrically connecting the second terminals 5 of the upper one of two vertically adjacent layered chip packages 1 to the first terminals 4 of the lower one. FIG. 46 shows an example where four layered chip packages 1 are stacked on each other and are electrically connected to each other.

According to the present embodiment, a plurality of layered chip packages 1 can be mounted on a wiring board and electrical connection between the plurality of layered chip packages 1 can be established by using the wiring of the wiring board and the second terminals 5 of the plurality of layered chip packages 1. In such a case, the first terminals 4 of one of the layered chip packages 1 can be electrically connected to those of another one of the layered chip packages 1 by wire bonding, for example.

Figure 47:
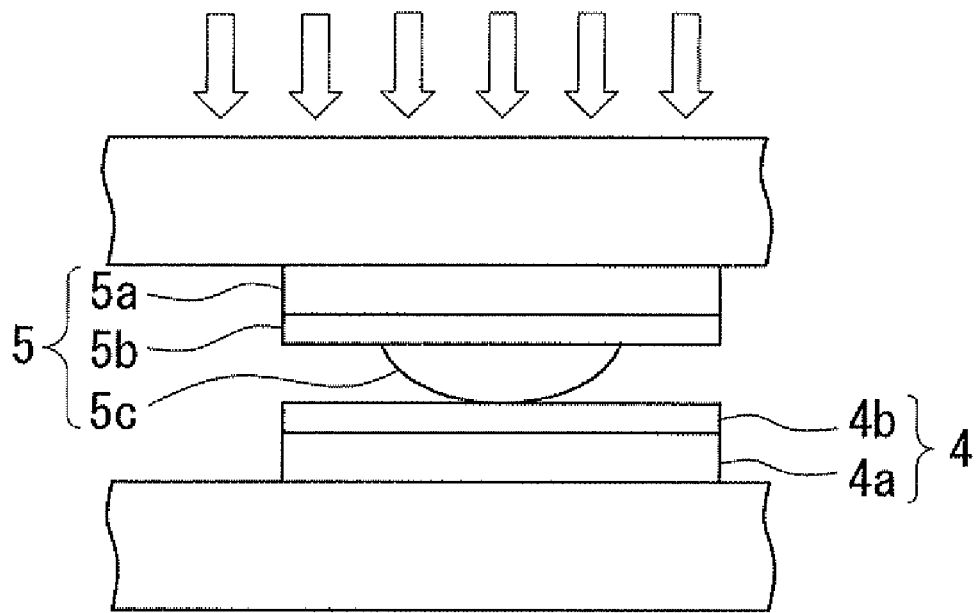
FIG. 47 is a side view showing connecting parts of the terminals of two vertically adjacent layered chip packages.
Figure 48:
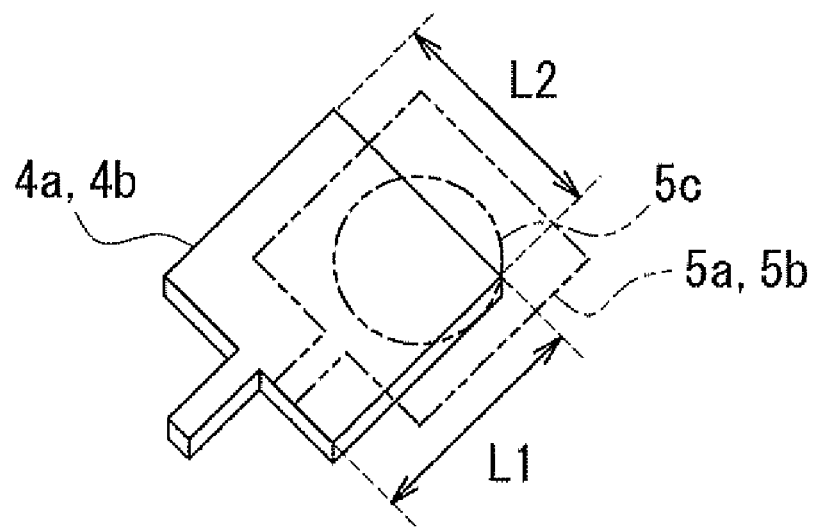
FIG. 48 is an explanatory diagram for explaining misalignment between the terminals of two vertically adjacent layered chip packages.

Moreover, the present embodiment facilitates the alignment between every two vertically adjacent layered chip packages 1 when stacking a plurality of layered chip packages 1. This advantageous effect will now be described with reference to FIG. 47 and FIG. 48. FIG. 47 is a side view showing connecting parts of the terminals of two vertically adjacent layered chip packages 1. FIG. 48 is an explanatory diagram for explaining misalignment between the terminals of two vertically adjacent layered chip packages 1.

In the example shown in FIG. 47 and FIG. 48, the terminal 4 includes a conductor pad 4a of rectangular shape and an Au layer 4b that is formed on the surface of the conductor pad 4a. The conductor pad 4a constitutes a part of the electrode 32, and is made of Cu, for example. The terminal 5 includes a conductor pad 5a of rectangular shape, an underlayer 5b formed on the surface of the conductor pad 5a, and a solder layer 5c formed on the surface of the underlayer 5b. For example, the conductor pad 5a is made of Cu, the underlayer 5b is made of Au, and the solder layer 5c is made of AuSn. Alternatively, contrary to this example, it is possible that the terminal 4 includes a conductor pad, an underlayer and a solder layer, while the terminal 5 includes a conductor pad and an Au layer. Both of the terminals 4 and 5 may include a solder layer. Here, the lengths of two orthogonal sides of the conductor pad 4a will be represented by L1 and L2. L1 and L2 are both 40 to 80 μm, for example. The conductor pad 5a has the same shape as that of the conductor pad 4a.

In the example shown in FIG. 47, the corresponding terminals 4 and 5 of the two vertically adjacent layered chip packages 1 are electrically connected in the following way. The Au layer 4b and the solder layer 5c of the corresponding terminals 4 and 5 are put into contact with each other. By applying heat and pressure, the solder layer 5c is melted, and then solidified to bond the terminals 4 and 5 to each other.

FIG. 48 shows a state where the terminals 4 and 5 are out of alignment. The state where the terminals 4 and 5 are out of alignment refers to the state where the edges of the conductor pad 4a and those of the conductor pad 5a do not coincide in position with each other when viewed in a direction perpendicular to the plane of the conductor pads 4a and 5a. In the present embodiment, the corresponding terminals 4 and 5 may be out of alignment as long as the terminals 4 and 5 can be bonded with a sufficiently small resistance at the interface between the terminals 4 and 5. Assuming that L1 and L2 are 30 to 60 μm, the maximum permissible misalignment between the terminals 4 and 5 is smaller than L1 and L2 yet several tens of micrometers.

According to the present embodiment, some misalignment between the terminals 4 and 5 is thus acceptable when stacking a plurality of layered chip packages 1. This facilitates the alignment between two vertically adjacent layered chip packages 1. Consequently, according to the present embodiment, it is possible to reduce the manufacturing cost of an electronic component that includes a plurality of layered chip packages 1 stacked.

For the same reason as with the stacking of a plurality of layered chip packages 1 as described above, the present embodiment facilitates alignment between the main package 1 and an additional portion 51 that are adjacent vertically or alignment between two vertically adjacent additional portions 51 when the main package 1 and one or more additional portions 51 are stacked to form a composite layered chip package. Consequently, according to the present embodiment, it is possible to reduce the manufacturing cost of the composite layered chip package.

Figure 49:
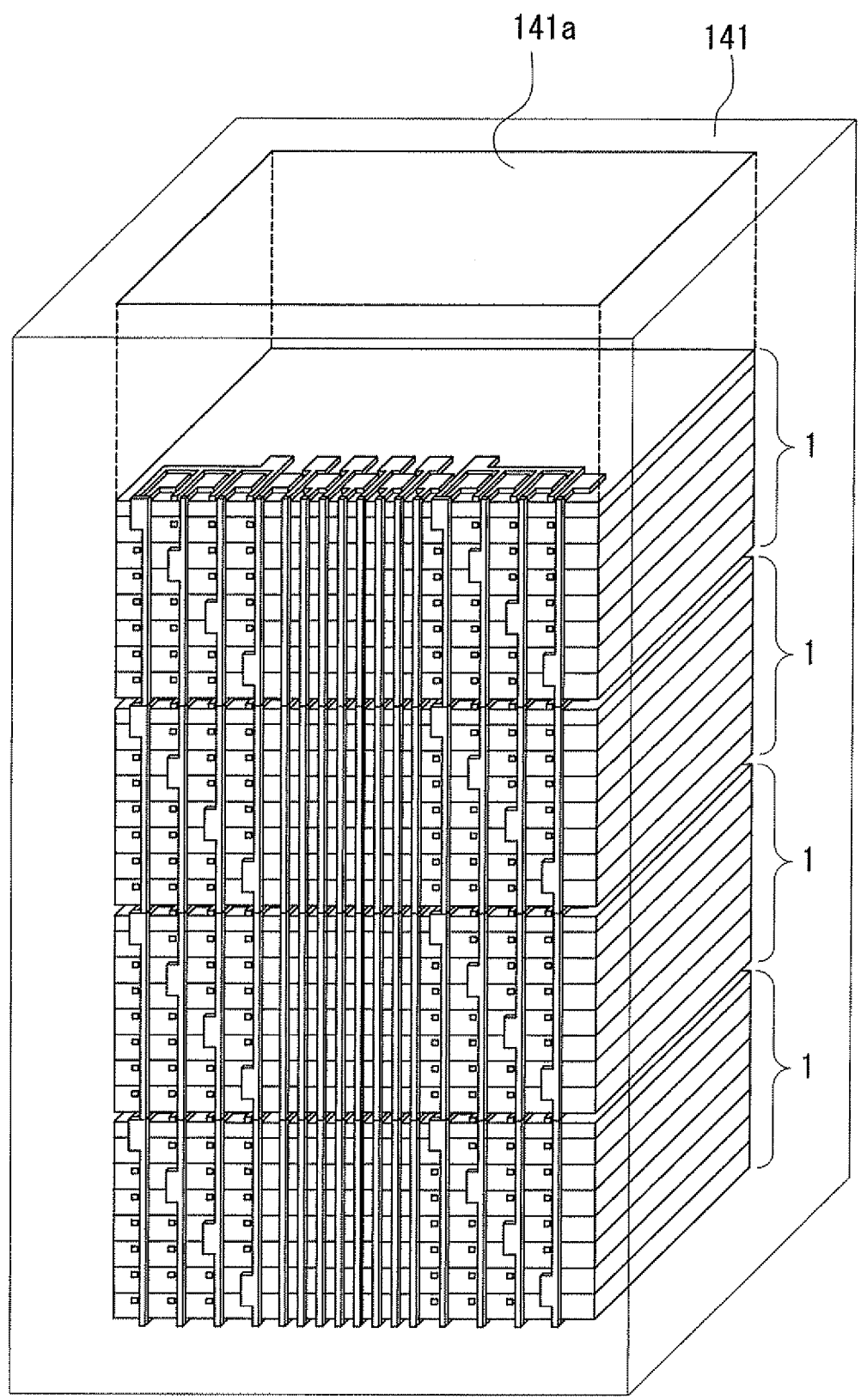
FIG. 49 is a perspective view showing an example of a method of manufacturing an electronic component that includes a plurality of layered chip packages stacked.

FIG. 49 shows an example of a method of manufacturing an electronic component that includes a plurality of layered chip packages 1 stacked. The method shown in FIG. 49 uses a heatproof container 141. The container 141 has an accommodating part 141a in which a plurality of layered chip packages 1 can be stacked and accommodated. The accommodating part 141a has such a size that the side surfaces of the layered chip packages 1 accommodated in the accommodating part 141a and the inner walls of the accommodating part 141a leave a slight gap therebetween. In the method, a plurality of layered chip packages 1 are stacked and accommodated in the accommodating part 141a of the container 141, and then the container 141 and the plurality of layered chip packages 1 are heated at temperatures at which the solder layer melts (for example, 320° C.). This melts the solder layer, whereby the terminals 4 and 5 of every two vertically adjacent layered chip packages 1 are bonded to each other. According to the method, a plurality of layered chip packages 1 are stacked and accommodated in the accommodating part 141a of the container 141, whereby the plurality of layered chip packages 1 can be easily aligned with each other. This makes it easy to manufacture an electronic component that includes a plurality of layered chip packages 1 stacked.

The method shown in FIG. 49 can also be used when manufacturing a composite layered chip package by stacking the main package 1 and one or more additional portions 51. Using the method shown in FIG. 49 to manufacture a composite layered chip package allows easy manufacturing of the composite layered chip package.

As has been described, according to the present embodiment, when the main package 1 includes one or more second-type layer portions 10B, one or more additional portions 51 to substitute for the one or more second-type layer portions 10B can be stacked on and electrically connected to the main package 1 to form a composite layered chip package. Thus, according to the present embodiment, even if the main package 1 includes a defective semiconductor chip 30, it is possible to easily provide a composite layered chip package having the same functions as those of a main package that includes no defective semiconductor chip 30.

The layered chip package 1 according to the present embodiment includes a main body 2, and wiring 3 that includes a plurality of wires W disposed on at least one of the side surfaces of the main body 2. The main body 2 includes: a main part 2M that includes a plurality of layer portions 10 stacked; a plurality of first terminals 4 that are disposed on the top surface 2Ma of the main part 2M and electrically connected to the plurality of wires W; and a plurality of second terminals 5 that are disposed on the bottom surface 2Mb of the main part 2M and electrically connected to the plurality of wires W. Each of the layer portions 10 includes a semiconductor chip 30, and a plurality of electrodes 32 that are electrically connected to the plurality of wires W. The plurality of electrodes 32 include a plurality of first electrodes 32A that are intended to establish electrical connection to the semiconductor chip 30, and a plurality of second electrodes 32B that are not in contact with the semiconductor chip 30.

The plurality of wires W include a plurality of common wires WA that have a use common to all of the layer portions 10 in the main part 2M, and a plurality of layer-dependent wires WB that are used by respective different layer portions 10. The plurality of first electrodes 32A are electrically connected to the plurality of common wires WA. The plurality of second electrodes 32B are electrically connected to the plurality of layer-dependent wires WB. The plurality of first terminals 4 are formed by using the plurality of electrodes 32 of the uppermost layer portion 10. With such a configuration, it is possible according to the embodiment to form the plurality of electrodes 32 in the same layout across all the layer portions 10 in the main part 2M. It is also possible to form the plurality of first terminals 4 by using the plurality of electrodes 32 of the uppermost layer portion 10.

In the present embodiment, defective semiconductor chips 30 are not electrically connected to the wiring 3. The defective semiconductor chips 30 may thus be regarded as a mere insulating layer. Consequently, according to the present embodiment, it is possible to disable the defective semiconductor chips 30 and to prevent the defective semiconductor chips 30 from causing malfunction of the layered chip package.

According to the present embodiment, even if the second-type layer portion 10B is the uppermost in the layered chip package 1, the plurality of electrodes 32 can be used to form the plurality of first terminals 4. This makes it possible to stack the additional portion 51 on the layered chip package 1 and electrically connect the plurality of first terminals 4 of the layered chip package 1 to the plurality of second additional portion terminals 55 of the additional portion 51. In such a case, the plurality of electrodes 32 of the uppermost layer portion 10B do not have the function of electrically connecting the semiconductor chip 30 to the wiring 3 but have an interposer function of electrically connecting the layered chip package (main package) 1 and the additional portion 51 to each other.

Regardless of whether the uppermost layer portion 10 is a first-type layer portion 10A or second-type layer portion 10B, among the plurality of electrodes 32, the second electrodes 32B which are not in contact with the semiconductor chip 30 do not have the function of electrically connecting the semiconductor chip 30 to the wiring 3 but have an interposer function of electrically connecting the layered chip package (main package) 1 and the additional portion 51 to each other.

In the present embodiment, each of the layer portions 10 includes the selective connection electrodes 36 and 37 that are selectively electrically connected to only the layer-dependent wires WB that the layer portion 10 uses, among the plurality of layer-dependent wires WB. As shown in FIG. 1, each of the layer-dependent wires WB is broadened in part, so that it is electrically connected to the selective connection electrode 36 or 37 of the layer portion 10 that uses the layer-dependent wire WB. With such a configuration, it is possible according to the present embodiment to form the selective connection electrodes 36 and 37 in the same layout across all the layer portions 10 in the main part 2M while electrically connecting the semiconductor chips 30 of the layer portions 10 to respective different layer-dependent wires WB. This makes it possible to manufacture the layered chip package 1 easily.

In the composite layered chip package according to the present embodiment, the additional portion 51 includes at least one additional semiconductor chip 80 and additional portion wiring 53. The additional portion wiring 53 defines electrical connections between the at least one additional semiconductor chip 80 and the plurality of terminals 4 and 5 of the main package 1 so that the at least one additional semiconductor chip 80 substitutes for a semiconductor chip 30 of at least one second-type layer portion 10B. Consequently, according to the present embodiment, it is possible to easily provide a composite layered chip package having the same functions as those of a layered chip package 1 that includes no defective semiconductor chip 30, regardless of the number and location(s) of the second-type layer portion(s) 10B in the main package 1. The location(s) of the second-type layer portion(s) 10B in the main package 1 can be known from the location information on the normally functioning pre-semiconductor-chip portions 30P and the malfunctioning pre-semiconductor-chip portions 30P which was obtained by the wafer sort test.

According to the present embodiment, in the layered chip package 1 including a plurality of semiconductor chips 30 stacked, the stacked semiconductor chips 30 are electrically connected to each other by the wiring 3 (the plurality of wires W) disposed on at least one of the side surfaces of the main body 2. Consequently, the present embodiment is free from the problems of the wire bonding method, that is, the problem that it is difficult to reduce the distance between the electrodes so as to avoid contact between the wires, and the problem that the high resistances of the wires hamper quick circuit operation.

As compared with the through electrode method, the present embodiment has the following advantages. First, the present embodiment does not require the formation of through electrodes in each chip and consequently does not require a large number of steps for forming through electrodes in each chip. Moreover, the present embodiment provides higher reliability of electrical connection between a plurality of chips as compared with the case where through electrodes are used to establish electrical connection between the chips.

Furthermore, according to the present embodiment, it is possible to easily change the line width and thickness of the wiring 3. Consequently, it is possible to easily cope with future demands for finer wiring 3.

The through electrode method requires that the through electrodes of vertically adjacent chips be connected to each other by means of, for example, soldering at high temperatures. In contrast, according to the present embodiment, it is possible to form the wiring 3 at lower temperatures since the wiring 3 can be formed by plating. According to the present embodiment, it is also possible to bond the plurality of layer portions 10 to each other at low temperatures. Consequently, it is possible to prevent the chips 30 from suffering damage from heat.

The through electrode method further requires accurate alignment between vertically adjacent chips in order to connect the through electrodes of the vertically adjacent chips to each other. In contrast, according to the present embodiment, electrical connection between a plurality of semiconductor chips 30 is established not at an interface between two vertically adjacent layer portions 10 but through the use of the wiring 3 disposed on at least one of the side surfaces of the main body 2. The alignment between a plurality of layer portions 10 therefore requires lower accuracy than that required for the alignment between a plurality of chips in the through electrode method.

In the present embodiment, the method of manufacturing a plurality of layered chip packages 1 includes the steps of fabricating a plurality of substructures 110; fabricating a plurality of first layered substructures 115 by using the plurality of substructures 110, each of the plurality of first layered substructures 115 including a plurality of substructures 110 stacked; and forming the plurality of layered chip packages 1 from the plurality of first layered substructures 115. Each of the first layered substructures 115 includes an array of a plurality of pre-separation main bodies 2P. The plurality of pre-separation main bodies 2P are to be separated from each other into individual main bodies 2 later.

The step of forming the plurality of layered chip packages 1 includes the steps of fabricating a second layered substructure 120 by stacking the plurality of first layered substructures 115 and bonding every two adjacent first layered substructures 115 to each other; cutting the second layered substructure 120 into at least one block 121 that includes a plurality of pre-separation main bodies 2P arranged both in the direction of stacking of the first layered substructures 115 and in a direction orthogonal thereto; forming the wiring 3 on the plurality of pre-separation main bodies 2P included in the at least one block 121 simultaneously; and separating the plurality of pre-separation main bodies 2P each provided with the wiring 3 from each other so as to form the plurality of layered chip packages.

Such a manufacturing method for the layered chip packages 1 makes it possible to simultaneously form a plurality of sets of the terminals 4 and 5 corresponding to the plurality of layered chip packages 1 in the step of fabricating the first layered substructures 115. Moreover, according to the manufacturing method, the wiring 3 is formed simultaneously on the plurality of pre-separation main bodies 2P included in one or more blocks 121. This makes it possible to form a plurality of units of wiring 3 corresponding to the plurality of layered chip packages 1 simultaneously. Here, it is unnecessary to perform alignment between the plurality of pre-separation main bodies 2P included in each block 121. Consequently, according to the manufacturing method, it is possible to mass-produce the layered chip packages 1 that are capable of being electrically connected to each other easily, at low cost in a short time.

In the step of forming the wiring 3 in the foregoing manufacturing method, two or more blocks 121 may be arranged such that all the pre-separation main bodies 2P included in the two or more blocks 121 are directed with their surfaces for the wiring 3 to be formed on toward the same direction. Then, the wiring 3 may be formed simultaneously on all the pre-separation main bodies 2P included in the two or more blocks 121. This makes it possible to simultaneously form the wiring 3 for a larger number of pre-separation main bodies 2P.

The foregoing method of manufacturing the layered chip packages 1 allows a reduction in the number of steps and consequently allows a reduction in cost for the layered chip packages 1, as compared with the manufacturing method for a layered chip package disclosed in U.S. Pat. No. 5,953,588.

According to the method of manufacturing the layered chip packages 1 of the present embodiment, the first layered substructure 115 is fabricated by the method described with reference to FIG. 31 to FIG. 34. This makes it possible to easily reduce the thickness of a plurality of substructures 110 that constitute the first layered substructure 115 while preventing damage to the substructures 110. The present embodiment thus allows a high-yield manufacture of the layered chip packages 1 that achieve a smaller size and higher integration.

In the present embodiment, the first layered substructure 115 can be fabricated by a method other than that described with reference to FIG. 31 to FIG. 34. For example, the first layered substructure 115 may be fabricated by bonding two pre-polishing substructures 109 to each other with their respective first surfaces 109a arranged to face each other, polishing the two second surfaces 109b of the two pre-polishing substructures 109 to fabricate a stack including two substructures 110, and laminating a plurality of such stacks. Alternatively, the first layered substructure 115 may be fabricated by bonding two substructures 110 to each other with their respective second surfaces 110b arranged to face each other to thereby fabricate a stack including the two substructures 110, and laminating a plurality of such stacks.

[Second Embodiment]

Figure 50:
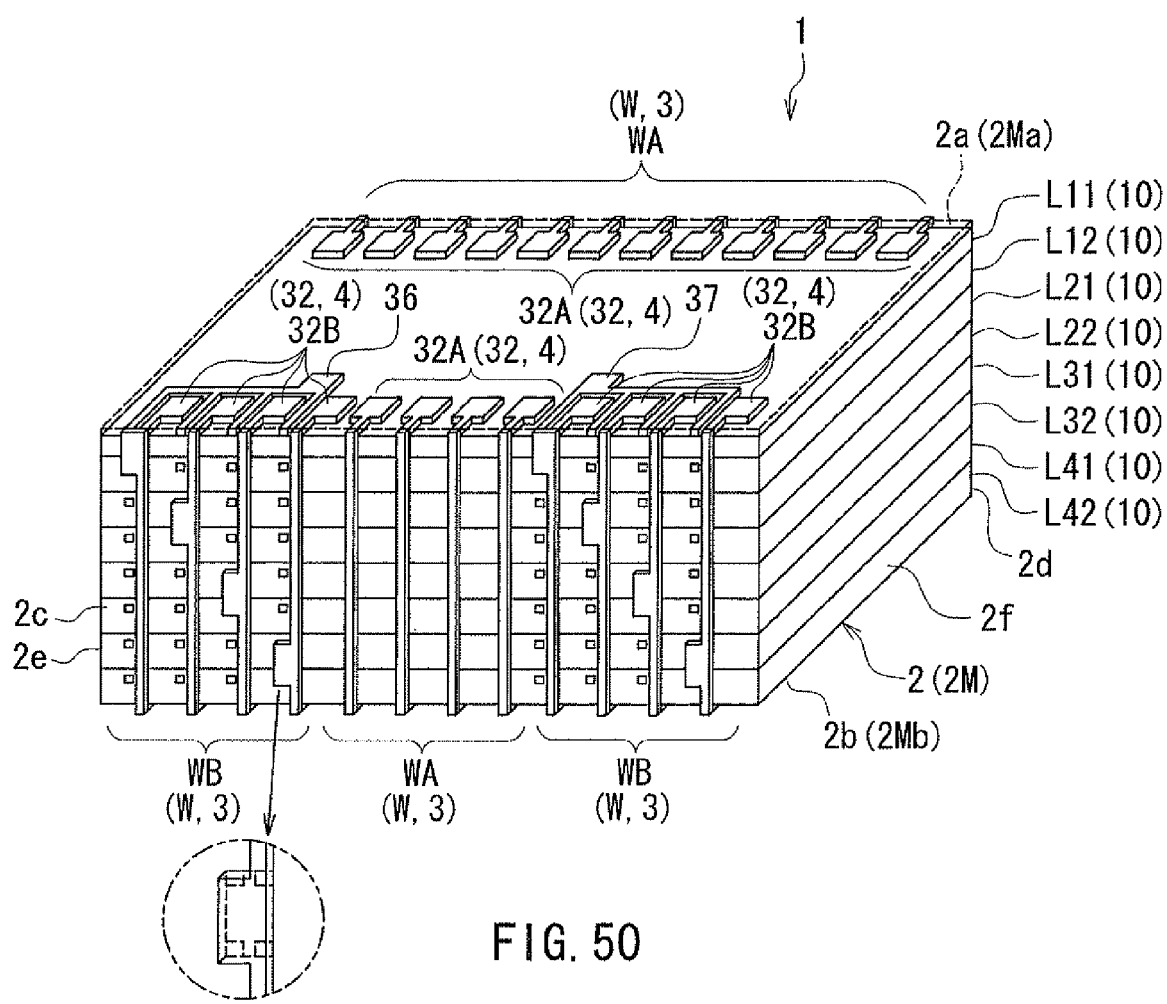
FIG. 50 is a perspective view of a layered chip package according to a second embodiment of the invention.
Figure 51:
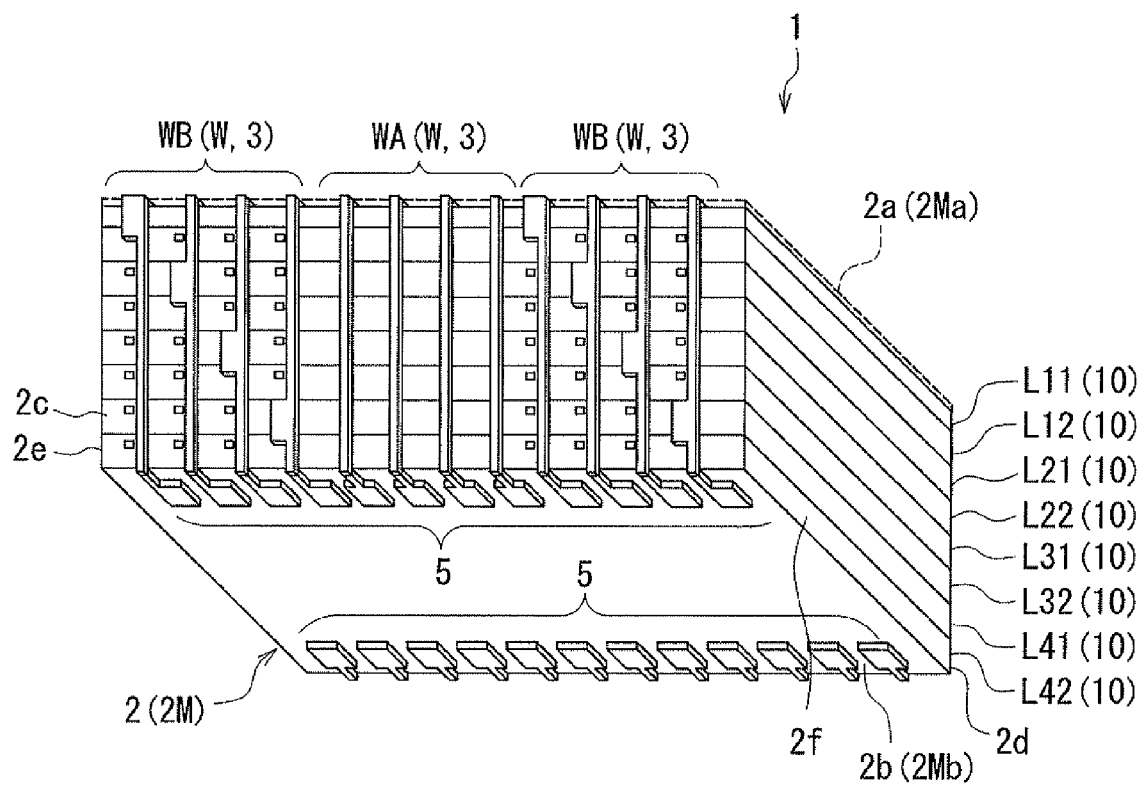
FIG. 51 is a perspective view showing the layered chip package of FIG. 50 as viewed from below.
Figure 52:
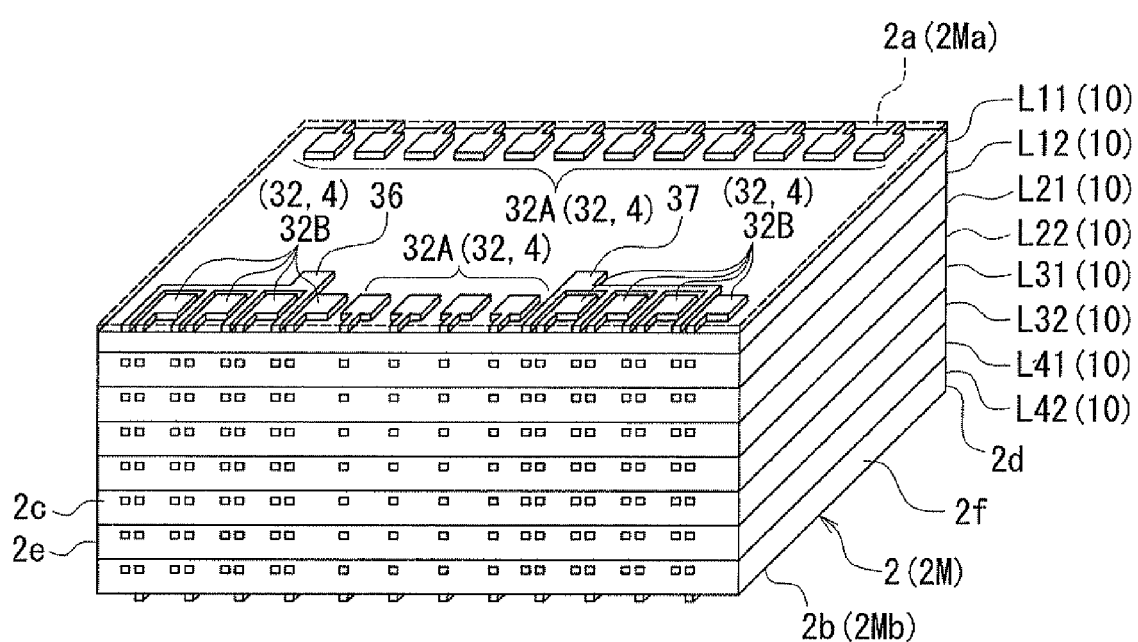
FIG. 52 is a perspective view of the layered chip package of FIG. 50 excluding the wiring.
Figure 53:
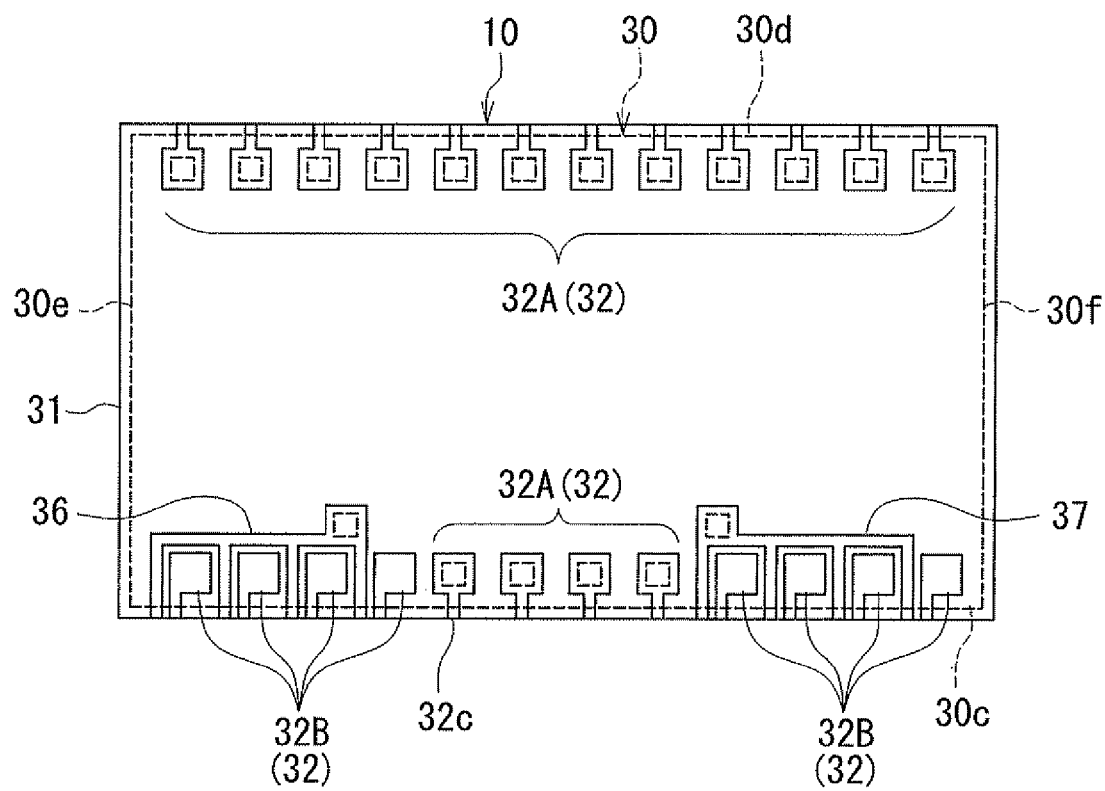
FIG. 53 is a plan view showing a layer portion included in the layered chip package of FIG. 50.
Figure 54:
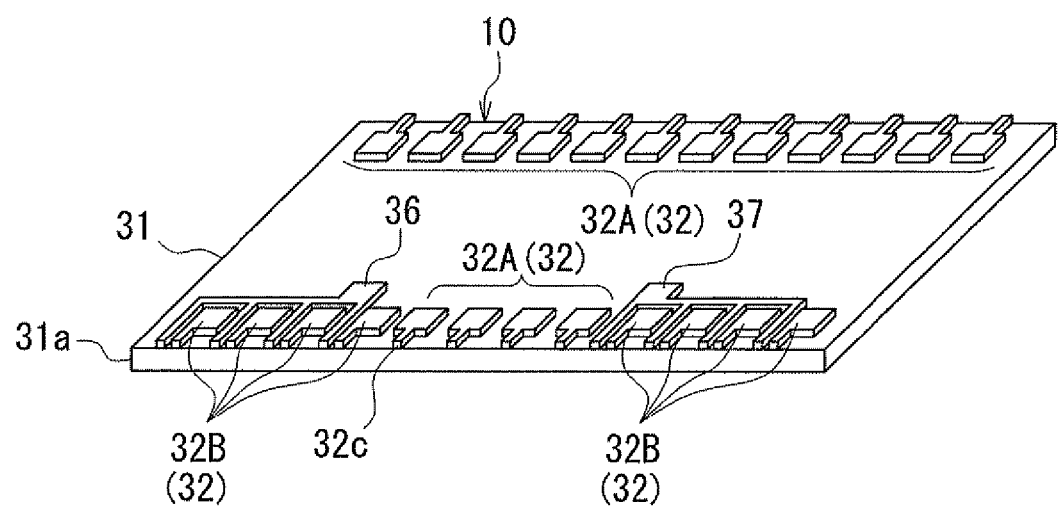
FIG. 54 is a perspective view of the layer portion shown in FIG. 53.
Figure 55:
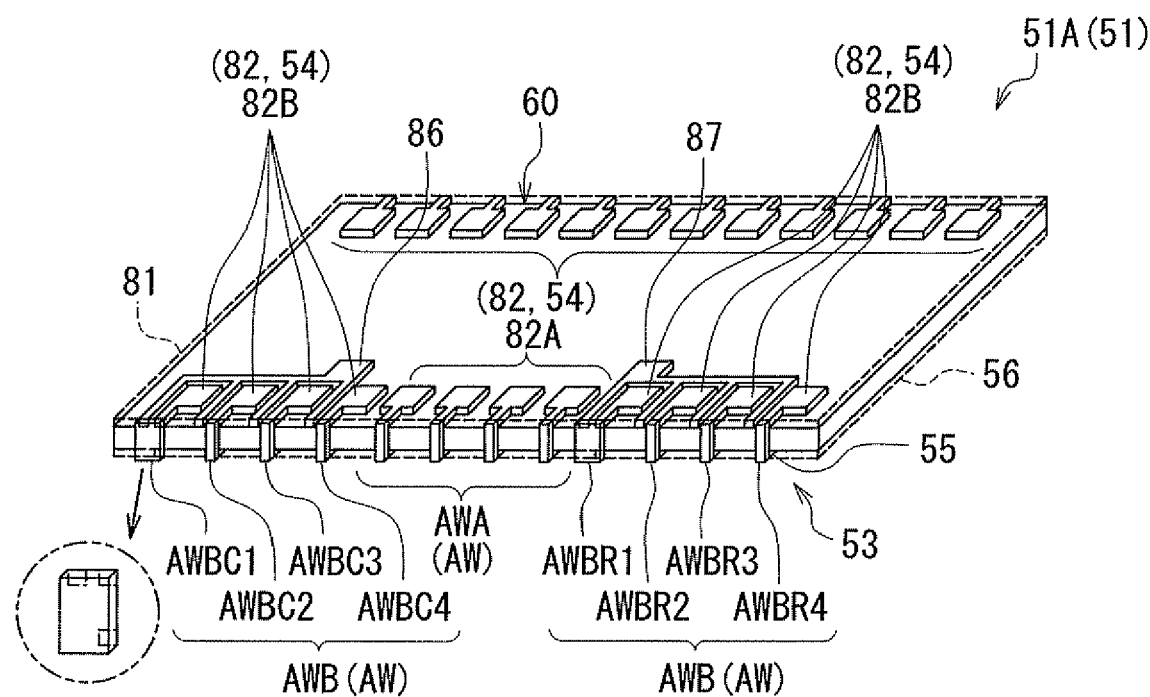
FIG. 55 is a perspective view showing a first example of an additional portion of the second embodiment of the invention.
Figure 56:
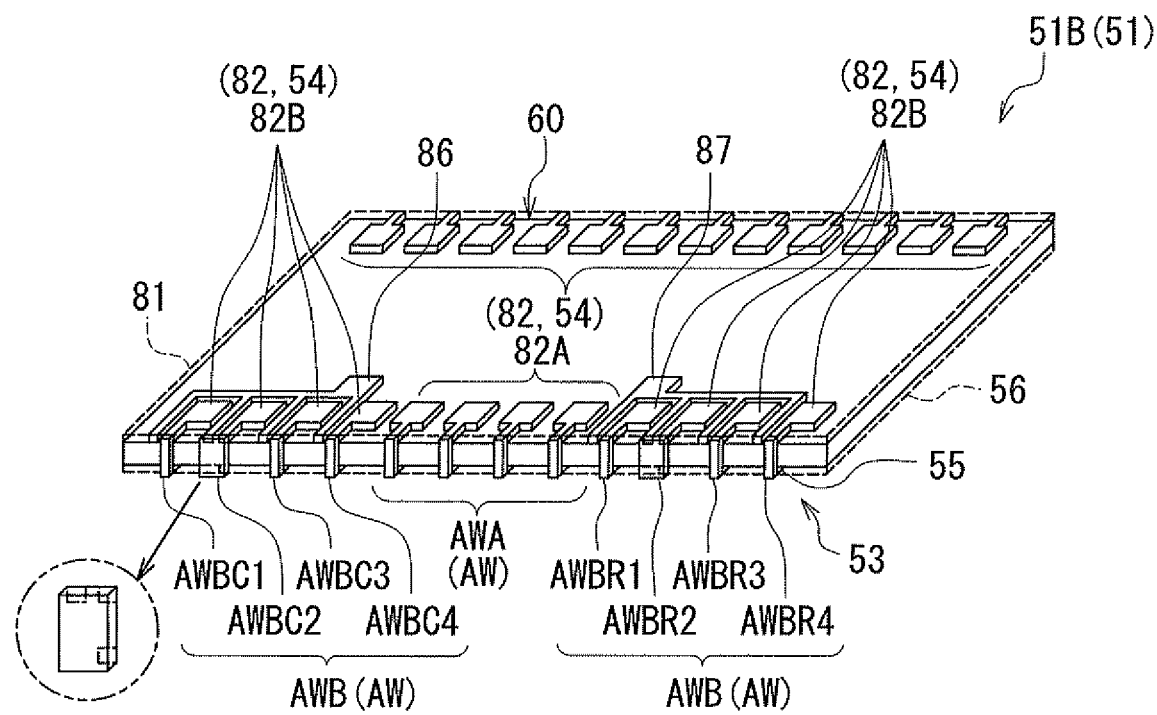
FIG. 56 is a perspective view showing a second example of the additional portion of the second embodiment of the invention.
Figure 57:
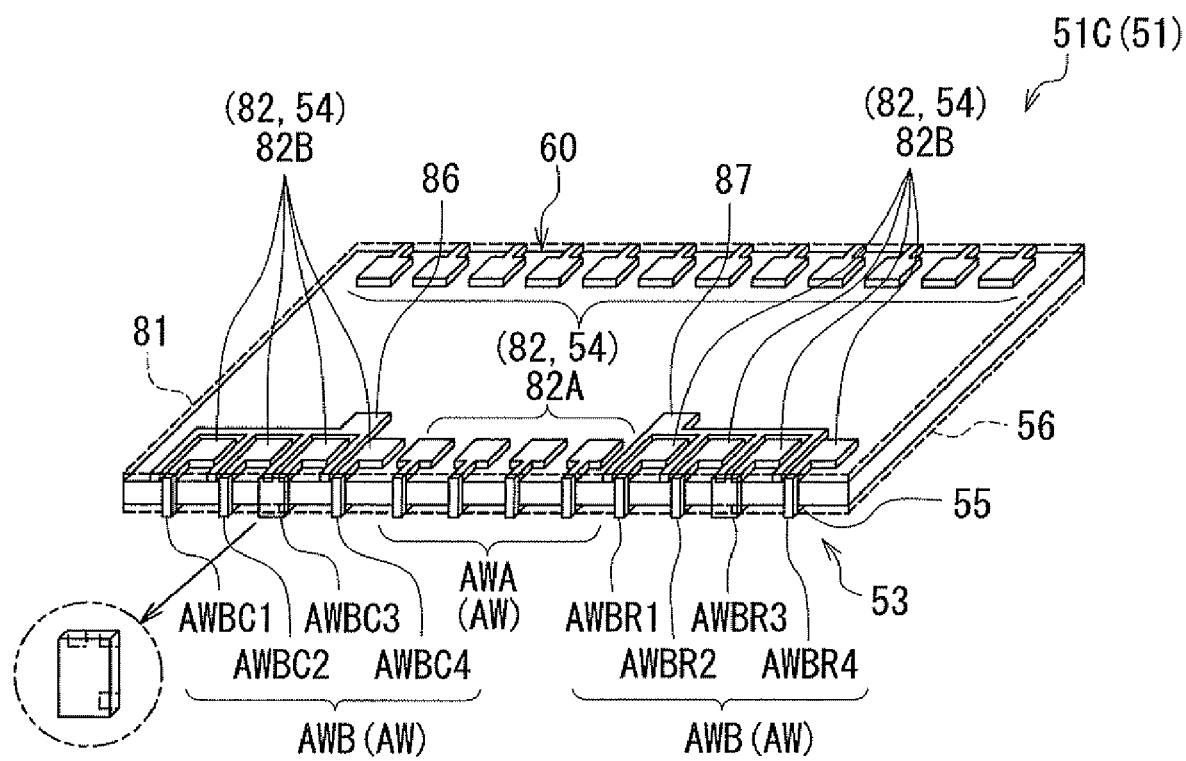
FIG. 57 is a perspective view showing a third example of the additional portion of the second embodiment of the invention.
Figure 58:
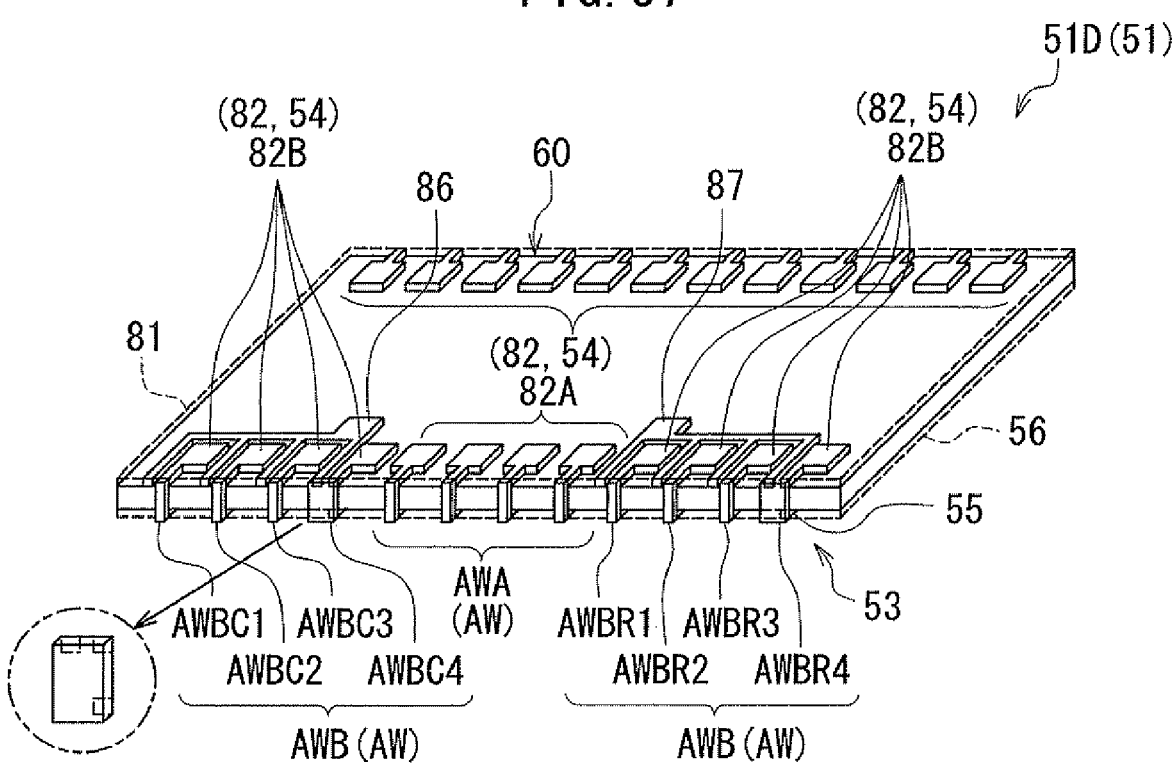
FIG. 58 is a perspective view showing a fourth example of the additional portion of the second embodiment of the invention.

A second embodiment of the invention will now be described. First, a description will be given of the layered chip package 1 according to the present embodiment with reference to FIG. 50 to FIG. 54. FIG. 50 is a perspective view of the layered chip package 1 according to the present embodiment. FIG. 51 is a perspective view showing the layered chip package 1 of FIG. 50 as viewed from below. FIG. 52 is a perspective view of the layered chip package 1 of FIG. 50 excluding its wiring. FIG. 53 is a plan view showing a layer portion included in the layered chip package 1 of FIG. 50. FIG. 54 is a perspective view of the layer portion shown in FIG. 53.

The layered chip package 1 of the present embodiment differs from that of the first embodiment in the configuration of the wiring 3, electrodes 32, and terminals 4 and 5. The wiring 3 in the present embodiment includes a plurality of wires W that are disposed on two mutually opposite side surfaces 2c and 2d of the main body 2. As in the first embodiment, the plurality of wires W include a plurality of common wires WA and a plurality of layer-dependent wires WB. The layout of the plurality of layer-dependent wires WB in the present embodiment is the same as in the first embodiment. In the present embodiment, the plurality of common wires WA are disposed on the side surface 2c and the side surface 2d.

In the present embodiment, as in the first embodiment, the electrodes 32 include a plurality of first electrodes 32A and a plurality of second electrodes 32B. The plurality of first electrodes 32A are electrically connected to the plurality of common wires WA. The plurality of second electrodes 32B are electrically connected to the plurality of layer-dependent wires WB. The plurality of first electrodes 32A are disposed near the side surface 2c and near the side surface 2d. The plurality of second electrodes 32B are disposed near the side surface 2c. The plurality of terminals 4 and 5 in the present embodiment are disposed in positions near the side surface 2c and near the side surface 2d so as to correspond to the positions of the plurality of terminals 32.

A description will now be given of the additional portion 51 of the present embodiment with reference to FIG. 55 to FIG. 58. FIG. 55 to FIG. 58 show first to fourth examples of the additional portion 51 of the present embodiment. The additional portions 51A to 51D shown in FIG. 55 to FIG. 58 differ from the additional portions 51A to 51D shown in FIG. 6 to FIG. 9, respectively, in the configuration of the plurality of common wires AWA, the plurality of first additional portion terminals 54, the plurality of second additional portion terminals 55, and the plurality of electrodes 82. More specifically, in the present embodiment, the plurality of common wires AWA are disposed in positions corresponding to the plurality of common wires WA shown in FIG. 50. The plurality of first additional portion terminals 54 are disposed in positions corresponding to the plurality of first terminals 4 shown in FIG. 50. The plurality of second additional portion terminals 55 are disposed in positions corresponding to the plurality of second terminals 5 shown in FIG. 51. The plurality of electrodes 82 are disposed in positions corresponding to the plurality of electrodes 32 shown in FIG. 50.

Figure 59:
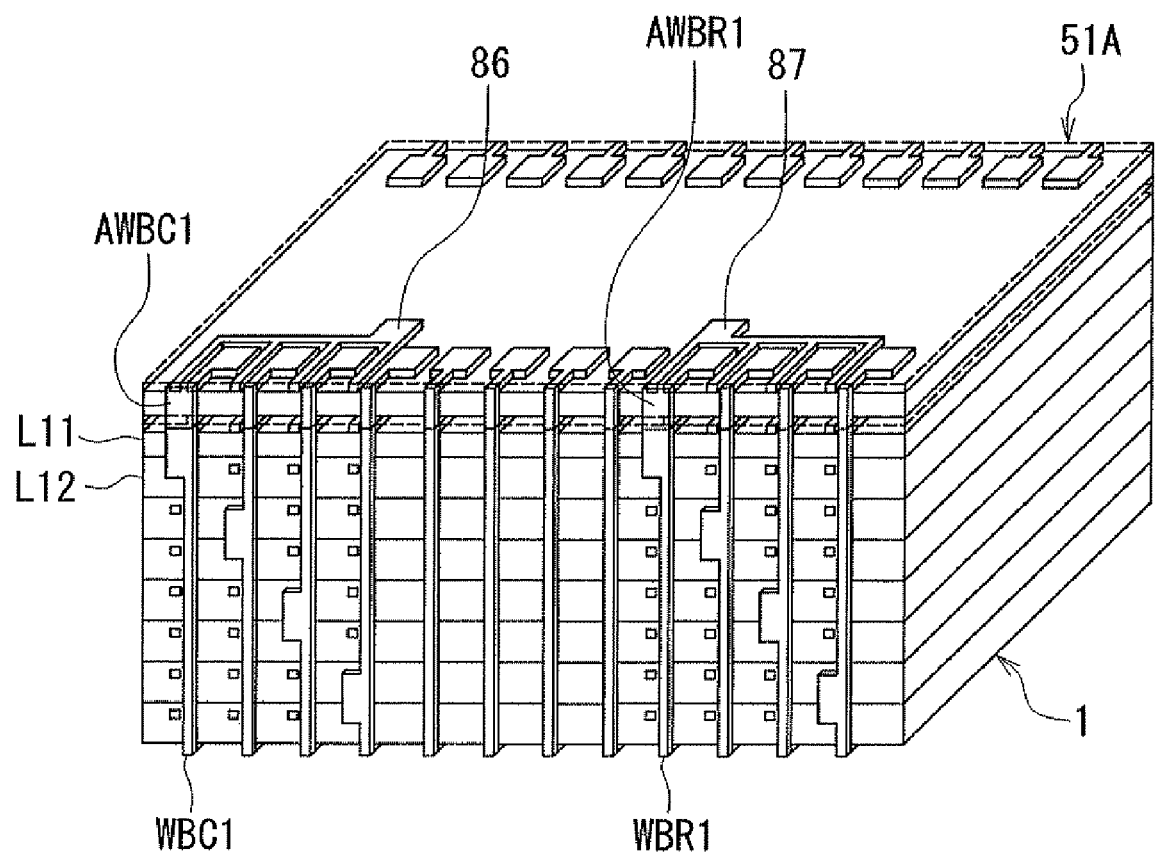
FIG. 59 is a perspective view showing an example of a composite layered chip package according to the second embodiment of the invention.

FIG. 59 shows an example of the composite layered chip package according to the present embodiment. This example is where the layer portion L11 or L12 of the main package 1 is a second-type layer portion 10B, like the example shown in FIG. 10. In the example, the additional portion 51A to substitute for the layer portion L11 or L12 is placed on the top of the main package 1 to form a composite layered chip package. In the example, as with the layer portions L11 and L12, the selective connection electrodes 86 and 87 of the additional portion 51A are electrically connected to the wires WBC1 and WBR1 of the main package 1, respectively.

In the present embodiment, as in the first embodiment, it is possible to form composite layered chip packages of various configurations aside from the example shown in FIG. 59.

In the method of manufacturing the layered chip package 1 according to the present embodiment, the process shown in FIG. 40 to FIG. 44 is repeated twice to form the wiring 3 (the plurality of wires W) on the two side surfaces 2c and 2d of the main body 2.

The remainder of configuration, function and effects of the present embodiment are similar to those of the first embodiment.

The present invention is not limited to the foregoing embodiments, and various modifications may be made thereto. For example, in each of the embodiments, a plurality of blocks 121 are arranged to form a block assembly 130, and further, a plurality of block assemblies 130 are arranged so that the wiring 3 is formed simultaneously on all of the pre-separation main bodies 2P that are included in the plurality of block assemblies 130. However, the wiring 3 may be simultaneously formed on all of the pre-separation main bodies 2P that are included in a single block assembly 130, or all of the pre-separation main bodies 2P that are included in a single block 121. After the plurality of pre-separation main bodies 2P each provided with the wiring 3 are separated from each other into a plurality of main bodies 2, additional wiring may be formed on the main bodies 2.

It is apparent that the present invention can be carried out in various forms and modifications in the light of the foregoing descriptions. Accordingly, within the scope of the following claims and equivalents thereof, the present invention can be carried out in forms other than the foregoing most preferred embodiments.

What is claimed is:

1. A layered chip package comprising:
a main body having a top surface, a bottom surface, and four side surfaces; and
wiring that includes a plurality of wires disposed on at least one of the side surfaces of the main body, wherein:
the main body includes: a main part that includes a plurality of layer portions stacked and has a top surface and a bottom surface; and a plurality of terminals that are disposed on at least either one of the top and bottom surfaces of the main part and electrically connected to the plurality of wires;
each of the plurality of layer portions includes a semiconductor chip and a plurality of electrodes, the plurality of electrodes being electrically connected to the plurality of wires;
the plurality of electrodes include a plurality of first electrodes that are intended to establish electrical connection to the semiconductor chip, and a plurality of second electrodes that are not in contact with the semiconductor chip; and
in at least one of the plurality of layer portions, the plurality of first electrodes are in contact with and electrically connected to the semiconductor chip.

2. The layered chip package according to claim 1, wherein:
the plurality of terminals include a plurality of first terminals that are disposed on the top surface of the main part and electrically connected to the plurality of wires; and
the plurality of first terminals are formed by using the plurality of electrodes of the uppermost one of the layer portions.

3. The layered chip package according to claim 2, wherein the plurality of terminals further include a plurality of second terminals that are disposed on the bottom surface of the main part and electrically connected to the plurality of wires.

4. The layered chip package according to claim 1, wherein:
the plurality of wires include a plurality of common wires that have a use common to all of the layer portions in the main part, and a plurality of layer-dependent wires that are used by respective different ones of the layer portions;
the plurality of first electrodes are electrically connected to the plurality of common wires; and
the plurality of second electrodes are electrically connected to the plurality of layer-dependent wires.

5. The layered chip package according to claim 4, wherein:
each of the plurality of layer portions further includes a selective connection electrode that is selectively electrically connected to only the layer-dependent wire that the layer portion uses, among the plurality of layer-dependent wires; and
in at least one of the plurality of layer portions, the selective connection electrode is electrically connected to the semiconductor chip, whereby the semiconductor chip is electrically connected to the layer-dependent wire.

6. The layered chip package according to claim 1, wherein the semiconductor chip includes a plurality of memory cells.

7. The layered chip package according to claim 1, wherein:
the semiconductor chip has four side surfaces;
each of the layer portions further includes an insulating portion that covers at least one of the four side surfaces of the semiconductor chip; and
the insulating portion has at least one end face that is located in the at least one of the side surfaces of the main body on which the plurality of wires are disposed.

8. The layered chip package according to claim 1, wherein:
the plurality of layer portions include at least one first-type layer portion and at least one second-type layer portion;
in the first-type layer portion, the plurality of first electrodes are in contact with and electrically connected to the semiconductor chip; and
in the second-type layer portion, the plurality of first electrodes are not in contact with the semiconductor chip.

9. The layered chip package according to claim 8, wherein the semiconductor chip of the first-type layer portion is a normally functioning one, whereas the semiconductor chip of the second-type layer portion is a malfunctioning one.

10. The layered chip package according to claim 8, wherein:
the plurality of wires include a plurality of common wires that have a use common to all of the layer portions in the main part, and a plurality of layer-dependent wires that are used by respective different ones of the layer portions;
the plurality of first electrodes are electrically connected to the plurality of common wires;
the plurality of second electrodes are electrically connected to the plurality of layer-dependent wires;
each of the plurality of layer portions further includes a selective connection electrode that is selectively electrically connected to only the layer-dependent wire that the layer portion uses, among the plurality of layer-dependent wires;

in the first-type layer portion, the selective connection electrode is electrically connected to the semiconductor chip, whereby the semiconductor chip is electrically connected to the layer-dependent wire; and in the second-type layer portion, the selective connection electrode is not electrically connected to the semiconductor chip, whereby the semiconductor chip is not electrically connected to the layer-dependent wire.

11. A method of manufacturing a plurality of layered chip packages of claim 1, comprising the steps of fabricating a layered substructure by stacking a plurality of substructures each of which includes an array of a plurality of preliminary layer portions, each of the preliminary layer portions being intended to become any one of the layer portions included in the main part, the substructures being intended to be cut later at positions of boundaries between every adjacent ones of the preliminary layer portions; and forming the plurality of layered chip packages from the layered substructure.

12. The method of manufacturing the layered chip packages according to claim 11, wherein:

the plurality of layer portions include at least one first-type layer portion and at least one second-type layer portion;

in the first-type layer portion, the plurality of first electrodes are in contact with and electrically connected to the semiconductor chip; and in the second-type layer portion, the plurality of first electrodes are not in contact with the semiconductor chip.

13. The method of manufacturing the layered chip packages according to claim 12, wherein the semiconductor chip of the first-type layer portion is a normally functioning one, whereas the semiconductor chip of the second-type layer portion is a malfunctioning one.

14. The method of manufacturing the layered chip packages according to claim 13, wherein the step of fabricating the layered substructure includes, as a series of steps for forming each of the substructures, the steps of:

fabricating a pre-substructure wafer that includes an array of a plurality of pre-semiconductor-chip portions, the pre-semiconductor-chip portions being intended to become the semiconductor chips, respectively;

distinguishing the plurality of pre-semiconductor-chip portions included in the pre-substructure wafer into normally functioning pre-semiconductor-chip portions and malfunctioning pre-semiconductor-chip portions; and forming the plurality of first electrodes so that the plurality of first electrodes are in contact with and electrically connected to the normally functioning pre-semiconductor-chip portions while the plurality of first electrodes are not in contact with the malfunctioning pre-semiconductor-chip portions, whereby the pre-substructure wafer is made into the substructure.

15. The method of manufacturing the layered chip packages according to claim 14, wherein:

the plurality of wires include a plurality of common wires that have a use common to all of the layer portions in the main part, and a plurality of layer-dependent wires that are used by respective different ones of the layer portions;

the plurality of first electrodes are electrically connected to the plurality of common wires;

the plurality of second electrodes are electrically connected to the plurality of layer-dependent wires;

each of the plurality of layer portions further includes a selective connection electrode that is selectively electrically connected to only the layer-dependent wire that the layer portion uses, among the plurality of layer-dependent wires;

in the first-type layer portion, the selective connection electrode is electrically connected to the semiconductor chip, whereby the semiconductor chip is electrically connected to the layer-dependent wire;

in the second-type layer portion, the selective connection electrode is not electrically connected to the semiconductor chip, whereby the semiconductor chip is not electrically connected to the layer-dependent wire; and the step of fabricating the layered substructure further includes, as the series of steps for forming each of the substructures, the step of forming the selective connection electrode so that the selective connection electrode is electrically connected to the normally functioning pre-semiconductor-chip portions while the selective connection electrode is not electrically connected to the malfunctioning pre-semiconductor-chip portions.

16. A composite layered chip package comprising a main package and an additional portion that are stacked on each other and electrically connected to each other, wherein:

the main package includes: a main body having a top surface, a bottom surface, and four side surfaces; and wiring that includes a plurality of wires disposed on at least one of the side surfaces of the main body;

the main body includes: a main part that includes a plurality of layer portions stacked and has a top surface and a bottom surface; and a plurality of terminals that are disposed on at least either one of the top and bottom surfaces of the main part and electrically connected to the plurality of wires;

each of the plurality of layer portions includes a semiconductor chip and a plurality of electrodes, the plurality of electrodes being electrically connected to the plurality of wires;

the plurality of electrodes include a plurality of first electrodes that are intended to establish electrical connection to the semiconductor chip, and a plurality of second electrodes that are not in contact with the semiconductor chip;

the plurality of layer portions include at least one first-type layer portion and at least one second-type layer portion;

the semiconductor chip of the first-type layer portion is a normally functioning one, and in the first-type layer portion, the plurality of first electrodes are in contact with and electrically connected to the semiconductor chip;

the semiconductor chip of the second-type layer portion is a malfunctioning one, and in the second-type layer portion, the plurality of first electrodes are not in contact with the semiconductor chip; and the additional portion includes:

at least one additional semiconductor chip; and additional portion wiring that defines electrical connections between the at least one additional semiconductor chip and the plurality of terminals of the main package so that the at least one additional semiconductor chip substitutes for the semiconductor chip of the at least one second-type layer portion.

17. The composite layered chip package according to claim 16, wherein:

the plurality of terminals include a plurality of first terminals that are disposed on the top surface of the main part and electrically connected to the plurality of wires; and the plurality of first terminals are formed by using the plurality of electrodes of the uppermost one of the layer portions.

18. The composite layered chip package according to claim 17, wherein the plurality of terminals further include a plurality of second terminals that are disposed on the bottom surface of the main part and electrically connected to the plurality of wires.

19. The composite layered chip package according to claim 16, wherein:
the additional portion includes an additional portion main body having a top surface, a bottom surface, and four side surfaces;
the additional portion main body includes the at least one additional semiconductor chip; and
the additional portion wiring includes: a plurality of additional portion wires that are disposed on at least one of the side surfaces of the additional portion main body; a plurality of first additional portion terminals that are disposed on the top surface of the additional portion main body and electrically connected to the plurality of additional portion wires; and a plurality of second additional portion terminals that are disposed on the bottom surface of the additional portion main body and electrically connected to the plurality of additional portion wires.

20. The composite layered chip package according to claim 16, wherein:
the plurality of wires include a plurality of common wires that have a use common to all of the layer portions in the main part, and a plurality of layer-dependent wires that are used by respective different ones of the layer portions;
the plurality of first electrodes are electrically connected to the plurality of common wires; and
the plurality of second electrodes are electrically connected to the plurality of layer-dependent wires.

21. The composite layered chip package according to claim 20, wherein:
each of the plurality of layer portions further includes a selective connection electrode that is selectively electrically connected to only the layer-dependent wire that the layer portion uses, among the plurality of layer-dependent wires;
in the first-type layer portion, the selective connection electrode is electrically connected to the semiconductor chip, whereby the semiconductor chip is electrically connected to the layer-dependent wire; and
in the second-type layer portion, the selective connection electrode is not electrically connected to the semiconductor chip, whereby the semiconductor chip is not electrically connected to the layer-dependent wire.

22. The composite layered chip package according to claim 16, wherein the semiconductor chip in each of the layer portions and the additional semiconductor chip each include a plurality of memory cells.

23. The composite layered chip package according to claim 16, wherein:
the semiconductor chip in each of the layer portions has four side surfaces;
each of the layer portions further includes an insulating portion that covers at least one of the four side surfaces of the semiconductor chip; and
the insulating portion has at least one end face that is located in the at least one of the side surfaces of the main body on which the plurality of wires are disposed.

24. A method of manufacturing the composite layered chip package of claim 16, comprising the steps of:
fabricating the main package;
fabricating the additional portion; and
stacking the main package and the additional portion on each other and electrically connecting the main package and the additional portion to each other.

* * * * *